United States Patent [19]
Schurman et al.

[11] Patent Number: 5,384,618
[45] Date of Patent: Jan. 24, 1995

[54] STORAGE APPARATUS COMPRISING A PLURALITY OF LAYERS

[75] Inventors: Richard Schurman, Kirkland; Robert E. Pearson, Spokane; Steve Reiter; John Schurman, both of Kirkland; Rick Clark, Woodinville, all of Wash.

[73] Assignee: Tom Secrest, Chehalis, Wash.

[21] Appl. No.: 42,736

[22] Filed: May 20, 1993

Related U.S. Application Data

[62] Division of Ser. No. 667,603, Mar. 4, 1991, Pat. No. 5,239,338.

[51] Int. Cl.⁶ .................... G03B 27/32; G03B 27/52
[52] U.S. Cl. ........................................ 355/32; 355/77
[58] Field of Search ................... 355/32, 35, 77

*Primary Examiner*—Richard A. Wintercorn
*Attorney, Agent, or Firm*—Tom Secrest

[57] ABSTRACT

This invention is directed to the storing of digital, information. This storage system comprises a number of layers of transparent or translucent material. In each layer there is a chemical or chemicals subject to change by being contacted with different electromagnetic wave lengths. For example, if there be eight layers then the chemical or chemicals in any layer is subject to be changed by an electromagnetic radiation of a wave length different than for any of the other seven layers. In this manner, with eight layers it is possible to have an eight bit byte. Actually, under premutations and combinations it is possible to have as many as eight bit bytes from the eight layers. It is conceivable that there may be more than eight layers such as sixteen layers of thirty-two layers. There is the possibility of storing large amounts of information in a small volumn.

44 Claims, 34 Drawing Sheets

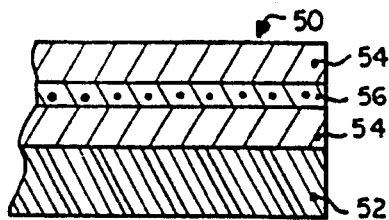
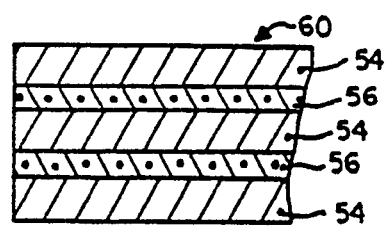
FIG. 1  FIG. 2
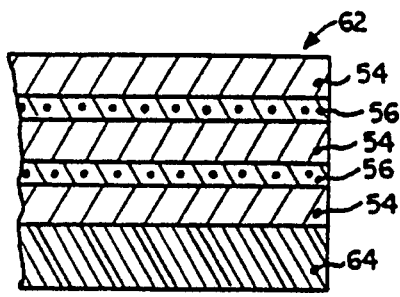
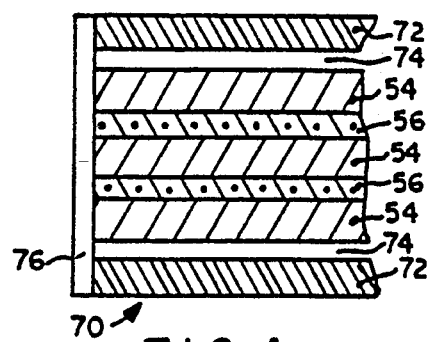
FIG. 3  FIG. 4
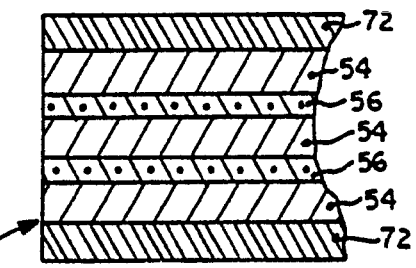
FIG. 5
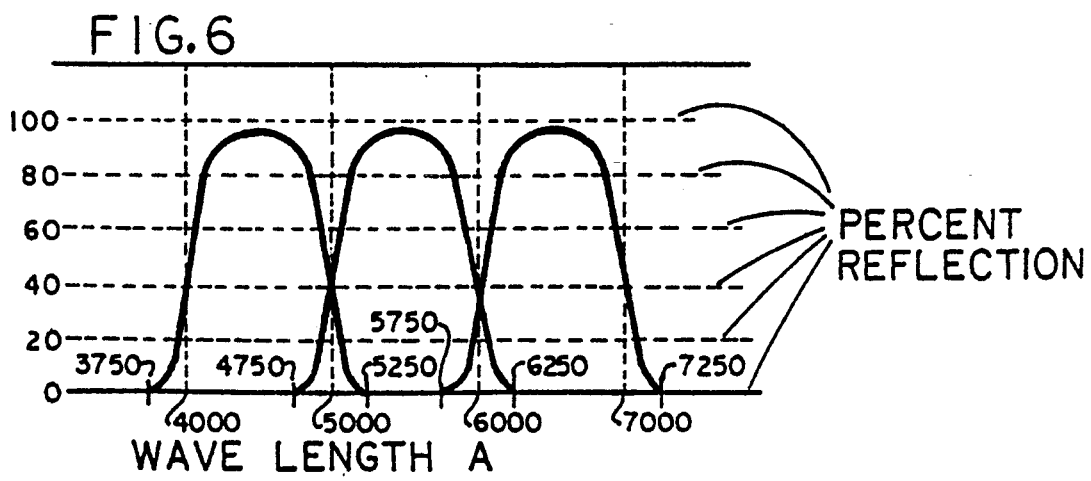
FIG. 6

FIG. 7
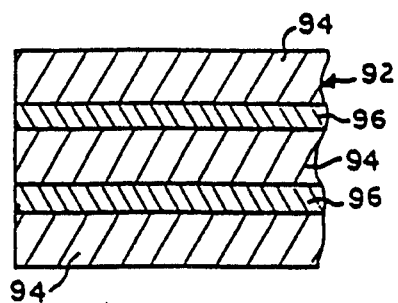
FIG. 8
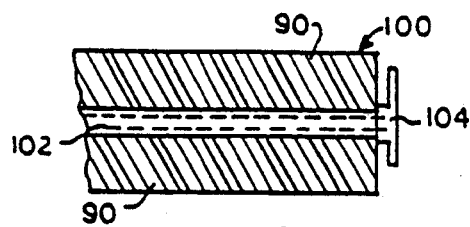
FIG. 9
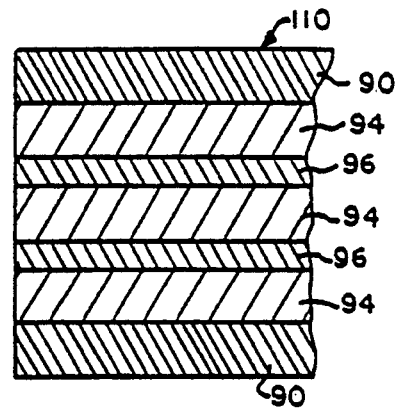
FIG. 10
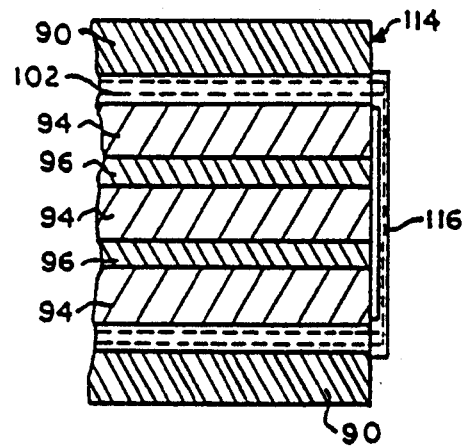
FIG. 14
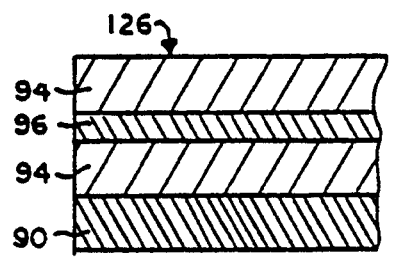
FIG 13
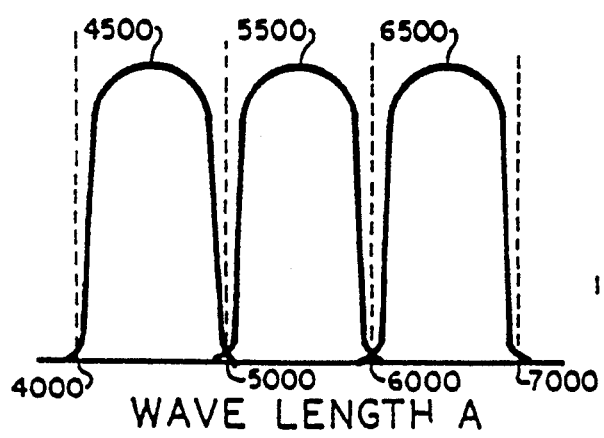
WAVE LENGTH A
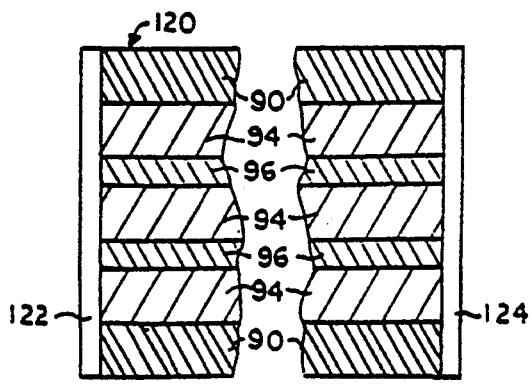
FIG. 12

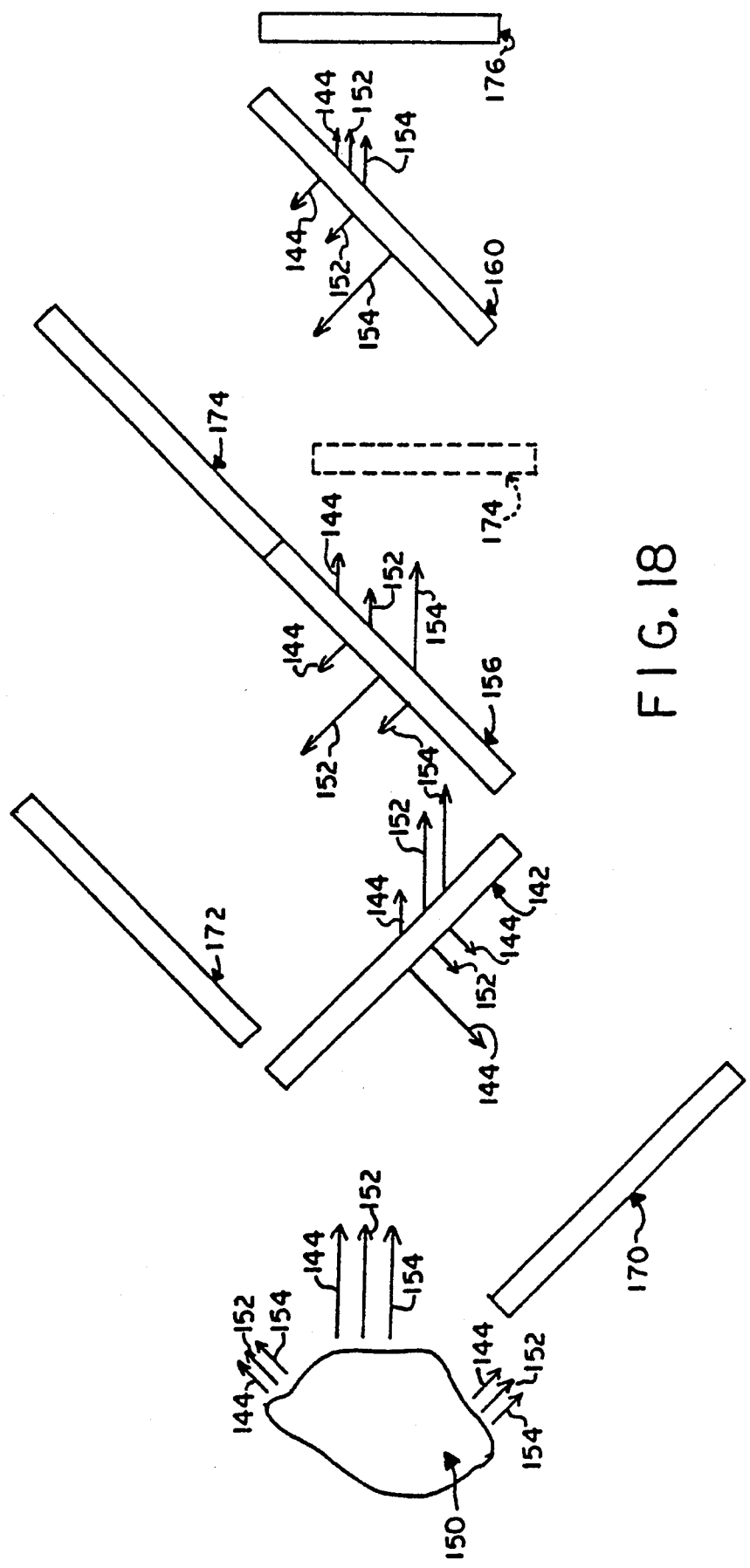

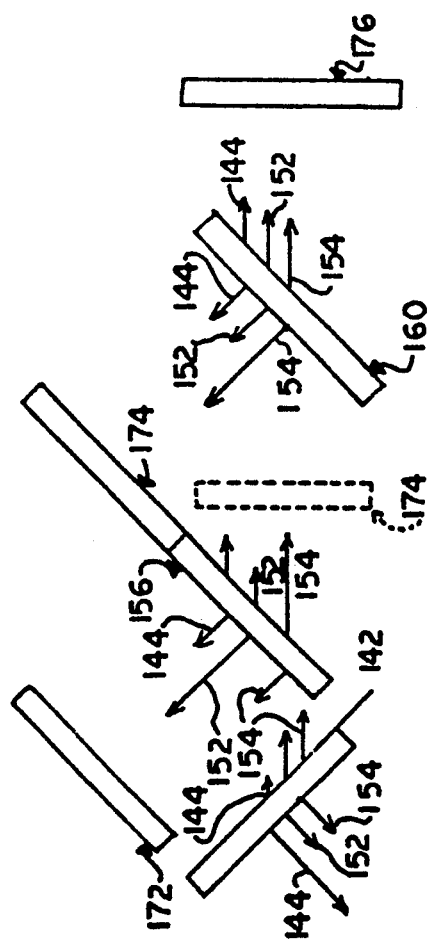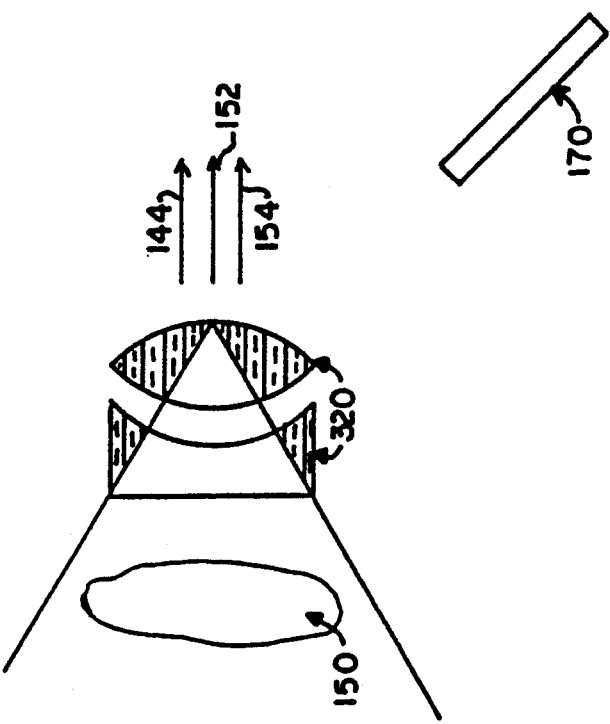
FIG. 24

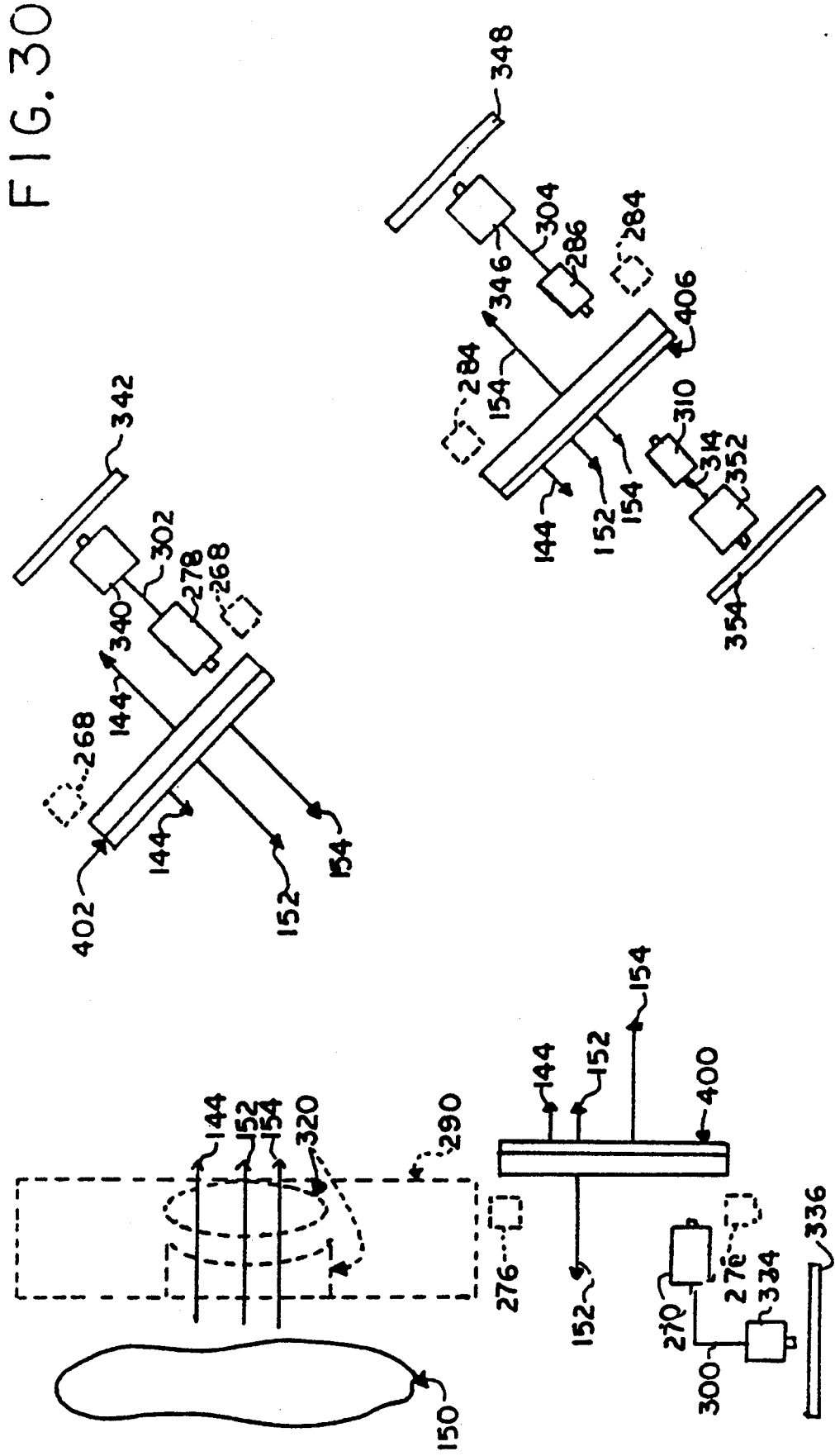

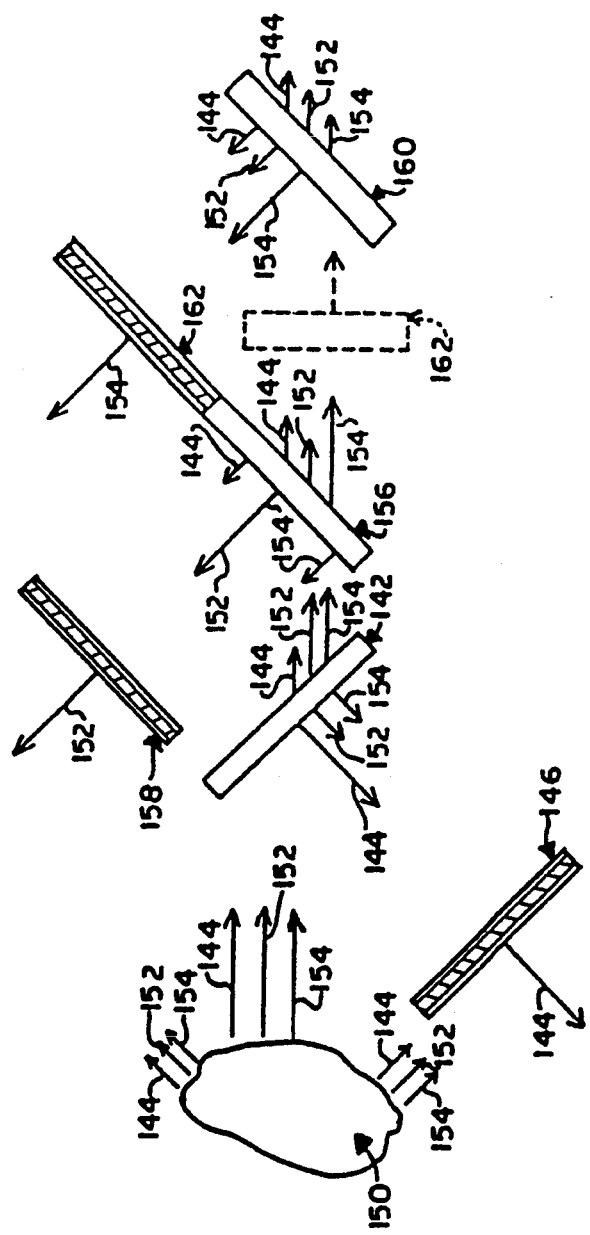
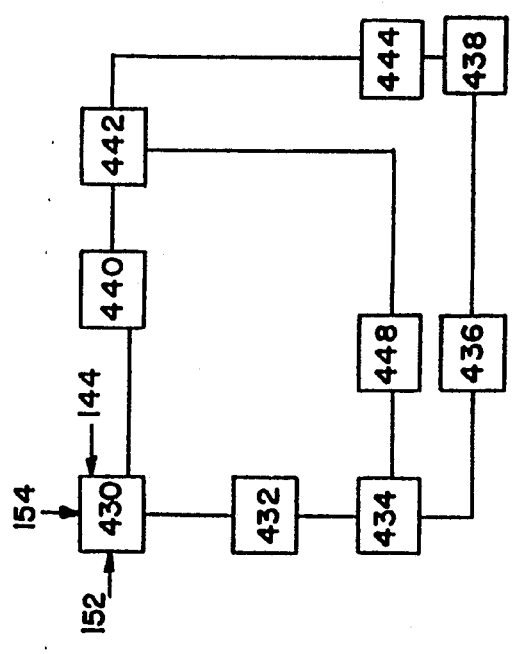
FIG. 31A
FIG. 31B

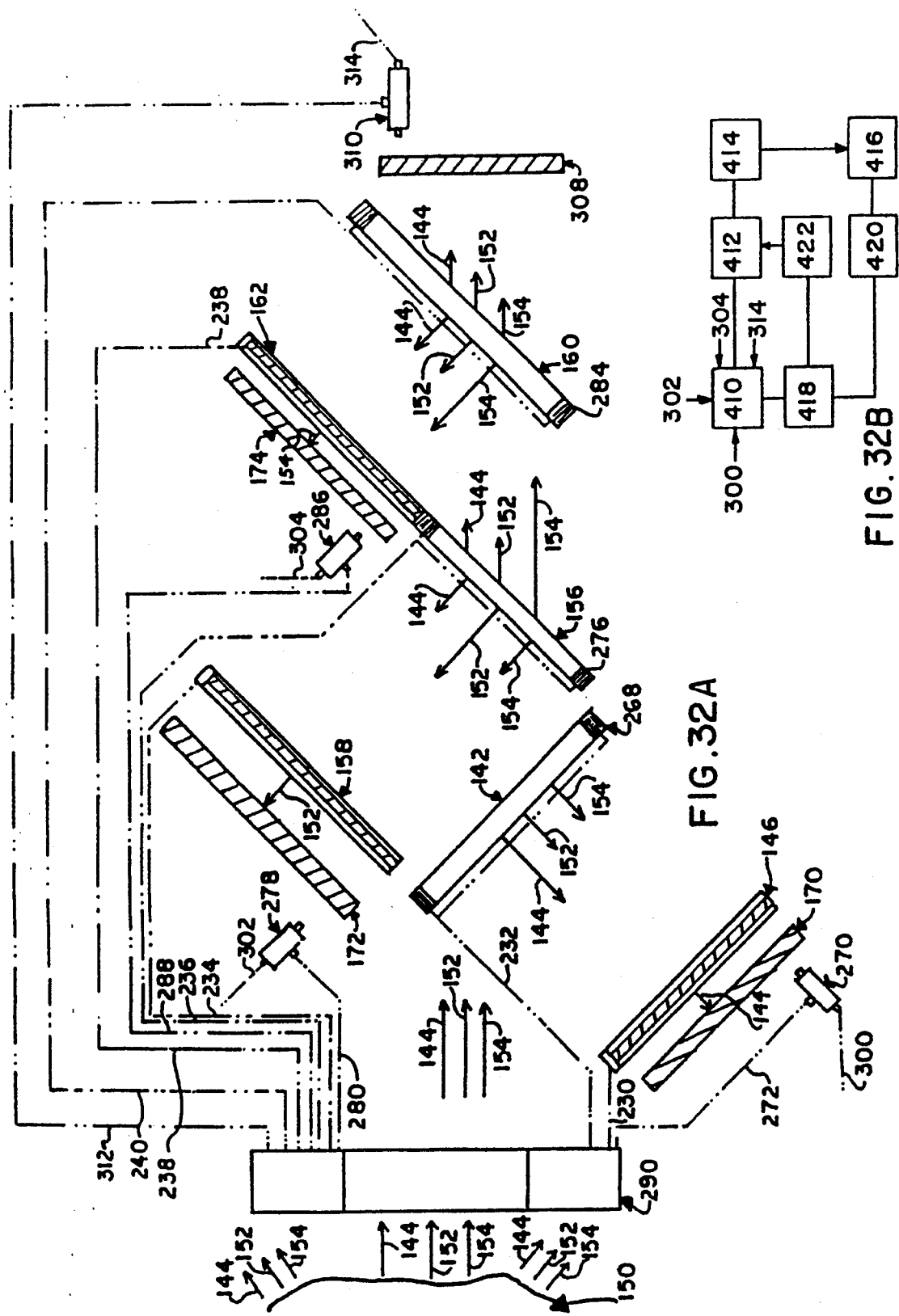

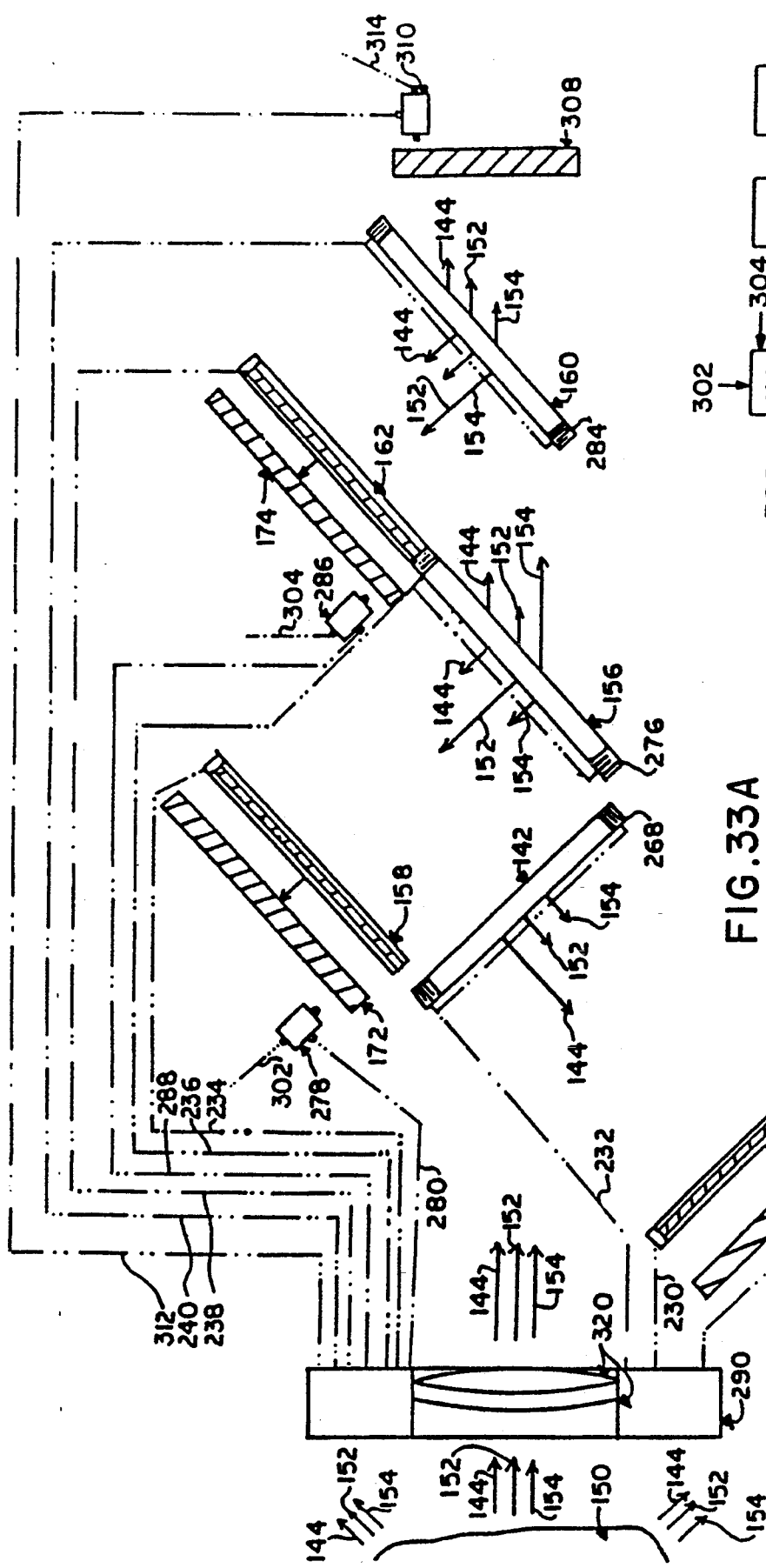

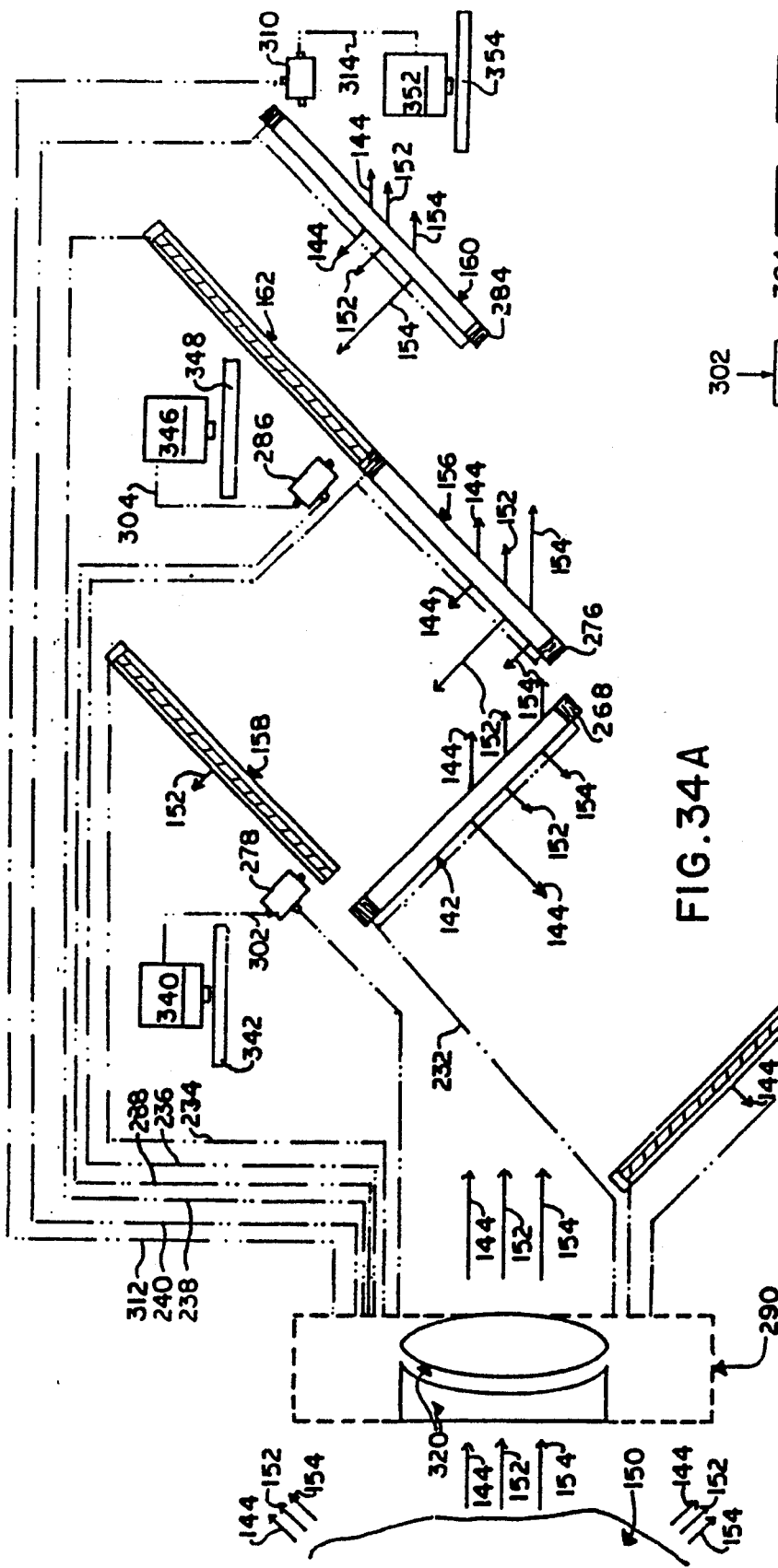
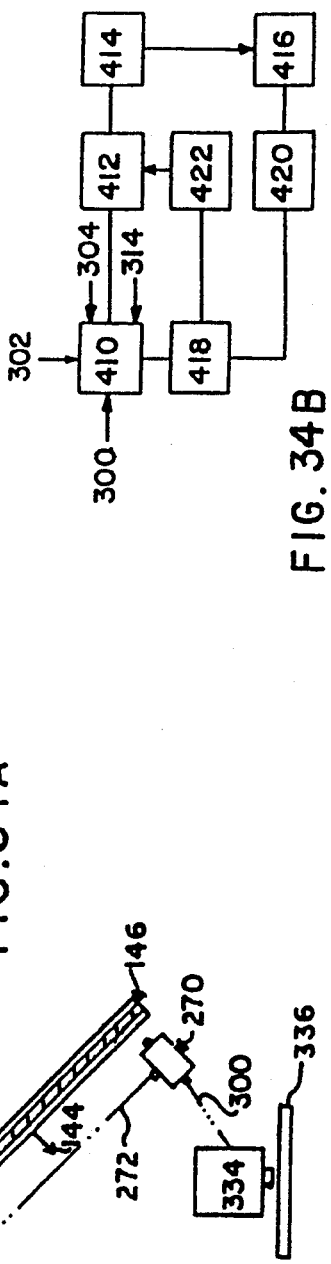
FIG. 34A
FIG. 34B

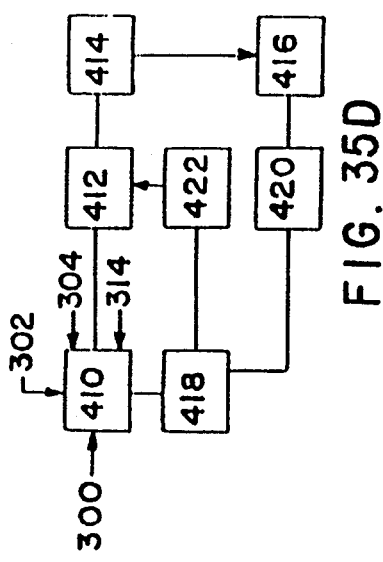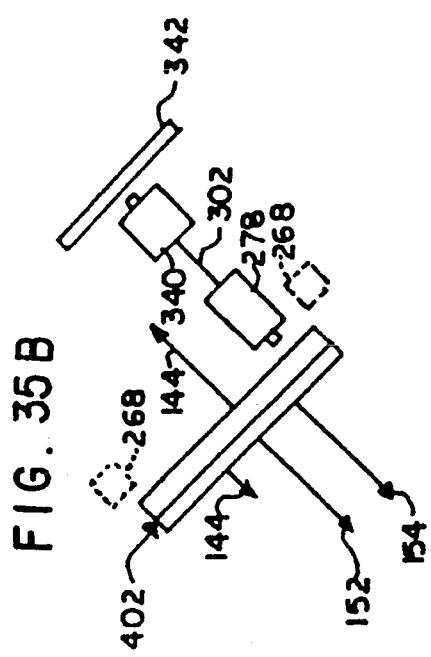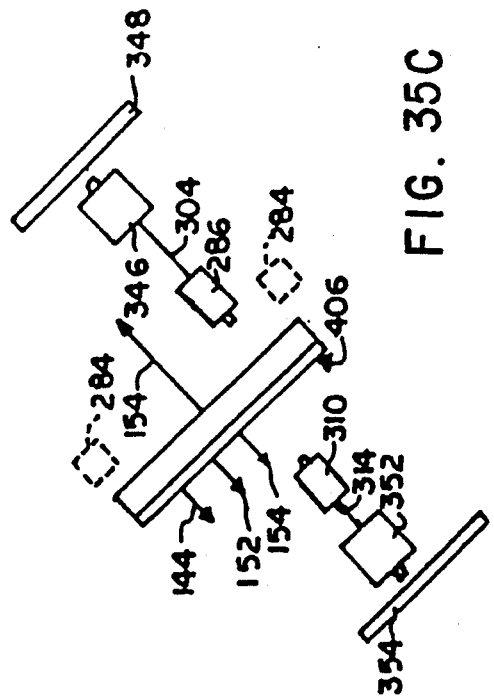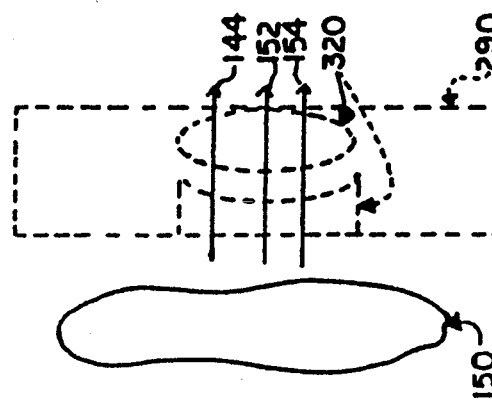

STORAGE APPARATUS COMPRISING A PLURALITY OF LAYERS

This patent application is a division of Ser. No. 07/667,603, filed 1991 March 4, and now U.S. Pat. No. 5,239,338 with an issuing date of 1993 August 24.

The storage of information in often achieved with the use one layer of material. For example, magnetic storage media comprises a magnetic layer on the substrate such as a plastic. An example is magnetic recording tape for use in a cassette recorder. Another example is paper tape used in adding machines or punched tape for use with a computer or a hollerith card. A phonograph record is a further example of storing information with one layer of material.

We have devised a system using a plurality of layers for storing information. Electromagnetic waves of different wave lengths are employed to write the information and to read the information. An electromagnetic wave of a narrow band width is desired. Such a wave of narrow band width approaches a pure color or a natural color. The more narrow the band width the more desirable the color for our purposes.

The quest of man to capture "natural color" in every form of graphic communications had brought about significant technological advancements during the past three decades. Perfection of "Technicolor" brought a boon to the motion picture industry. The significant break-through in the field of television transmission via full color, not only stabilized the growth of this giant young industry, but filled the insatiable appetite of the consumer to obtain maximum enjoyment from the "home entertainment center."

The printing, publishing and photographic industries have likewise expended millions of dollars in machinery, equipment and technique in an effort to maintain its market position as required by the consumers' ever-growing demand for high quality reproduction of "natural color."

Consumer products manufacturers, through the advertising community, via all media of communications, continue to pressure publishers toward perfection of reproduction techniques in order to capitalize on the "emotional appeals" so essential to motivating consumers to product introduction and sales growth.

The purpose of this brief explanation is to describe an advance technique, including perfected equipment in the field of film preparation, as it pertains to the photographic and lithographic reproduction industries with application to related industries. The resultant effect is the ability to offer superior color reproduction at minimized production costs indigenous to consumer demand and reward in vast industry expansion.

To equate and evaluate this advanced technique and equipment, a brief explanation of presently employed processes is essential. All present methods and techniques require an original "Transparency" or "Ectachrome". This is accomplished generally by a professional photographer using standard camera equipment and color film. The majority of commercial photographers use the services of film processing companies for development and finishing their exposed color film. Vary often the elapsed time factor for such processing will be from 3 days to 3 weeks. The average price range of such transparencies will be from $35.00 to $300.00, depending upon size, quantity and degree of labor, i.e. distant location, studio equipment, models, etc. required.

It is not the purpose of this explanation to evaluate or judge the quality of transparencies. Mention is made only to explain the necessity of transparencies in the present method of film preparation for reproduction, but more importantly, to emphasize that with the techniques of this invention (as detailed later), the requirement of the original transparency is completely eliminated. The system does not, obviously, eliminate the photographic studio, models, props, etc., but when employed by the studio photographer, it does eliminate the use of color film. Of equal importance to the photographic and lithographic community is the knowledge that the new technique and equipment have the ability and flexibility to prepare film for reproduction from an original transparency with equal qualitative results without modification of equipment or system.

CONVENTIONAL SYSTEM, COLOR, SEPARATION, DESCRIBED

Step I Transparency is evaluated for color quality and color densities through the use of a transmission densitometer.

Step II Transparency is placed in back-lighted film carrier of standard commercial reproduction camera and illuminated.

Step III Recorded data from density evaluation is programmed into a semiautomatic exposure control device dictated by the aim-points of highlight and shadow.

Step IV Color filter is positioned in camera, unexposed film is positioned, film is exposed to prepare "color masks." "Color masks" are prepared and utilized in later sequences to correct impurities remaining in the original color separation. Depending upon the system employed, one, two or three masks are required in the process, each utilizing a separate film and film exposure, including process development.

Step V Color filter is positioned, unexposed film is positioned, film is exposed to prepare a continuous tone negative for the "Yellow" printer.

Step VI Step V repeated for the. "Cyan" printer or the blue printer.

Step VII Step V repeated for the "Magenta" printer or the red printer.

Step VIII Step V repeated for the "Black" printer.

Step IX In addition to removing undesirable color from each negative through the exposed mask, additional color correction may be accomplished by chemical treatment of each individual negative either in spot areas or overall.

Step X When the desired tonal densities are attained, the negative for the Yellow printer is repositioned, along with an additional unexposed film, plus the halftone screen. This step may be accomplished by either the projection or contact method. The screen angle for the Yellow printer is positioned at 90° and generally, three exposures are made to the unexposed film for highlight, shadow and detail.

Step XI Step X repeated for the Cyan printer with the screen angle positioned at 105°.

Step XII Step X repeated for the Magenta printer with the screen angle positioned at 75°.

Step XIII Step X repeated for the Black printer with the screen angle positioned at 45°.

Steps XIV, XV, XVI & XVII The finished films are now ready for color proofing. This is accomplished by several methods, each requiring a light-sensitive emulsioned carrier, an exposure for each color to be printed, development of each carrier and a reproduction upon either paper, film or another surface. It is not the purpose of this explanation to determine the merit of any color proofing system. The purpose is to define the method steps required, but more importantly, to eliminate these steps entirely and replace them with an electronic proofing system as described in the new technique.

Step XVIII If total color balance has been attained, finished films are ready to be "plated" for the mechanical process selected, i.e. engravings or lithograph plates. More often than not, however, additional color correction is required either in minute spot areas or overall, due to the maximum densities allowable, based upon the type of printing equipment, printing inks and paper (or printing surface) selected. If spot color correction is desired, the areas affected may be dot-etched, a chemical process altering the size and sometimes shape of the halftone dot on the film. It may be required on all four finished films or only on one, two or three, depending upon the desired results. If it is determined that overall densities of the films exceed the capability of the reproduction method or equipment selected, it may be necessary to reduce dot structure overall on one or more of the films. This is known as under-color removal and often requires repeating several steps of the entire procedure to prepare a finished film of the required density. Based on the above, it is not possible to define or retrace the steps actually required.

Time required for the foregoing: 4 to 5 hours

Camera Equipment Cost: $25,000.00 to $50,000.00.

Equipment cost varies due to size and degree of electronic sophistication employed in any installation. Support equipment is not included, since it is understood that certain equipment, i.e. dry to dry film processors, continuous-tone and ortho-mechanical, will be a requirement of all systems.

Color scientists analyze the problem of color printing not only in terms of optics but also mathematics. Seen as a problem of mathematics, the task of color separating and color correcting consists of determining the correct distribution and size of each color dot in every area.

The average lithographic reproduction consists of not less than 12,500 and up to more than 30,000 individual dots per square inch, or of not less than 50,000 and up to more than 120,000 dots in the four colors of ink normally used.

The first electronic color separation was introduced in 1955, now known as the PDI Electronic Color Scanner. In recent years, additional electronic scanning equipment had been placed on the market, i.e. Fairchild Scan-A-Color, Crosfield Scanatron, HPK-Autoscan, to mention only a few.

All the electronic systems include a certain amount of color correcting, a necessity as previously described, due to basic impurities remaining in the system. Color scanned separations are based on the usual color filters. Some scanners can use both reflective as well as transmitted (transparency) copy.

A general description of electronic color separation and color correction is as follows: The color copy is positioned in the machine, where it is scanned by a light beam. Each minute area is evaluated electronically in terms of the transmission or reflective value of each primary color. As in the conventional manual process system, an exposure must be evaluated and projected for each individual color, i.e. yellow, cyan, magenta and black. In this area the steps required are practically identical with the conventional manual system.

The color values are translated into electrical currents by photocells. The computer evaluates the currents which represent the influence of ink, paper, tonal range, etc. It is to be noted that this informative input is programmed by a trained technician and therefore subject to human calculation and error. The modified currents are conducted into an exposing light source. The source varies in intensity in proportion to the corrected values of each of the elements in the scanned area and so exposes the corrected color on the protected film.

Most electronic scanners produce a balanced set of continous seperations, although later models are capable of producing direct seperation screen halftone images. Models under-color removal may be accomplished in the computation and programming, although the masking system is often employed on continous tone nagatives to insure removal of undesirable color-mix for full fidelity reproduction.

From the standpoint of time consumed, as compared with the manual process, the lines per inch dictate the scanning time required, i.e. (averages) at 500 lines per inch, scanning time is, for a full 8×10, 48 minutes per color; at 1,000 lines, 96 minutes; at 1,250 lines, 120 minutes. While each electronic scanner varies to some extent, depending upon the degree of electronic computative sophistication, the basic function is as described. Support equipment, for practical purposes, is identical to the convential manual system of color film, color seperation system.

Time factor: 11/2 to 2½ hours.

Scanning equipment cost: ( excluding support equipment) $1000,000.00 plus

As an additional source of color there may be used a dichroic reflector which reflects certain electromagnetic wave lengths and also transmits certain electromagnetic wave lengths. The use of the dichroic reflector makes it possible to have an additional source of color or certain electromagnetic wave lengths.

GENERAL DESCRIPTION OF THE INVENTION

This invention, generally relates to a system and means for modulating, monitoring and color separating electromagnetic waves via color filtration and to reproducing geometric images. The term separated colors, broadly, applied, is meant to be selected and specific electromagnetic wave length bands, whether in the visible or non-visible wave length ranges, and are so separated by means of optical filtration. Such optical filtration being interference and/or subtractive in nature being capable of selecting and separating specific wave lengths, singly, or plural within a given wave length range.

More specifically the novel system claims the means known in part by prior art as dichroic reflection; a means known in part by prior art as subtractive color filters; a means known in part by prior art as a camera system; and, a means known in part by prior art as photochromic and/or phototropic compounds or compositions, With the use of dichroic filters it is possible to form a narrow bandwidth of electromagnetic waves of substantially the same wavelength to have a substantially "pure" color or a natural color. The narrow bandwidth of electromagnetic waves is used for writing on a layer of material. Then, at an appropriate time the writing on the layer of material can be erased. The writing may comprise placing a dot on the layer of material.

Prior art recognizes the disadvantages of ordinary subtractive and/or absorption and/or interference filters wherein density charactheristics are pre-established by formula of manufacture. The most common disadvantages are non-resistant to fade and high temperature; far from ideal absorption/reflection/transmission characteristics; extreme high density resulting in degradation of color; extreme low density resulting in irregular reflection/transmission, In the context of this unique and novel system, photochromic compounds and compositions are meant to be those elements by nature containing properties characteristic of reversibly increasing optical density upon actinic radiation and/or electronic impulse and which contain submicroscopic crystals of silver halides such as silver chloride and/or silver bromide and/or silver iodide, or a dyestuff or a dye; with such optical density decreasing upon removal of such radiation or impulse, A specific object of this novel system is to provide a dichroic reflector having no appreciable electromagnetic wave absorption factor: while exhibiting maximum transmission and/or reflection, that is, substantially, zero reflection at specified wave length range or plurality of ranges, and substantially total reflection at specified wave length range or plurality of ranges, with substantially total transmission at ranges of zero reflection.

Such dichroic reflector is made by coating a reflection, substrate medium with alternate layers of compositions having different indices of refraction, that is compositions of multilayer configuration consisting of alternating layers of high and low refractive index materials.

The aforementioned transparent substrate consists of any of the family of commercially manufactured inorganic lanthanum borate glasses having a refractive indice about or above 1.6. Compositions for high refractive index layers can be formed composite mixtures consisting of zinc sulphide, zinc oxide, lead molybdate, lead tungstate. Compositions for low refractive index layers can be formed from composite mixtures consisting of calcium fluoride, aluminum fluoride cryolite, magnesium fluoride, lithium fluoride or as a substituent the mineral Gearksutite, which is natural calcium aluminum oxy-fluoride.

In reference to such layers of high and low indices of refraction, the thickness of each high refraction composition, for optimum transmission has been determined to be an optical thickness of one-quarter wavelength for the maximum wave length to be transmitted at the center of the principal transmission band, with an exception being for the high refractive layer that directly precedes supporting substrate, that layer being of and optical thickness of one-half wave length of the light that is to be selectively transmitted. The thickness of compositions to be formed for low refractive indices have been determined to be one-eighth wavelength for the maximum wavelength to be transmitted at the center of the principal transmission band of the light that is to be selectively transmitted. If multiple wavelength range or a plurality of ranges are to be transmitted and/or reflected, additional layers as defined above may be stacked.

Since such configuration as layered and stacked is preferably of rigid construction, and in addition to supporting substrate, an additional panel of glass or other rigid synthetic plastic material is applied to the top outer surface of such configuration. Naturally it is understood that such outer panels must be of optical clarity and transparent in the wavelength range of radiation to be transmitted. Such outer panels are nonhydroscopic; resistant to scratching or abrasion; and may be dyed or tinted.

Moreover, the range of the selective wavelength band is regulated by the optical thickness of each said layer with the exception being that optimum transmission/reflection is achieved by a layered group of three, that being a high refractive layer, a low refractive layer and a duplicate high refractive layer.

Such stacked components may be heated to lamination temperature, subject to vacuum and pressure to produce a single unit structure. A standard laminating chamber is evacuated to a pressure of approximately 1 (one) millimeter of mercury and thereafter heated to temperatures from approximately 180° to 200° F. Upon reaching the desired temperature, pressure is applied to all exposed surfaces, including side edges, said pressure being approximately 200 lbs. per square inch. After 4 to 7 minutes, temperature is reduced and pressure released.

Such dichroic reflectors are sometimes termed interference filters and may be inserted so as to intersect radiation beams singly, in tandem or in a cooperative term wherein the multiple, that is more than one such filter, may act as an assist to the primary filter in the art of separating wavelength bands or colors.

A specific object of this novel system is to provide a variable density filter and optical filtration system wherein optical densities of such filters vary in accord and response to photochromic and/or phototropic properties incorporated therein, such photochromic and/or phototropic properties responding to electromagnetic radiation in the visible and/or non-visible wavelength ranges.

Such variable density optical filters may consist of any number of the families of inorganic silicate based glass matrix; or inorganic lanthanum borate glass matrix; or inorganic metal. oxides suspended in polyester binders. Glass compositions are processed in the conventional manufacturing practices as dictated by base type, such as chamber reduction for silicates and non-reduction for lanthanum borate. Lanthanum borate is preferable in that it exhibits increased radiation sensitivity, a higher refractive index which provides greater resolution than do lower index glasses.

Photochromatic and/or phototropic properties incorporated chloride into such glass compositions contain microcrystals of silver halides selected from the group consisting of silver chloride, silver bromide and silver iodide, and are incorporated within the aforementioned glass matrix in conventional glass-making practices of their type and kind.

In addition however, to the photochromic glass composition and in accord with this novel system and invention dyestuffs have been introduced. That is dyestuffs of a nature as to correspond to the color (wavelengths) of the three ranges represented by what is known as primary colors, e.g., yellow, magenta and cyan.

Those practiced in the art will recognize the foregoing as a variable density optical filter wherein optical densities are varied in accord to the intensity and wavelength (color) content thereon exposed. Moreover, when such filters are prepared in section, that is from 2 (two) pieces of density variable color filter glass, an electronically conductive interlayer material, transparent in nature is positioned between said glasses. The two said glass filters with the inserted interlayer may be laminated in the conventional manner to form a single structure. Electrical current may be alternating or direct. It has been determined that approximately one (1) milliamp per square inch from a twelve (12) volt direct current source is sufficient to activate the photochromic properties.

It is a specific object of this novel system to provide light sensitive emulsions of a nature so as to correspond to the color (wavelengths) of the three ranges represented by what is known as primary colors, e.g. yellow, magenta or red, and cyan or blue, while not limited to such ranges (colors) for the purposes herein defined said ranges (colors) are identified. Such sensitivity shall encompass the visible wavelength range and shall extend from about 3950A to, approximately, 5250A for range one (1) or for blue or cyan; from 4750A to 6250A for range two (2) or for yellow; and, from 5750A to 7250A for range three (3) or for red or magenta.

Such light sensitive emulsions may be manufactured in the conventional film-making practices, and, while advantageous to the system, said system is not limited to their exclusive use in that any of the family of high quality panchromatic film may be utilized.

Substrate materials for such emulsions are preferably of stable base polyethylene ester, with dimension variants not to exceed 0.0020 to 0.0030 within a 24 inch span while under temperature variant of plus or minus 20°, and not to exceed 0.005 to 0.010 while under humidity variant of 20%. The grey scale, contrast range should be represented by a minimum of 15 to 20 steps of tonal range with maximum opacity for subsequent halftone dot transference or high intensity radiation source for subsequent imaging of photographic, lithographic or other image reproductive procedures.

It is a specific object of this novel system to provide a photographic means not only to color separate electromagnetic waves into three (or more) distinct wavelength ranges, but to all such ranges with photographic images therein, to selected light sensitive film emulsions contained within said photographic means, simultaneously.

The foregoing is accomplished by directing a polychromatic geometric image bearing light beam to a first dichroic reflector; said first dichroic reflector reflecting image bearing wavelengths of the first selected range to and upon the first photochromic variable density color filter and hence onto the first light sensitive emulsion. Such image bearing light not so reflected is transmitted directly to a second dichroic reflector wherein the procedure as described is repeated for the second variable density filter, second film, etc., and, subsequently to a third dichroic reflector wherein the procedure as described is repeated for the third variable density filter, third film, etc.

The remaining light not so reflected is directed to a fourth light sensitive film emulsion and may be utilized as a complementary color such as black or other as desired.

This invention is directed to the use of dichroic reflectors for securing a relatively narrow band width of electromagnetic radiation. Further, there is considered the use of a multiplicity of layers having different areas of color or different areas which are responsive to different colors. The different areas of color or different areas which are responsive to different colors can transmit certain band width of electromagnetic radiation or do both. For example, the various layers responsive to different band widths of electromagnetic radiation can be permanent to record information. It is conceivable that there can be a number of layers of these areas of color. The area can reflect a certain color when the color hits the area to indicate a first state and the area can do nothing or be passive when the color hits that area to indicate a second state. Further, it is conceivable that instead of reflection there can be transmission of the color so that when a certain color hits a certain area the color is transmitted to indicate a first state or the area is passive to indicate a second state. Further, it is possible to have these areas responsive to different colors to that if a certain color strikes a certain area that area is activated to indicate a first state and if another color strikes that certain area The area is passive to indicate a second state. The state of the area can be changed by the color striking the area. With a multiplicity of layers and each layer having a multiplicity of areas responsive to color of a certain band width of electromagnetic radiation it is conceivable that information can be stored in large quantities in a first state and in a second state.

The chromatic bit disc storage system is a means to achieve at least an eightfold increase of bit density storage in an optical storage system. The storage system is a computer adjunct for the storage of information used in or for, or both, calculations or control of external associated systems. The chromatic bit disc storage system is inherently denser in its ability to store information than a comparable optical storage system that is not chromatic. Chromatic bit is meant to mean that each bit has a value or weight by virtue of its chroma or color value. Thus a combination of bits can express values greater than their binary (number) value. Further, in the same cross sectional area of a comparable optical storage system which describes one bit the chromatic bit disc storage system may store up to eight bits, or more, the equivalent of a byte of information for an eight bit byte computing system. A chromatic bit storage system comprises a plurality of layers of material for storing information. A comparable optical storage system had one layer. At first, it appears, that eight layers of material can store eight times the information that a single layer can store. This is not the case. Eight layers can be in various combinations so as to be able to store more than eight times the information that a single layer can store. If there be sixteen layers then, because of various combinations, the sixteen layers can store more than sixteen times the information that a single layer can store.

The concept of imparting a weight or value to a bit, beyond its binary (number) value is found in expressing that weight or value in a discrete color assignment. Such as assignment is made optically by coloring that bit by storing it in a medium that for a binary $\phi$ is clear to all wavelengths of light. By sandwiching successive layers of different mediums (different in their abilities to pass the full spectrum of light when storing a binary 1 the storage density per given area rises exponentially to the number of layers of different mediums. This is a result of the various combinations of layers.

There are two ways to achieve this increase in storage density, There is the subtractive filtering system and there is the additive filtering system. The subtractive filtering system requires two or more sources of monochromatic light. Two or more (this is to match the number of sources) detectors of light. Each detector is sensitive to only one source of light (in that it is responsive to a small bandwidth of the spectrum, i.e., responsive to only one source which is monochromatic and whose output falls within that detector's useable sensitivity); and a storage medium which contains at least two filter layers (to match the numer of sources) that pass all light of the sources for a binary $\phi$ stored within their medium or that pass only one wave length from one source to be detected by one detector for a binary 1 stored within their medium. The additive filtering system requires two or more sources of monochromatic light; two or more (this is to match the number of sources) detectors of light that each is sensitive to only one source (in that it is responsive to a small bandwidth of the spectrum, and responsive to only one source which is monochromatic and whose output falls within that detector's useable sensitivity); and a storage medium which contains at least two filter layers (to match the number of sources) that pass all light of the sources for a binary $\phi$ stored except one for a binary 1 stored within their medium.

A part of this invention is directed to the generation, transmission, and recovery of selective wave length electromagnetic radiation centered about that portion of the electromagnetic spectrum known as light. To this end, there is no distinction in any or all of the selective wave lengths of electromagnetic radiation being visible or invisible; as the means of detection is not necessarily related to vision (except by reference). The term color separation may be invoked as a convenience of analogy, but this does not limit the invention's usefullness to that portion of the electromagnetic spectrum known as light. In fact, there is much application outside the visible spectrum. Those aspects described above as generation and transmission of selective wave length electromagnetic radiation are detailed in co-inventor Robert E. Pearson's U.S. Pat. No. 4,355,888, 26 October 1982; 4,509,854, 9 April 1985; and, 4,668,078 (26 May 1987).

In the combination of these technologies there is a novel technology. This novel technology may be used for the process of mass data (both analog and digital) storage by optical means. By virtue of this novel technology our novel application increases the potential storage capacity many orders of magnitude over that of currently available mass data storage systems. Further, this may be accomplished without sacrifice to data speeds or physical constraints of system size.

Current technology uses a magnetic media for the storage of computer (digital) data. The media is found in many applications such as plastic recording belts for dictaphones; recording tapes as found in open reels and cassettes of various sizes; and discs specifically used for computers. Access time is a term that denotes the interval between a request for data transfer and the transfer of data. Current technology in magnetic media has been limited to an access time of 1 millisecond to 100 milliseconds. This limitation is actually a function of hardware supporting the media. That is, there is a matter of physical inertia in the movement of lead/write heads that limits access time.

Our optical storage system does not directly attend the issue of inertia and will thus have similar access times. However, by virtue of our technologie's use of light generating and detecting components, the use of fiber optics can significantly reduce the mass of our read/write heads to a point where access time is shortened considerably. Other physical considerations include the indisputable point that the greater surface area that a storage media encompasses, the greater amount of data that may be stored in that media. Our optical storage system may be identical in size compared to existing systems and yet hold many orders of magnitude more data. This is due to our use of an optical media which can store more information per given area than can magnetic media.

Our invention brings together two or more sources of radiant flux, with each source distinct from any other in terms of its dominant wave length, and then directed their combined flux through an optical storage media, in the form of a disc, tape, or cube, to a detection system capable of separating out the original spectral components.

As with any system, the transmission and reception of power with a medium of loss due to mismatch provides not only a more stable system, but also one that is most efficient. In achieving a high bit density in a given area of a storage media there is a corresponding lowering of bit area. Thus for our claim of increasing memory density through the use of our invention we anticipate that we must work with storage cell areas correspondingly smaller than those encountered in the available magnetic media storage. To this point it should be noted that to reliably read this cell requires that it should appear to be a point source of radiant flux to the detection system. To provide a higher signal to noise ratio; apertures are placed on both sides of the cell. One aperture lies between the cell and the sources to mask adjacent storage cells from source emission. Another aperture lies between the cell and the detection system to mask any spurious transmission of flux from adjacent memory cells. Typically such apertures would have a radius on the same scale as the cell that is being masked. By the use of apertures, the cell appears to become a point source of radiant flux when radiated on one side by a true source of flux, and viewed on the other side by the detection system. For any increase in memory density there is a corresponding decrease in both bit cell and the amount of flux passing through it if there is no corresponding increase in source flux density.

Thus flux density within the area of a storage cell becomes the most important specification when defining source and detector requirements. And by extension, if may also be related to flux density within the area of the aperture. Presently, optical fiber technology provides fiber radii on the scale of 100 mm micrometer. As such they could be used to both define the aperture and serve as a conduit for radiant flux from the sources off the optical storage media and from the storage media to the detection system. A fiber optic-10 inch disc design would result in a storage system capacity of 100 million bits. However, this is achievable only if enough power or flux is transmitted and at this scale incandescent sources are exceedingly hard to couple to fiber optics; lens systems are expensive and require filtering to provide the necessary spectrum; they must also maintain critical alignment, bulb geometry, and focusing to efficiently couple light to the small cross section of a fiber optic lead. On the other hand light emitting diodes, infra red emitting diodes and injection laser didoes all provide high power or flux density over a narrow spectrum from a source that is physically on the same scale as fiber optic cable. These sources: light emitting diodes, infra red emitting diodes, and injection laser diodes are eminently suited for coupling radient flux to the small radii of fiber optics.

Again, for the like of convenience the discussion that follows uses concepts of colorimetry and optics to describe the principles of our invention and this does not imply that our technology restricted to operation within the wavelength bounds of that region of electromagnetic radiation known as "light".

Simply put, we use several sources of monochromatic light. One example may be the aforementioned light emitting diode. The output is connected to light conducting fiber optics. These fiber optic heads are in turn fed into a fiber optic device capable of integrating the combined flux into a single output fiber optic. Such devices are presently available for non-colorimetric application and by analogy operate in much the same way as directional couplers of present microwave technology. This last fiber optic lead then serves both to conduct the light flux and to define its flux density at the terminus of the fiber. That is, the fiber optic end becomes the aperture that illuminates the memory cell in the mass storage media. As discs are a popular form for mass storage using magnetic media, we will offer them as a benchmark and adopt the same form disc, to support our optical storage media. Again, using available technology, specifically fiber optics whose cross section diameter equals 100 micrometers, we can store up to 100 million bits provided there are 10 color layers of material in each cell or if the cell structure is amorphous there is a color property of the cell such that it may pass the flux of one, all, or any combination of the sources while obstructing the flux of the remaining sources. The combined flux of the sources pass through this memory cell and as a result of color selective attenuation a unique transmission of flux is coupled to the detector side fiber optic lead. This unique transmission is composed of the non-attenuated components of the original sources inputs. As such this represents an encoding of the original flux by the optical properties of the storage media. To decode this transmission, the flux applied to the detector side fiber optic is transmitted to a system of variable dichroic filters and photo detectors. This system separates the combined flux into its components and each component is measured with a photo detector to determine the optical transmissiveness of the memory cells media. Thus, for a layer cell, or for an amorphous structured cell with an attribute to pass the flux of one, all or any combination of the sources while obstructing the flux of the remaining sources, a point in memory storage has been transformed from a cell having one bit of significant information to a cell having a byte of 10 bits of significance.

In our mass storage system there is a unique range of wave lengths attributed with each of the 10 bits in the memory cell. For example, the most significant bit might occupy a bandwidth of wave lengths from 450–460 nanometers and the least significant digit occupy a band of wave length from 460–470 nanometers. The remaining intermediate bits would occupy corresponding intermediate narrow bandwidth regions in the electromagnetic spectrum between 470 nanometers and 690 nanomteres. This then may define our source requirements for each bit in optical storage. Presently, many light emitting diodes are available to meet the source requirements for this hypothetical model and many other infra red emitting diodes could be used as alternatives or for bit expansion of the byte in optical storage.

An optical storage system of high resolution requires an optical detector of high resolution. In optical storage resolution is a function of system bandwidth and bit bandwidth. As information is stored in a narrow region of the spectrum it is seen that resolution is highest when the bandwidth is narrow. Thus a high resolution optical detector must be capable of separating out the spectral components of a composite signal (the sources combined flux) where the components are of narrow bandwidth without degrading their spectral purity. These resolution requirements are fundamentally the same as those found in the technology of frequency domain multiplexing of data.

In all, the detection system is capable of capturing as much of the spectral flux or power available within the smallest bandwidth consistent with required signal to noise ratios. Also by the use of a unique combination of dichroics and variable density filters as taught by Pearson we enjoy a means to realize maximum flux coupling to a specific detector. That is the detection system described generally in Pearson as a color separator offers minimal impedance to the transmission of flux of a narrow range of wave length. By the proper selecting of dichroics this transmission bandwidth is tailored to match its sensitivity to the dominant wave length of one source. This unique pairing of monochromatic source and variable density dichroic filters/detector is applied in our detection system once for each bit of resolution that is stored in the memory cell's media. For our original example of ten layer cell, we use ten unique pairings of sources and detectors.

OBJECTS OF THE INVENTION

An object of this invention is to provide a means and method for securing a selective range of wave lengths of light without substantial loss of electromagnetic energy; another object of this invention is to provide a means and method for the simultaneous and, substantially, instantaneous and self-adjusting automatic separation of colors or of wave lengths; an additional object is to provide a photosensitive emulsion having a filter for absorbing selective wave lengths of light; another important object is to prepare a printing plate or a lithographic plate directly from a selected wave length band without the requirement of the intermediate steps utilizing standard film procedures; another object is to provide a means and a method for creation of a geometric image by means of electrical pulses where no geometric image is visible; an additional object is to provide a means and a method for converting a selective range of wave lengths to certain information such as analog information and digital information; another object is to provide a means and a method for converting a selective range of wave lengths to certain information and recording and storing said certain information; an additional object is to provide a means and a method for reducing the time to make color separations for reproduction purposes; another important object is to provide a means and a method for lessening the cost for making color separations for reproduction purposes; another object is to provide a means and a method for increasing the quality of color separations for reproduction purposes; an additional object is to provide a means and a method for making a color separation from a live subject and to eliminate an intermediate film transparency so as to achieve a better quality of a color separation at a less expense for reproduction purposes; another object is to provide a means and a method for an automatic self-adjusting variable density filter having photochromic properties or phototropic properties and also absorption properties and transmission properties; an additional object is to provide a photographic emulsion sensitive to a selected range of wave lengths for reproduction purposes; another important object is to provide a means and a method for separating wave lengths into selected ranges of wave lengths thereby lessening the need for the technical training of an operator of the means so that a novice may be used; an additional object is to provide a means and a method for, substantially, simultaneous activation of photosensitive emulsion; and, another object is to provide a means and a method for, substantially, simultaneous activation of variable density filters.

These and other important objects and advantages of the invention will be more particularly brought forth upon reference to the detailed description of the invention, the appended claims and the accompanying drawings.

Another object of this invention is to use a dichroic reflector to separate a mixture of a multiplicity of colors into a number of separate narrow band widths of electromagnetic radiation for use in determining the characteristic of a gas, the characteristic of a liquid and the characteristic of a solid. Another important object of this invention is to use narrow band widths of electromagnetic radiation for the storing and recording and the retrieval of information and which information may be in a first state and may also be in a second state.

THE DRAWINGS

In the drawings:

FIG. 1 is a fragmentary cross-sectional view of a dichroic reflector showing a substrate and a high refractive index layer, a low refractive index layer and a high refractive index layer;

FIG. 2 is a fragmentary cross-sectional view of a dichroic reflector showing three high refractive index layers and two low refractive index layers;

FIG. 3 is a fragmentary cross-sectional view showing a substrate and three high refractive index layers and two low refractive index layers;

FIG. 4 is a fragmentary cross-sectional view illustrating a frame for positioning two outer high refractive index substrates or protective members and three high refractive index layers and two low refractive index layers;

FIG. 5 is a fragmentary cross-sectional view illustrating two outer substrates and three inner high refractive index layers and two inner low refractive index layers;

FIG. 6 is a diagram of per cent reflection versus wave length in Angstroms for the three selected wave length bands of primary colors when using the dichroic reflectors as illustrates in FIGS. 1-5;

FIG. 7 is a fragmentary cross-sectional view of one species of a variable density filter;

FIG. 8 is a fragmentary cross-sectional view of another species of a variable density filter and which variable density filter comprises three high refractive index layers and two refractive index layers;

FIG. 9 is a fragmentary cross-sectional view illustrating two substrates of the variable density filter and an exciting means for exciting the photochromic materials or phototropic materials of the filter;

FIG. 10 is a fragmentary cross-sectional view illustrating a variable density filter having two outer substrates and three inner high refractive layers and two inner low refractive layers;

FIG. 11 is a fragmentary cross-sectional view illustrating a variable density filter having two outer substrates, three inner high refractive layers and two inner low refractive layers and an exciting means for exciting the photochromic materials or phototropic materials of the outer substrate;

FIG. 12 is a fragmentary cross-sectional view illustrating a variable density filter having two outer substrates, three inner high refractive layers and two inner low refractive layers, and an exciting means for exciting the photochromic materials or phototropic materials of the variable density filter;

FIG. 13 is a fragmentary cross-sectional view of a variable density filter comprising a substrate and two high refractive index layers and one low refractive index layer;

FIG. 14 is a diagram of a wave length range selectivity using a variable density filter as illustrated in the FIGS. 7-13;

FIG. 18 is a schematic illustration of an arrangement of dichroic reflectors and photosensitive emulsions for the photosensitive emulsions being activated by selective ranges of desired wave lengths;

FIG. 24 is a schematic illustration of a lens and dichroic reflectors and photosensitive emulsions for separating wave lengths into selected ranges of desired wave lengths and recording the desired ranges of wave length on the photosensitive emulsions;

Figure 17:
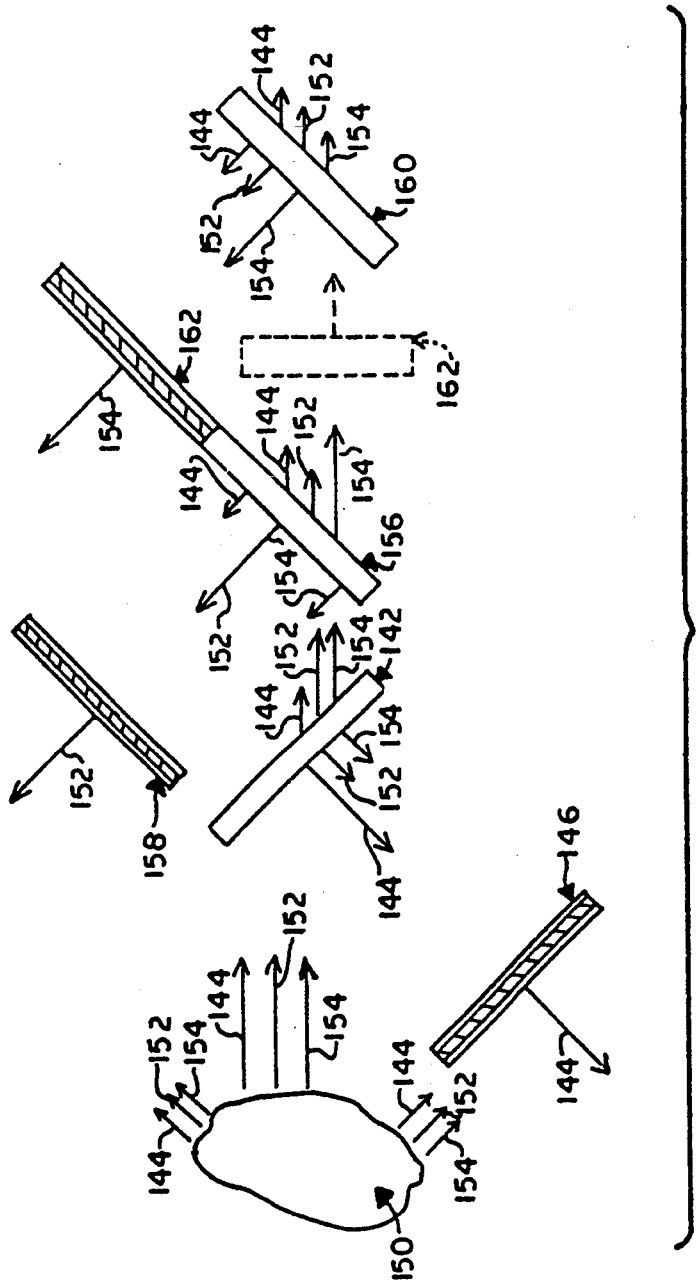
FIG. 17 is a schematic illustration of an arrangement for dichroic reflectors and variable density filters for realizing selected ranges of desired wave lengths.
Figure 23:
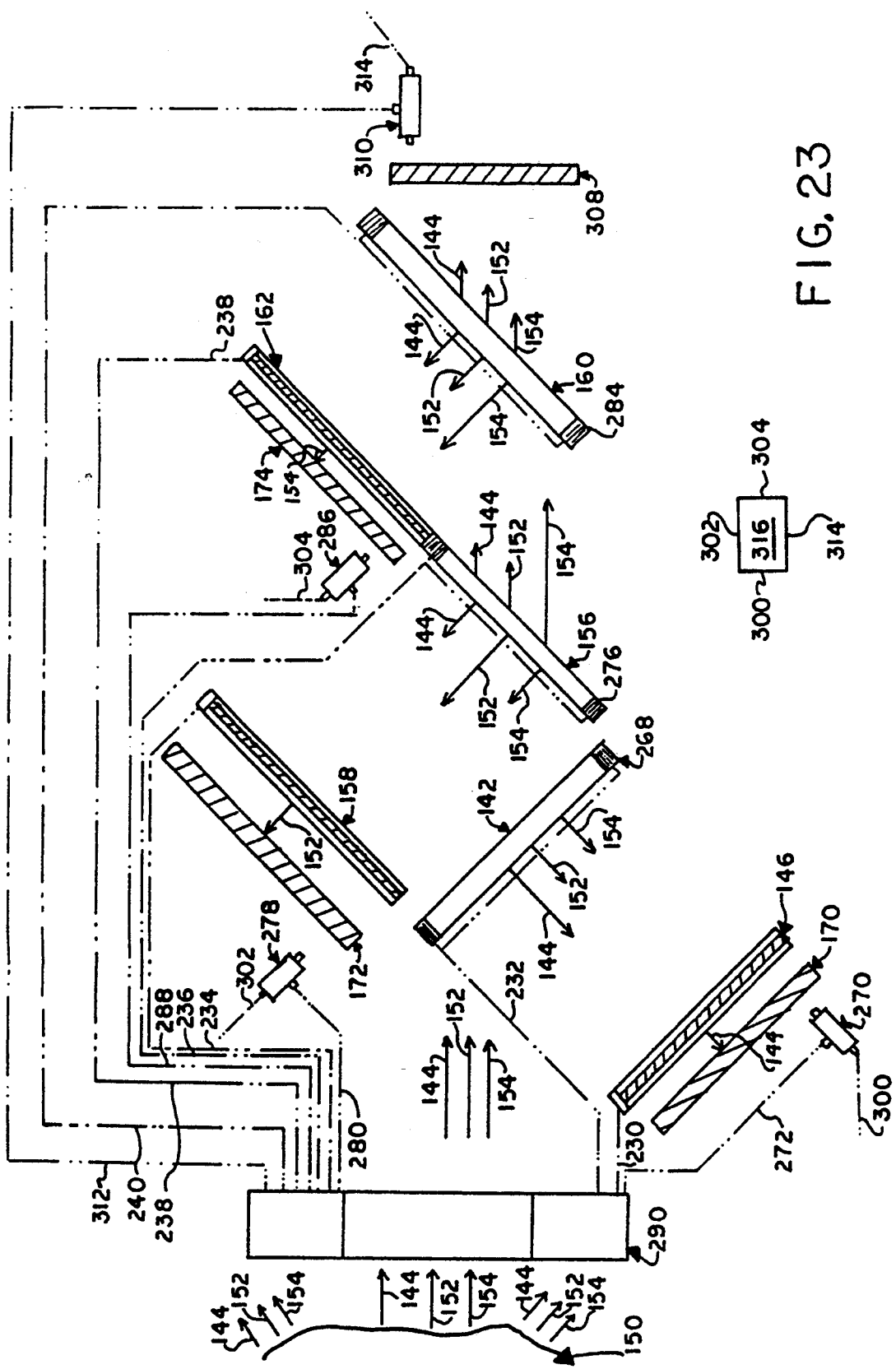
FIG. 23 is a schematic illustration of a combination of a selective wave length sensor and control and power source for the combination of the dichroic reflectors, the variable density filters, and either a recording means or a scanning means.
Figure 27:
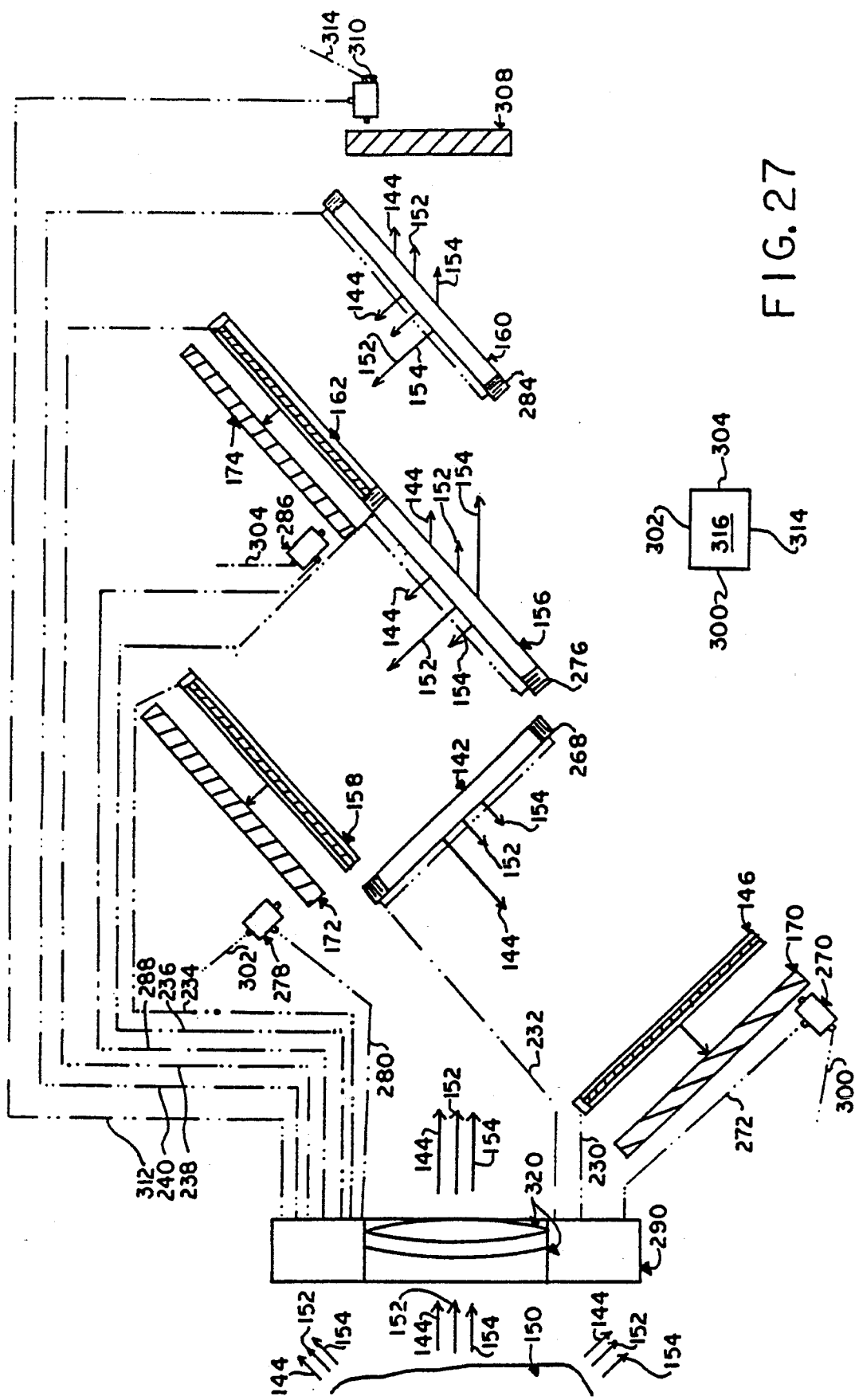
FIG. 27 is a schematic illustration of a lens, a combination of a selective wave length sensor and control and power source, dichroic reflectors, variable density filters, and a recording means or a scanning means.
Figure 28:
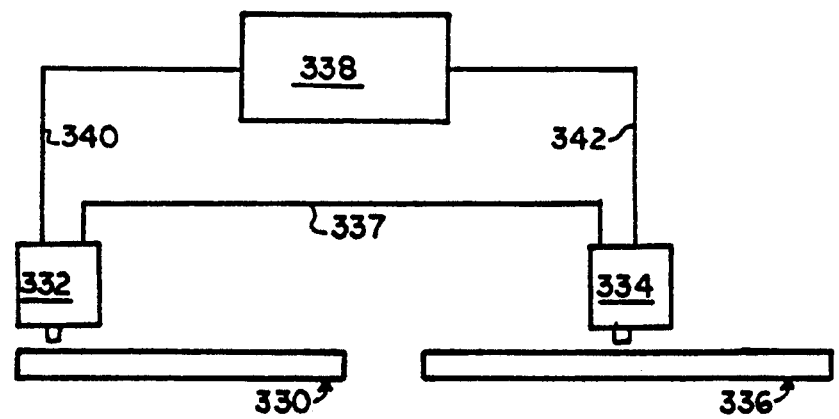
Figure 29:
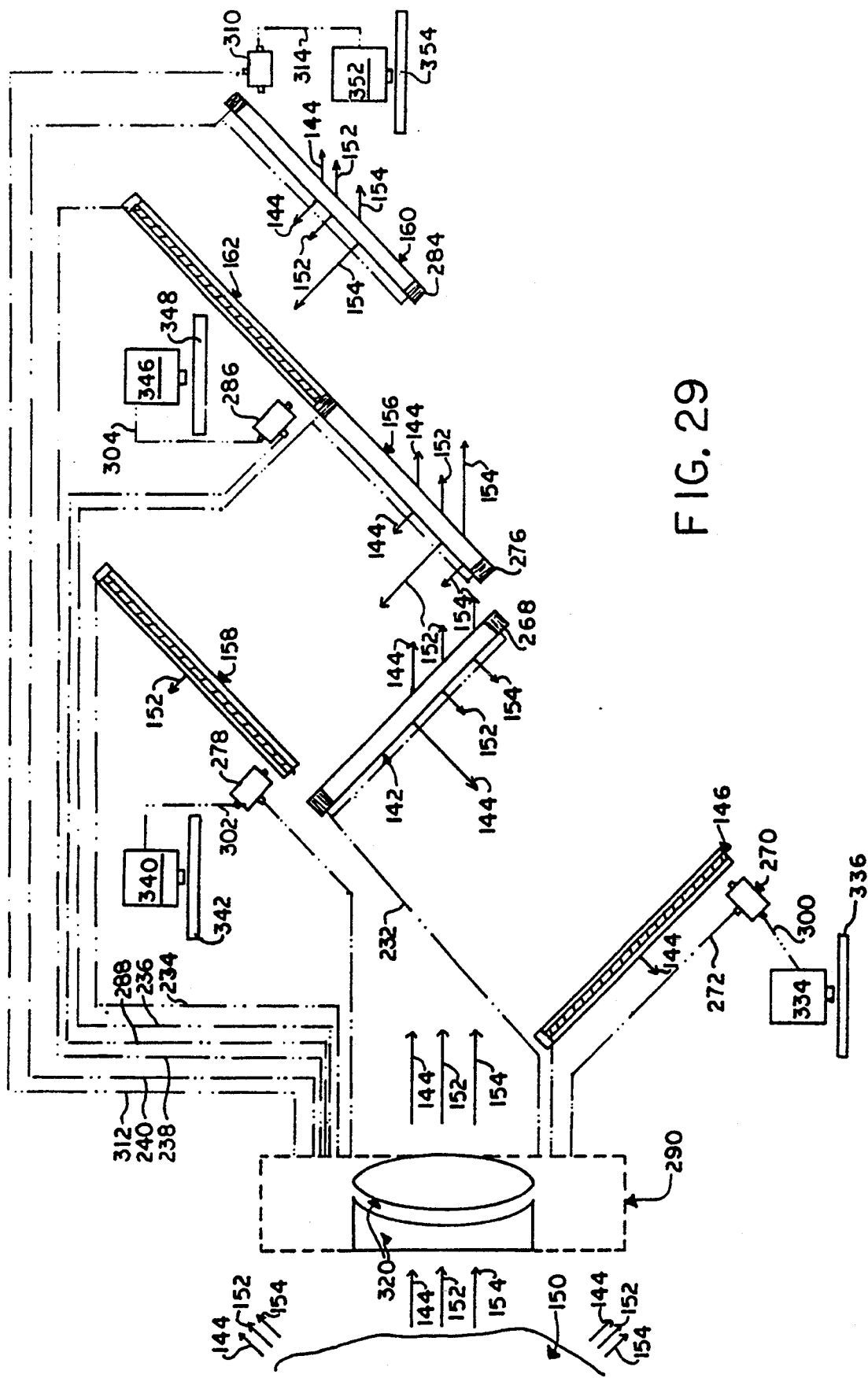
Figure 36:
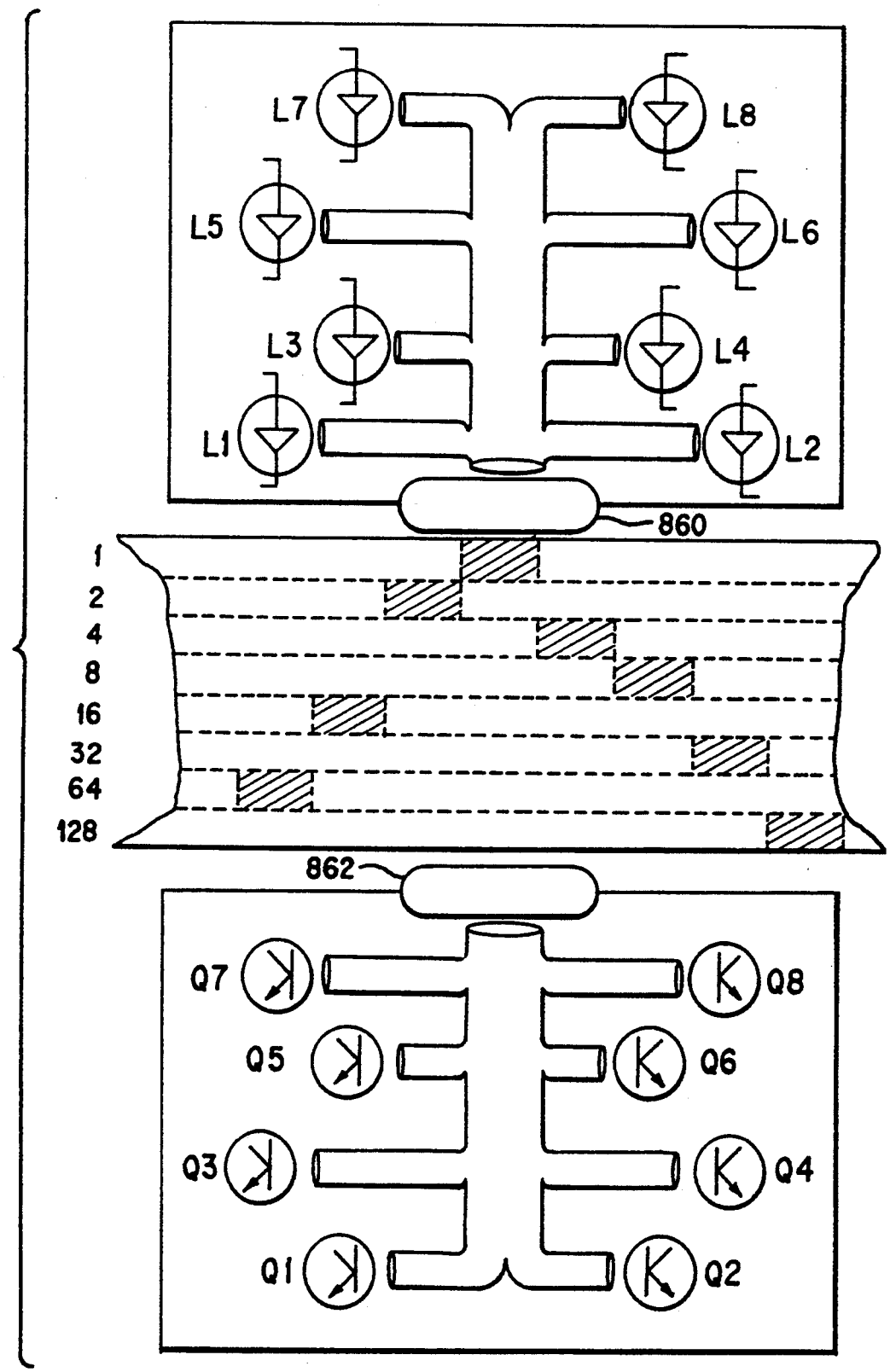
Figure 37:
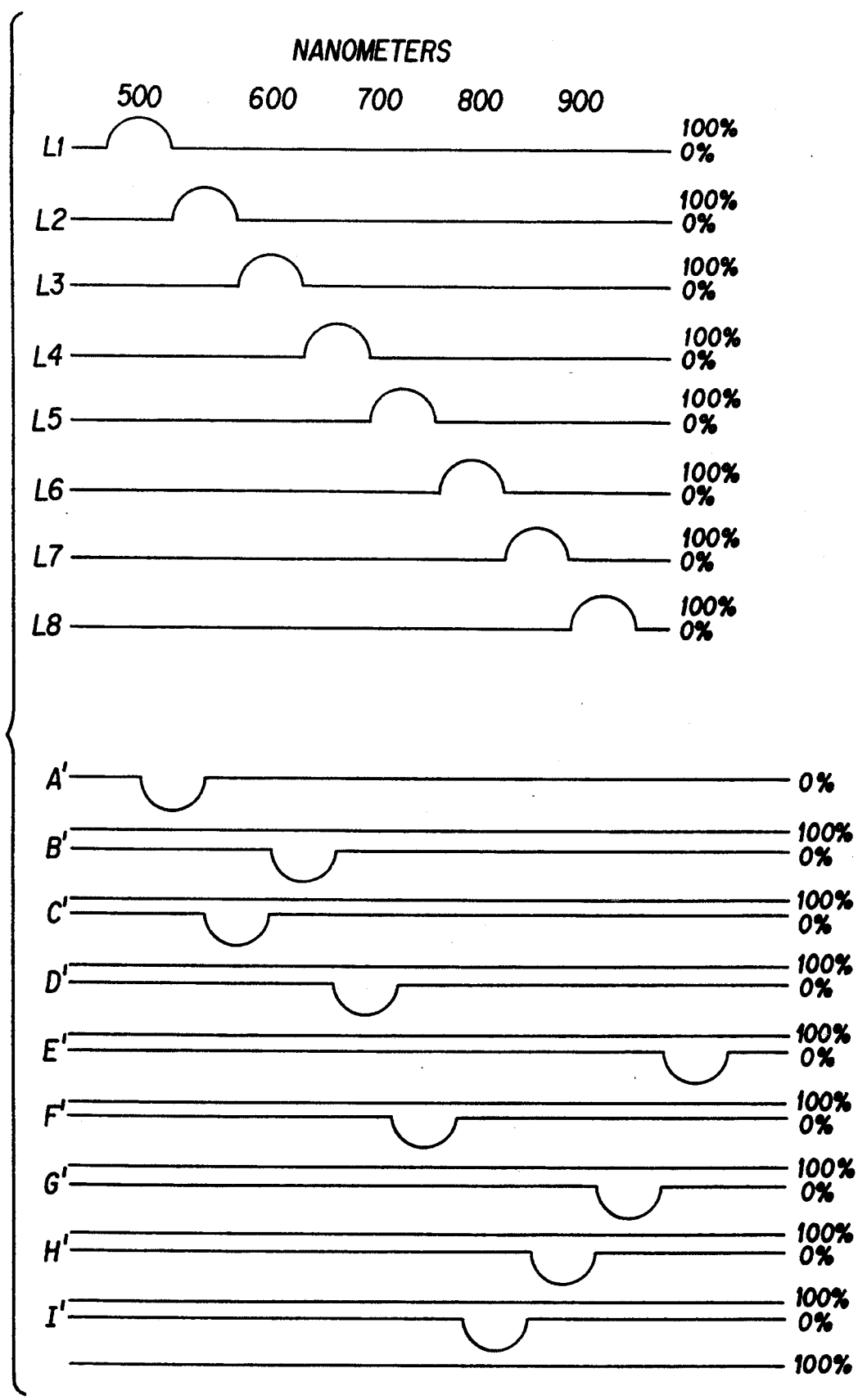
Figure 38:
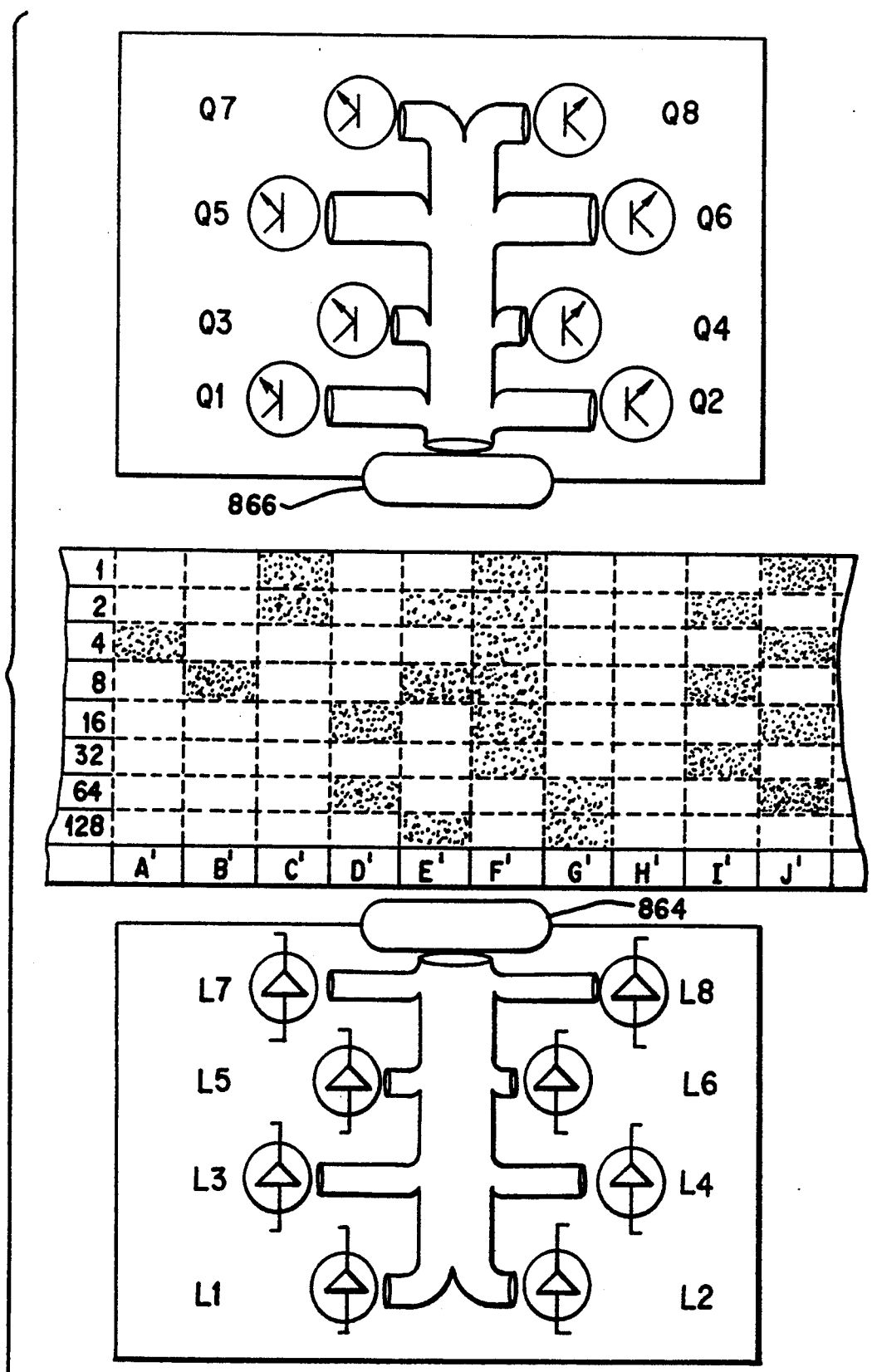
Figure 39:
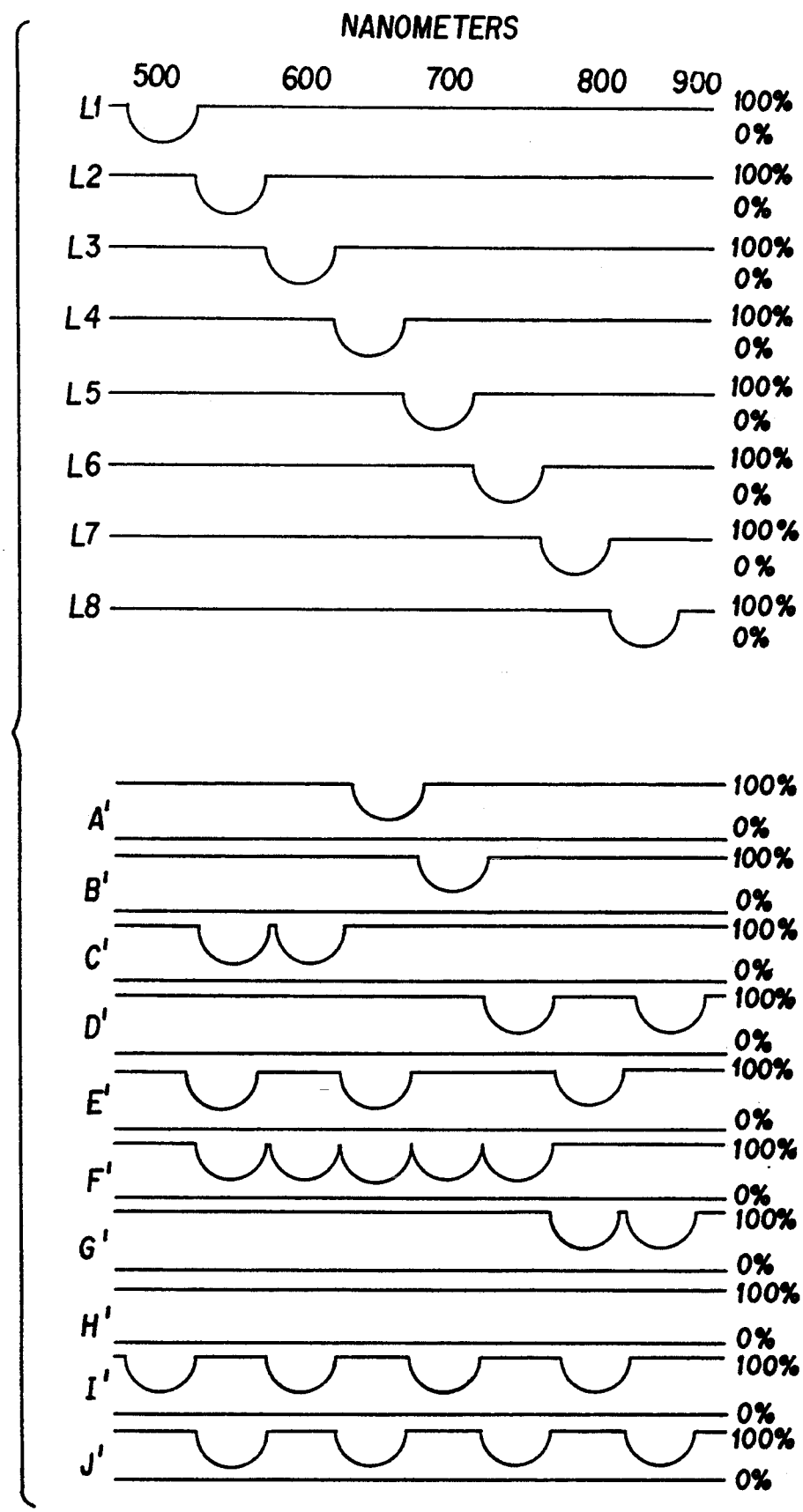
Figure 40:
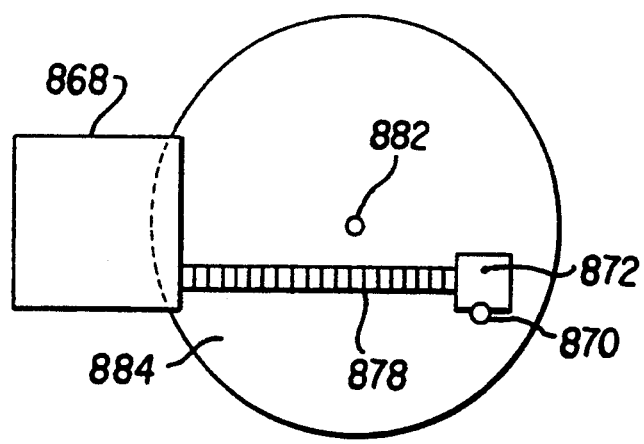
Figure 41:
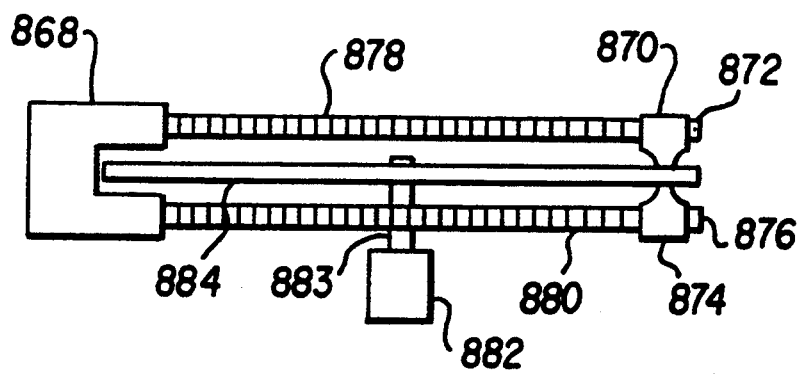
Figure 42:
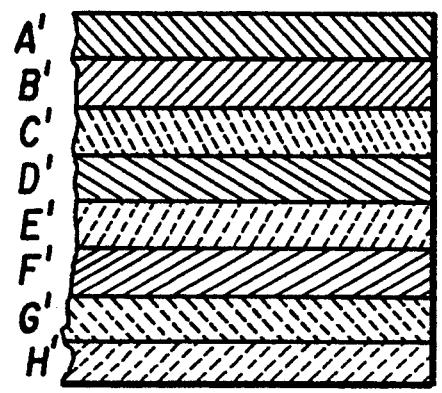
Figure 43:
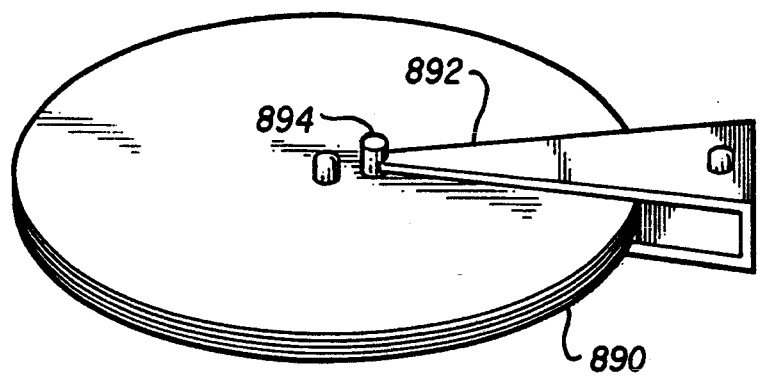
Figure 44:
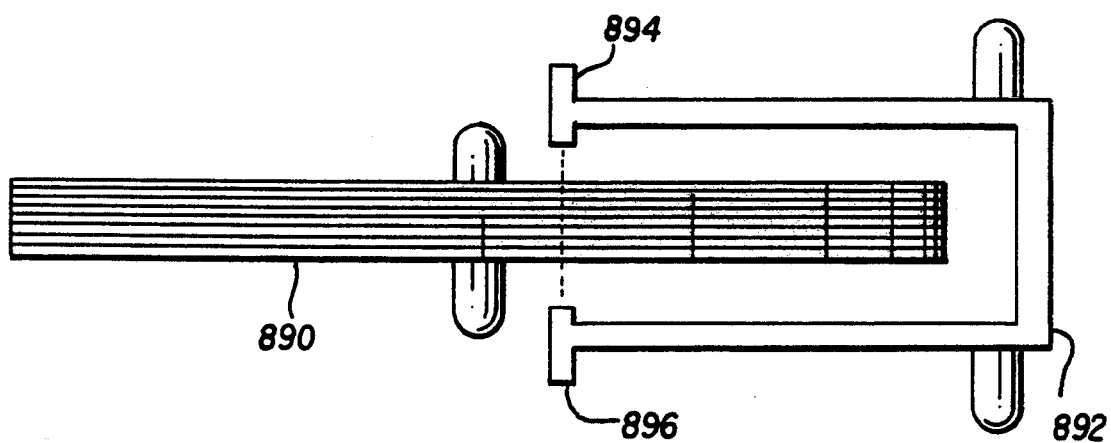
Figure 45:
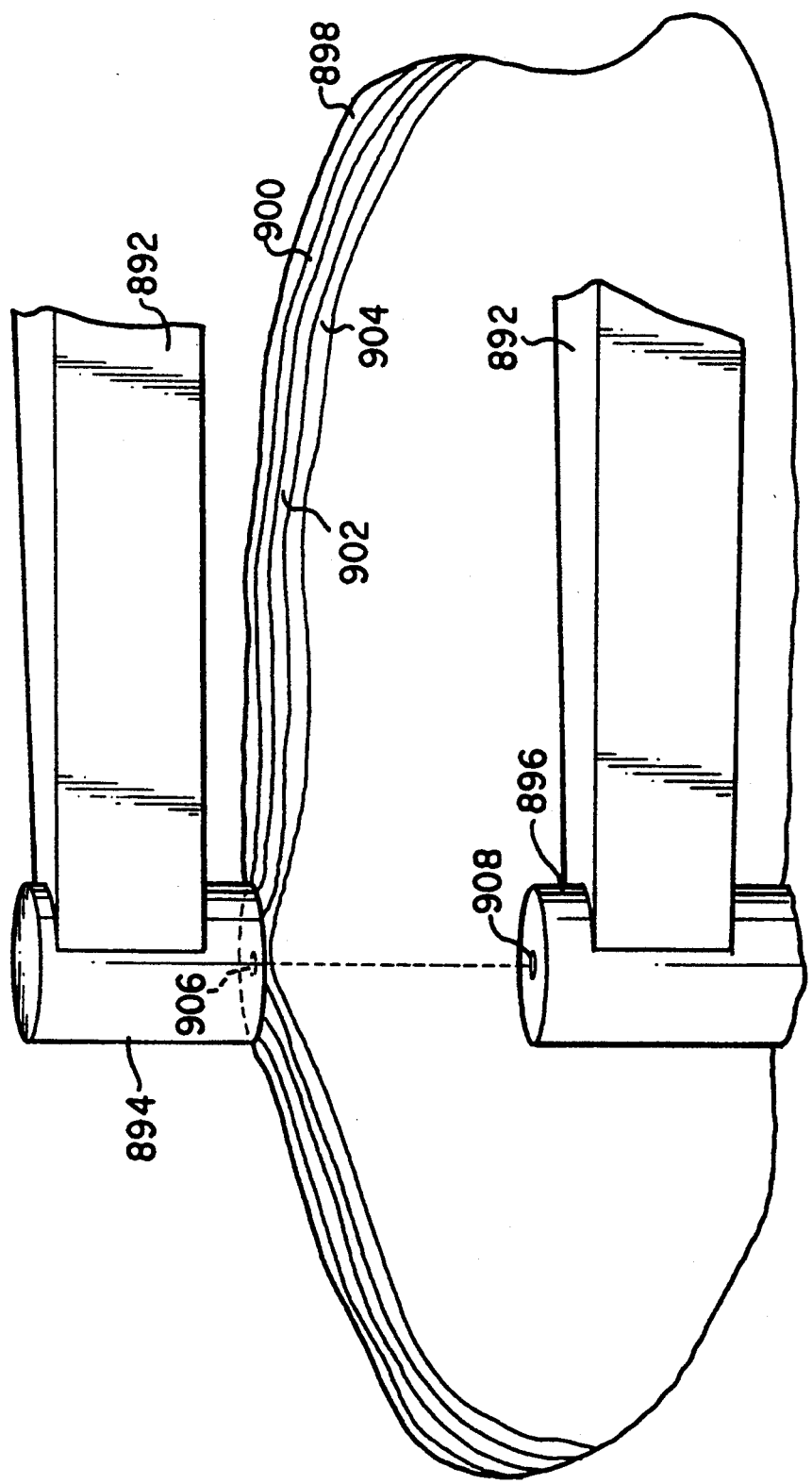
Figure 46:
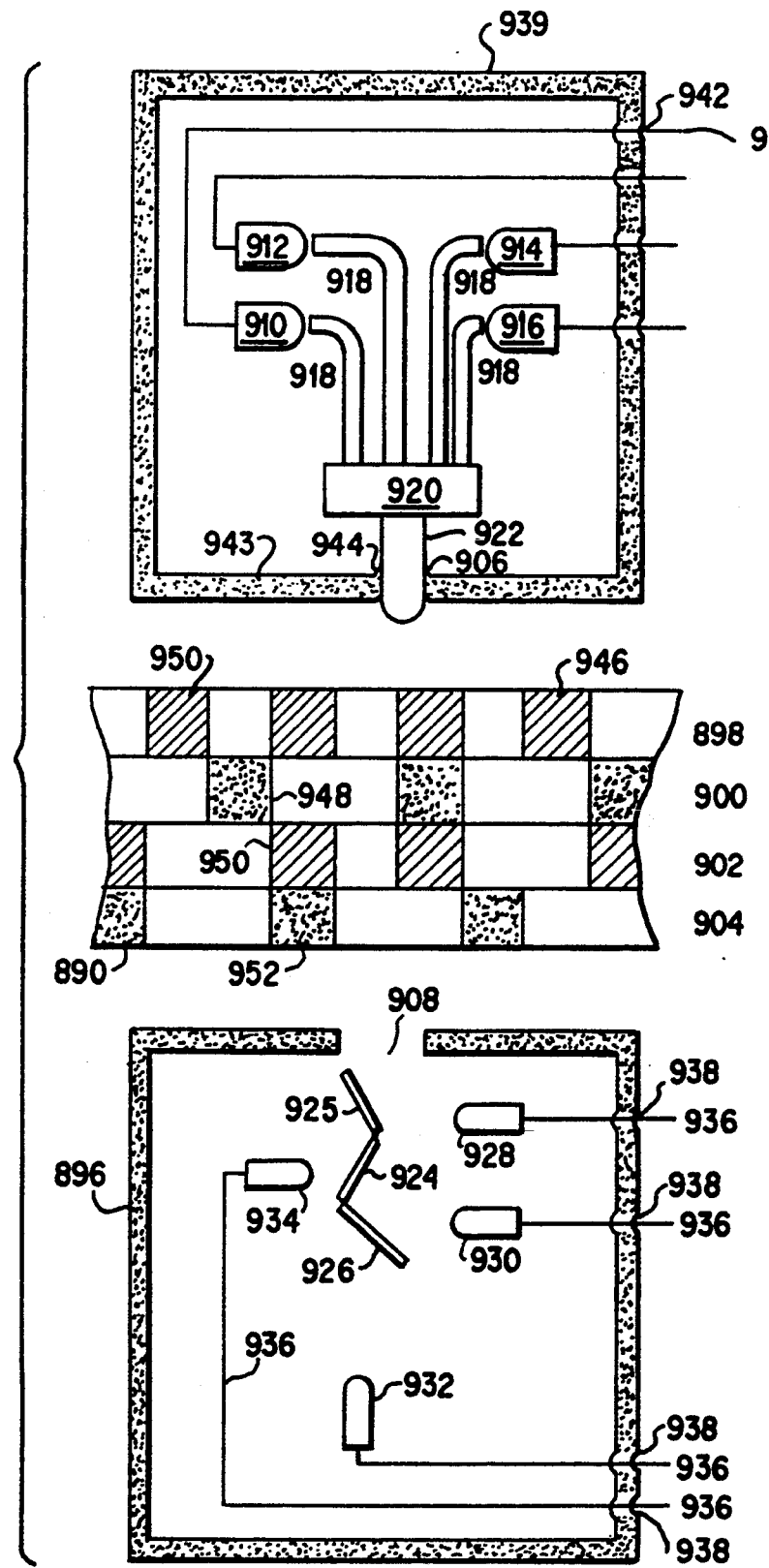
Figure 47:
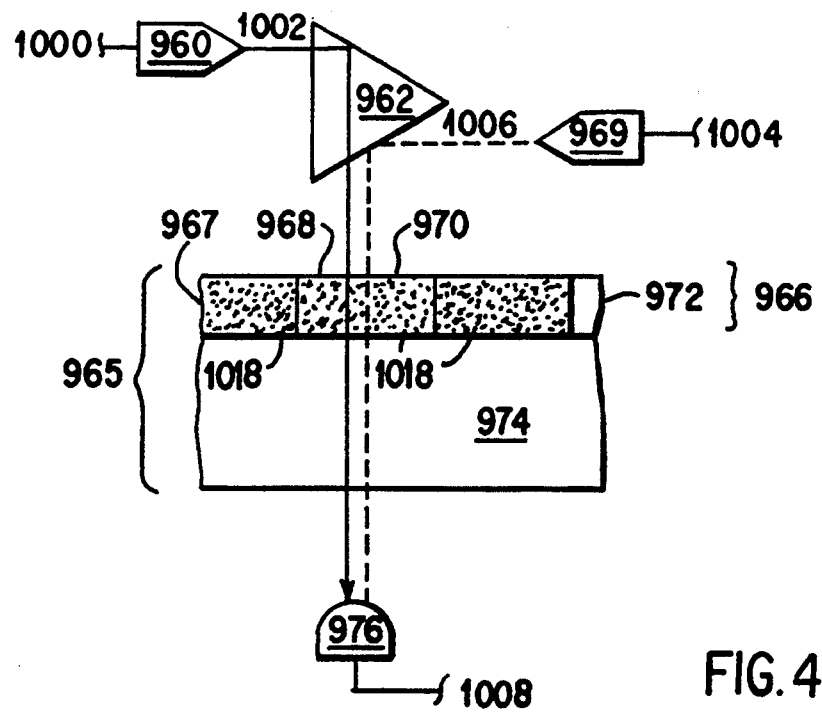
Figure 48:
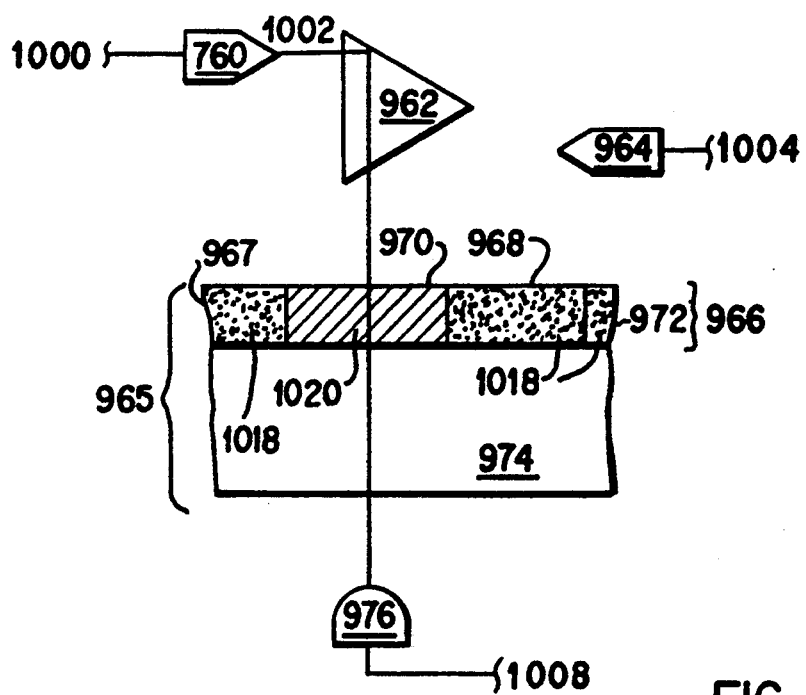
Figure 50:
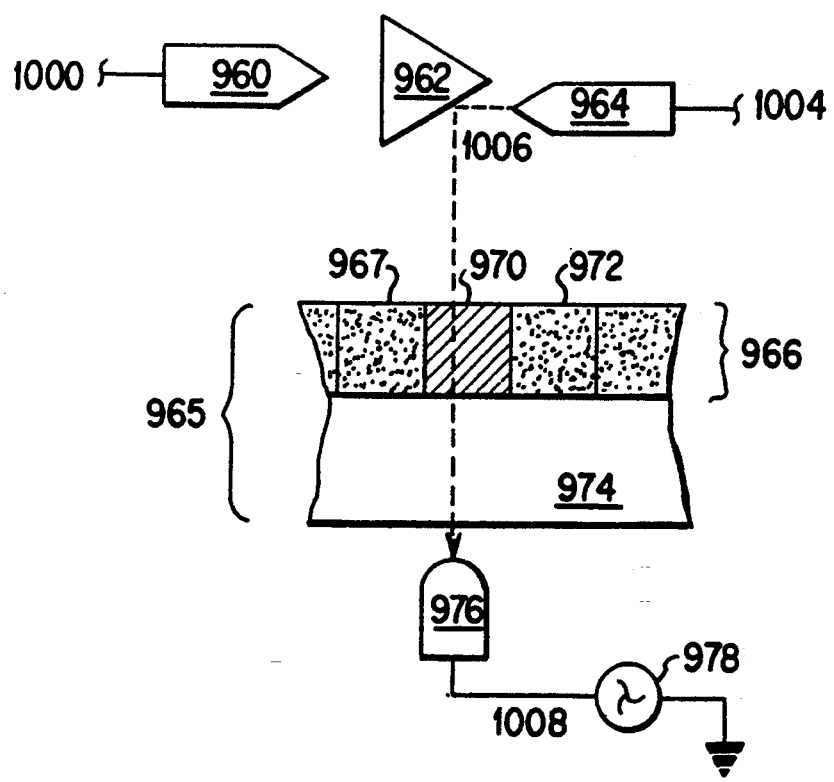
Figure 49:
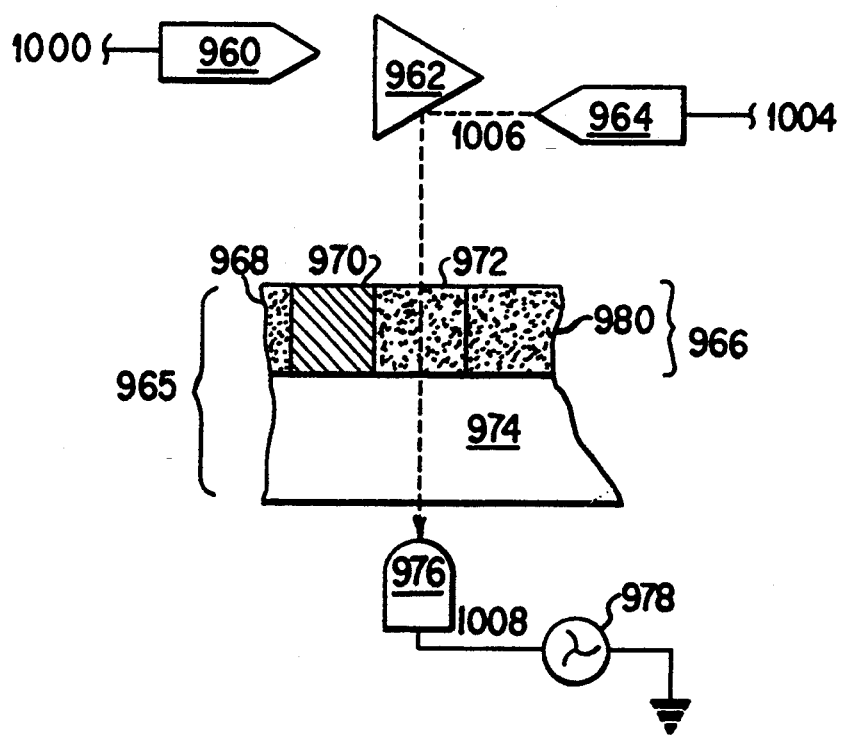
Figure 51:
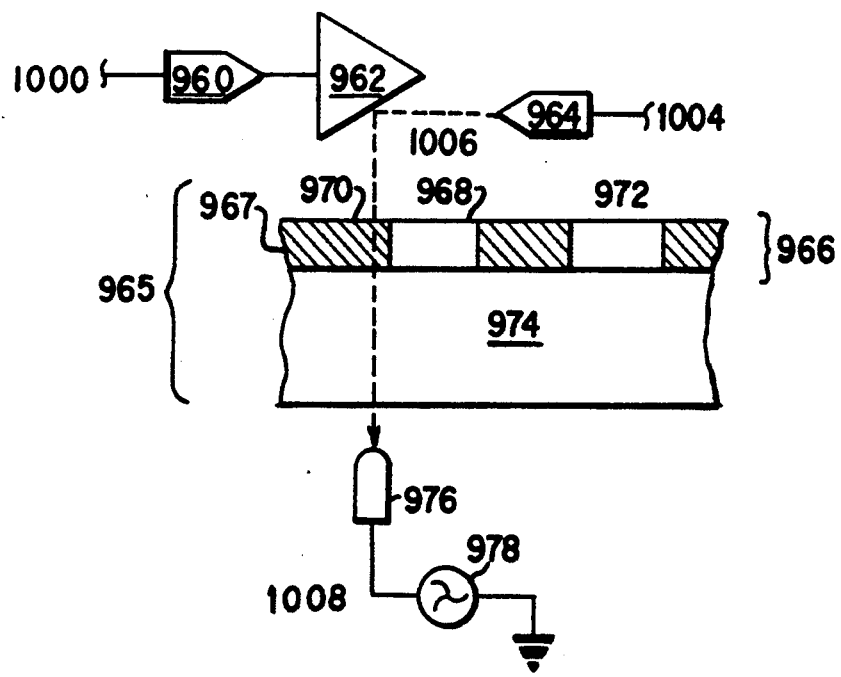
Figure 52:
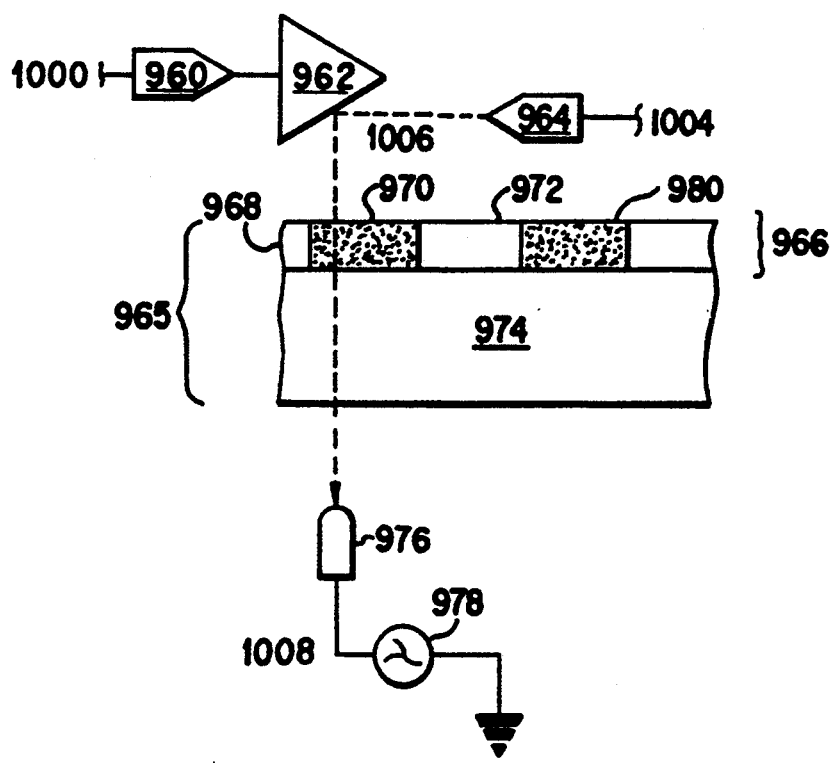
Figure 53:
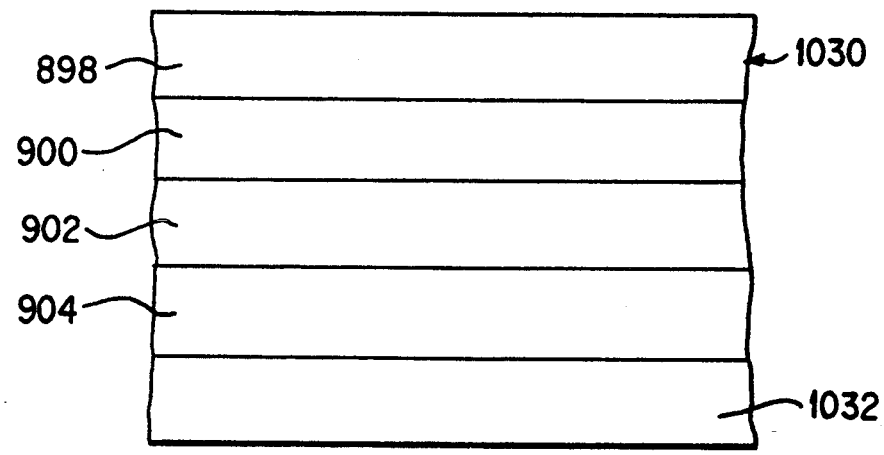
Figure 54:
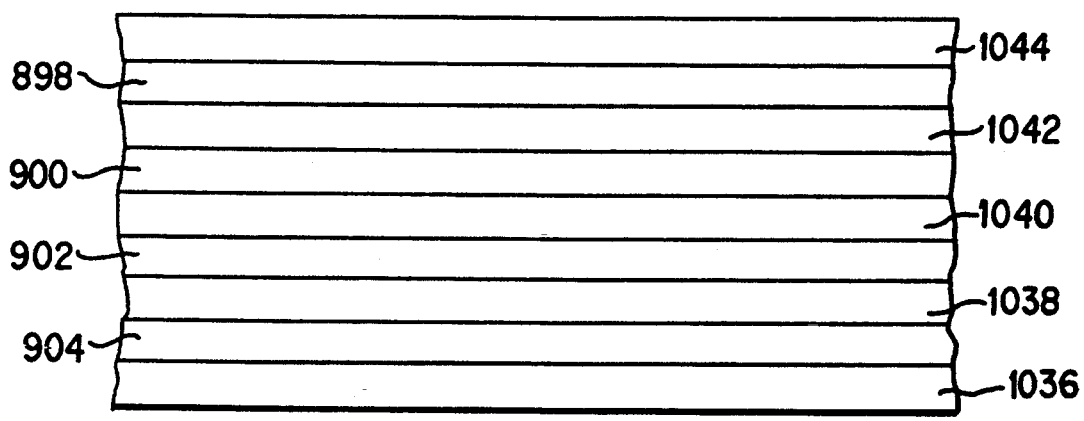
Figure 55:
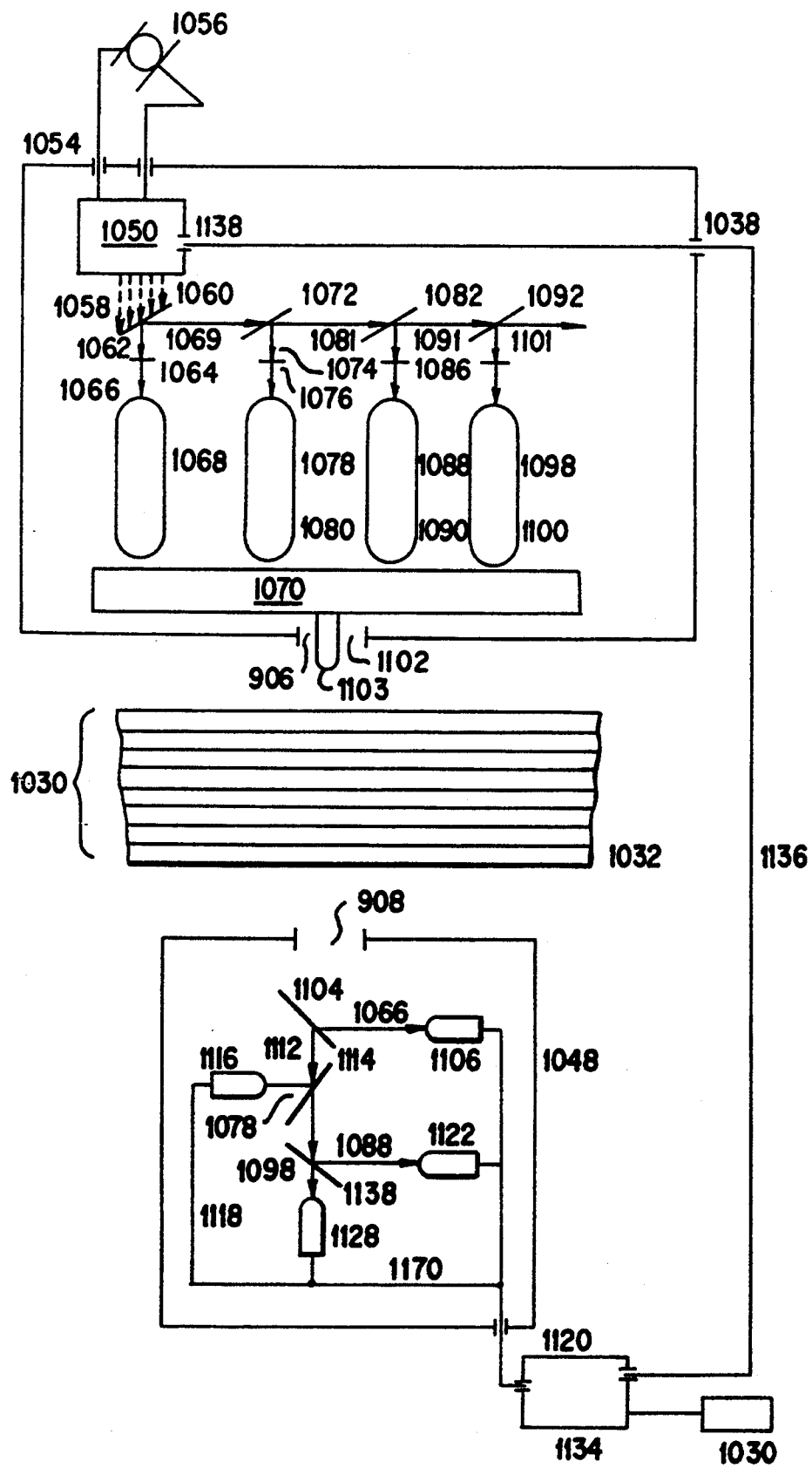
Figure 56:
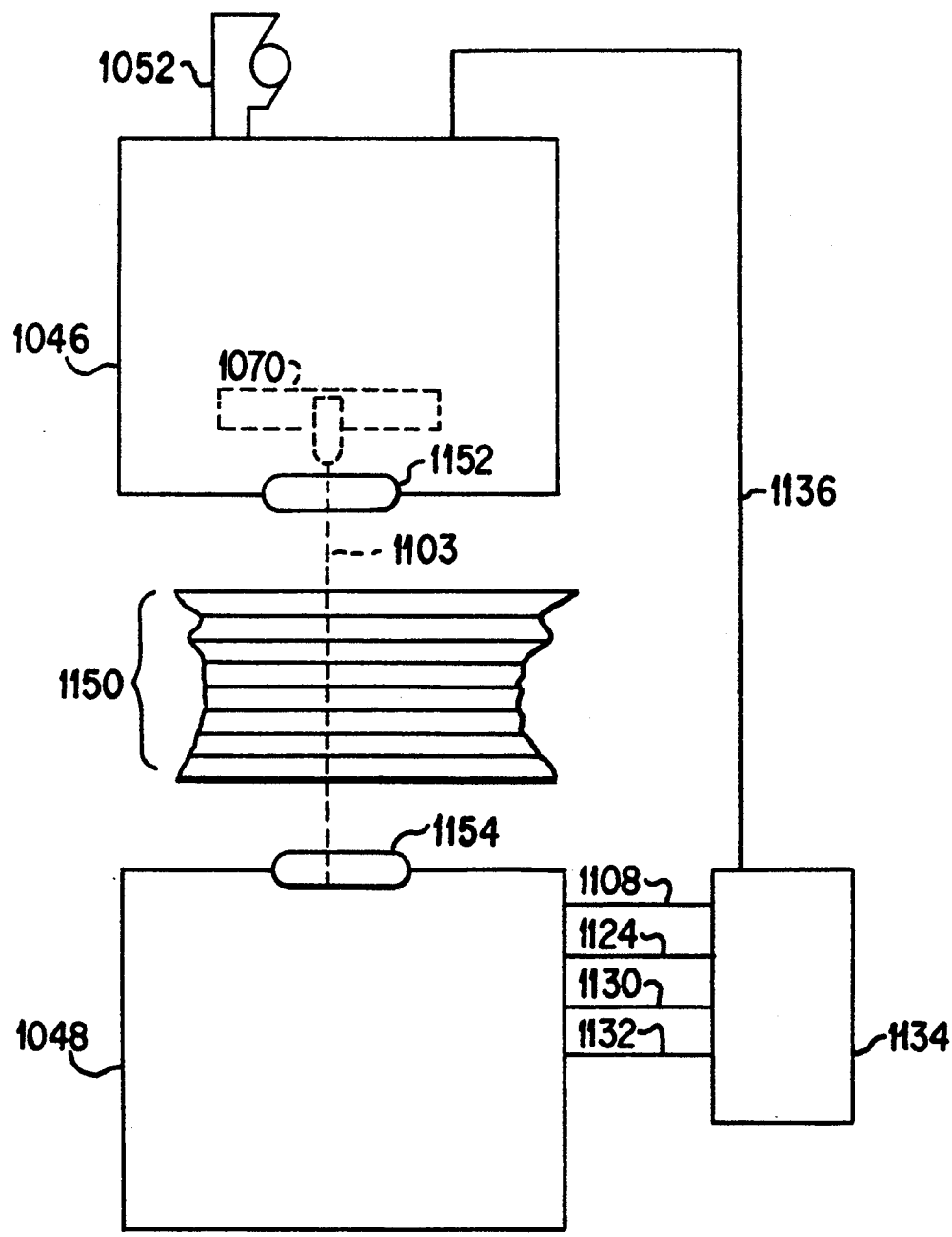
Figure 57:
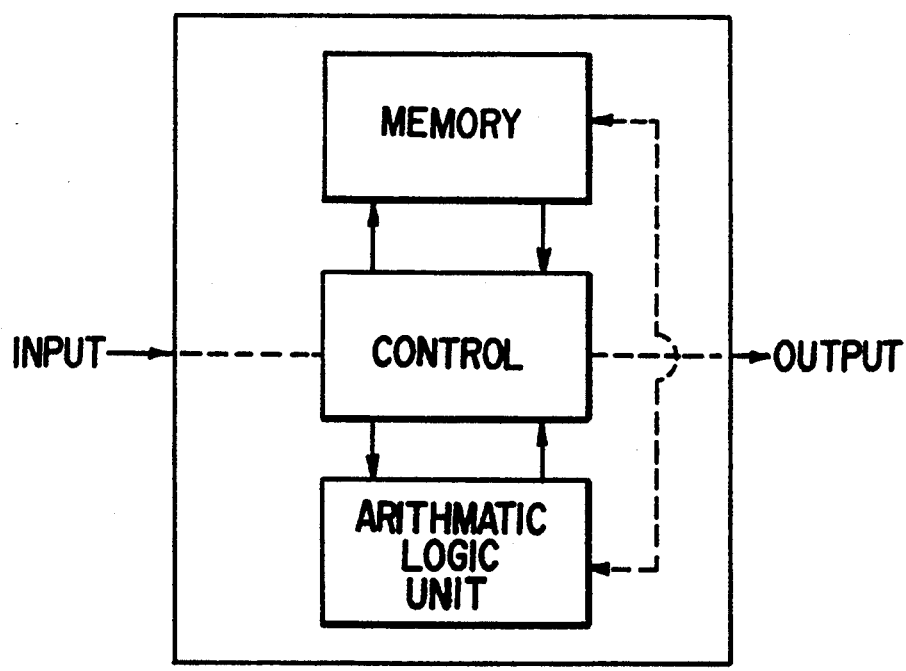

FIG. 28 is a schematic illustration of a scanning means for scanning recorded material and means for activating a photosensitive surface or for etching a material; and, FIG. 29 is a schematic illustration similar to FIGS. 23 and 27 showing a series of dichroic reflectors, variable density filters and a scanning means for scanning the geometric image from a variable density filter and for activating a photosensitive surface or for etching a material to make a printing plate;

FIG. 30 is a schematic illustration of a system for separating light waves into a desired range or desired ranges of light waves and using variable density filters having reflective means or reflective properties, and also using scanning means for scanning the geometric images from the variable density filters and recording means connecting with the scanning means for recording the geometric images from the variable density filter such as by analogue information, digital information and on other forms of information such as on a photosensitive emulsion, paper tape or plastic tape or hollerith cards, or on other surfaces such as metal and the like;

FIG. 31 is similar to FIG. 17 and illustrates means for converting the information, in the form of electromagnetic radiation as light waves, into information which can be with a display wherein FIG. 31A is the schematic illustration of the apparatus for separating light waves and FIG. 31B is a block diagram illustrating the separation of light waves;

FIG. 32 is similar to FIG. 23 for converting the information into a form which can be used with a display wherein FIG. 32A is a schematic illustration of the optical system and FIG. 32B is a block diagram of the optical system;

FIG. 33 is similar to FIG. 27 for converting the information into a form which can be used with a display wherein FIG. 33A is a schematic outline of the optical system and FIG. 33B is a block diagram of the optical system;

FIG. 34 is similar to FIG. 29 for converting the information into a form which can be used with a display wherein FIG. 34A is a schematic diagram of the optical system and FIG. 34B is a block diagram of the optical system;

FIG. 35 is similar to FIG. 30 for converting the information into a form which can be used with a display wherein FIG. 35A is a schematic diagram of the optical system and FIG. 35B is a partial schematic diagram of the optical system and FIG. 35C is a partial schematic diagram of the optical system and FIG. 35D is a block diagram of the optical system;

FIG. 36 is a schematic illustration of a subtractive filtering system for storing chromatic discs and comprising a source of eight monochromatic waves, a storage system, and a sensor system for receiving the monochromatic waves after passing through the storage system;

FIG. 37 is a schematic illustration of a layered color bit for a particular monochromatic wave length, or color;

FIG. 38 is a schematic illustration of an additive filtering system comprising a source of eight monochromatic wave lengths, a storage system and a sensor for the monochromatic wave length;

FIG. 39 is a schematic illustration of the monochromatic wave length curves illustrating the appropriate frequency and the intensity of the light waves;

FIG. 40 is a fragmentary top plan view of one set of components used with this method for reading and writing in the storage system;

FIG. 41 is a side elevational view of one set of components used for reading and writing in the storage system;

FIG. 42 is a fragmentary side elevational view illustrating the layering of various carriers for chemicals or materials in the storage system;

FIG. 43 is a perspective view of the major components of one form of the optical storage system;

FIG. 44 is a side elevational view of the major components as illustrated in FIG. 53 and of one form of the optical storage system;

FIG. 45 is a fragmentary cross-sectional view detailing the various carrier layers in the optical storage system;

FIG. 46 is a schematic illustration of the optical storage system illustrating the source of the monochromatic light waves, the carrier layers, and the sensor for the monochromatic light waves after having passed through the carrier layers;

FIG. 47 is a schematic illustration of the relation of the components and optical storage system capable of one writing operation and unlimited read operations;

FIG. 48 is a fragmentary schematic illustration of the relationship of components;

FIG. 49 shows the relationship of components arranged to measure optical transmission density due to the nature of the storage system;

FIG. 50 is a schematic illustration of two writing heads and also two reading heads in the optical storage system;

FIG. 51 is a fragmentary schematic illustration of a reading head with the monochromatic light waves passing through a chemical in the carrier layer without changing the state of the chemical;

FIG. 52 is a fragmentary schematic illustration of a reading head with a monochromatic light wave passing through a chemical, in a different state than the chemical in FIG. 51, without changing the state of the chemical;

FIG. 53 is a fragmentary side elevational view illustrating a plurality of laminated film for carrying chemicals subject to change by a monochromatic light wave or laminated carrier layers carrying chemicals subject to change by monochromatic light waves and which laminated film or laminated carrier layers are part of the storage system;

FIG. 54 is a fragmentary side elevational view of laminated film carrying a chemical subject to change by a monochromatic light wave interspersed between clear laminated films or laminated carrier layers not having a chemical subject to change by monochromatic light waves;

FIG. 55 is a schematic illustration of the storage system comprising a source of monochromatic light waves, a carrier for carrier layers comprising chemicals subject to change upon being contacted by monochromatic light waves, and a sensor for receiving the monochromatic light waves after passing through the carrier layers in the carrier;

FIG. 56 is a fragmentary illustration of another form of the storage system, similar to the storage system of FIG. 55, but with the use of collimating lens for collimating the monochromatic light waves from the source, to the carrier having the carrier layers with chemicals subject to change by the monochromatic light waves, to a collimating lens for receiving the monochromatic light waves after having passed through the carrier; and, FIG. 57 is a schematic illustration of a computer unit having a control, a memory, an arithmetic logic unit, an imput and on output in which memory comprises the storage system of this invention.

SPECIFIC DESCRIPTION OF THE INVENTION

This invention is directed to the separation of colors into discrete ranges of colors. Then, if desirable, the discrete ranges can be combined to form new colors.

As is well known white light comprises all colors. There are three primary colors, blue, yellow and red. The colors, in the three primary colors, may be blended to form all colors and may be blended to form white light.

As is also well known light is composed of electro-magnetic radiation. The electro-magnetic radiation has a certain speed known as the speed of light or speed of, approximately, $3.00 \times 10^8$ meters per second. The frequency of the electro-magnetic radiation determines the wave length of the electro-magnetic radiation, as expressed in the formula $$f\lambda = c$$

where
f = frequency of electromagnetic radiation
$\lambda$ = wave length of electromagnetic radiation
c = speed of electromagnetic radiation or light; $3.00 \times 10^8$ meters per second With the variation in the frequency of the electro-magnetic radiation there is a variation in the wave length of the electro-magnetic radiation. The various wave lengths of electro-magnetic radiation determine the color of the electro-magnetic radiation in the visible light range. The visible light range is, approximately, 4000 Angstroms to 7000 Angstroms where an Angstrom equals $10^{-8}$ centimeters or 400A to 7000A or 400 nanometers to 700 nanometers or 400 nanometers to 700 nanometers. It is to be understood that the visible light range will vary with an individual. Some individuals may have a visible light range from approximately 3900 Angstroms to 7250 Angstroms while other individuals may have a visible light range much less than a span of 3000A or a bandwidth of 3000A.

In this regard the wave length of blue light is in the range of, approximately, 4000A to 5000A. The wave length of yellow light is in the range of, approximately, 5000A to 6000A. The wave length of red light is in the range of approximately 6000A to 7000A. In the area where blue light and yellow light converge there is no clear distinction, and in the area where yellow light and red light converge there is no clear distinction. In other words, there is an overlapping of colors. A blue light may be in the range of about 3900A to about 5250A and the yellow light may be in the range of about 4750A to about 6250A. Also, a red light may be in the range of about 5750A to about 7250A. This leads to shades of blue or cyan color and to shades of yellow color and to shades of red or magenta color.

In the separating of the colors into discrete ranges or bandwidths we control the electro-magnetic wave lengths and separate the colors by reflective means or filtering means or, when a film means is used, with a film means or by combinations of the above means, where appropriate.

The reflective means has the ability to reflect electro-magnetic waves in a certain wave length range and to transmit electro-magnetic waves in another wave length or in other wave length ranges.

A reflective means may comprise a dichroic filter or a so called "interference filter". A dichroic filter comprises alternating high refractive index layers and low refractive index layers. For example, there may be a high refractive index layer, a low refractive index layer and then a high refractive layer. Or, for greater reflectivity there may be three high refractive index layers and two low refractive index layers or, four low refractive index layers. It has been found that by forming each of the high refractive index layers and each of the low refractive index layers with an optical thickness of one-quarter wave length to the maximum wave length to be reflected at the center of the principal reflectance band, viz., for blue at, approximately 4500A and for yellow at about 5500A and for red about 6500A, optimum results are obtained. For quarter-wave low refractive index layers, the thickness can be determined by the following relationship:

$$t_L = \lambda_0 / 4 \, n_L$$

where $t_L$ represents the thickness of the low index of refraction layers, $\lambda_0$ represents the wave length to be reflected at the center of the principal reflectance band, and $n_L$ represents the refractive index of the low refractive index layers. Similarly, for quarter-wave high refractive index layers, the thickness can be determined by the following relationship:

$$t_h = \lambda_0 / 4 \, n_h$$

where $t_h$ represents the thickness of the high refractive index layers and $n_h$ represents the index of refraction of the high refractive index layer.

The dichroic reflector or "interference filter" comprises the alternating layers of high refractive material and the low refractive material. In FIG. 1 there is illustrated a part of a reflective means 50 comprising a substrate 52, a high refractive material 54, a low refractive material 56 and a high refractive material 56. It is seen that the low refractive material 56 is positioned between the high refractive material 54 and the high refractive material 54 or, to state it differently, there is a layer of a high refractive material 54, a layer of low refractive material 56, and a layer of a high refractive material 54.

In FIG. 2 there is illustrated a reflective means or reflector 60. The reflector 60 comprises a layer 54 of high refractive material, a layer 56 of low refractive material, a layer 54 of high refractive material, a layer 56 of low refractive material and a layer 54 of high refractive material. In FIG. 1 it is seen that there are three layers of refractive material and that in FIG. 2 there are five layers of refractive material. The more layers of refractive material, generally, the greater the selective reflective power of the reflector.

In FIG. 3 there is illustrated a five layer reflector, similar to the five layers of FIG. 2, and on a substrate. FIG. 3 the reflector 62 comprises the high refractive index layers 54, three in all, and the low refractive index layers 56, two in number, positioned on a substrate 64.

In FIG. 4 there is illustrated a reflector 70 comprising outer protective shield 72 and three layers of high refractive material 54 and two interspersed layers of low refractive material 56. It is seen that between the shield 72 and the high refractive layers 54 that there is a void or a gas space 74. Also, there is a holding means or a frame 76 for positioning the shield 72 with respect to the high refractive layers and the low refractive layers. The void 74 or gas spaces 74 function as an insulator to lessen the changes in the reflective means 70 with changes of ambient temperature.

In FIG. 5 there is illustrated reflective means 80 comprising outside shield 72 and three layers of high refractive material 54 and two interspersed layers of the low refractive material 56, The reflector 80 is of a sandwich construction. The shield 72 may be considered substrate for the high and low refractive layers 54 and 56. The reflective means 80 is a laminate structure wherein the shield 72 and the high and low refractive layers 54 and 56 are laminated into one unit.

The high refractive index layers should have a thickness of approximately one-fourth the length of the mid range of the electro-magnetic waves to be reflected and the low refractive index layers 56 should have a thickness of one-eighth of the wave length of the mid range of the electro-magnetic radiation to be reflected. For cyan or blue light the mid range is, approximately, 4500A. Therefore, the thickness of the high refractive index layer 54 should be about one-fourth of 4500A or about 1125A or a thickness of abut $1.125 \times 10^{-5}$ centimeters, and the thickness of the low refractive layer should be about one-eighth of 4500A or approximately, 560A to 565A in thickness or about 0.56 to $0.565 \times 10^{-5}$ centimeters. Likewise, for yellow light having a mid range of about 5500A the thickness of the high refractive layer 54 should be about one-fourth of 5500A approximately, 1375A or $1.375 \times 10^{-5}$ centimeters, and the thickness of the low refractive layer 56 should be about one-eighth of 5500A or about 685A to 690A or 0.685 to $0.690 \times 10^{-5}$ centimeters. Similarly, for red light having a mid range of about 6500A the thickness of the high refractive layer 54 should be one-fourth of 6500A or 1625A or $1.625 \times 10^{-5}$ centimeters and the thickness of the low refractive layer 56 should be one-eighth of 6500A or 810A to 815A or 0.81 to $0.815 \times 10^{-5}$ centimeters.

In FIG. 6 there is illustrated the per cent reflection of light from a reflector in terms of the wave length of a light. As previously stated, for blue light in the range of about 4000A to 5000A and with a mid range of 4500A the reflective power of the reflectors 60, 62, 70 and 80 is, approximately, 95 to 98 per cent. It is also seen that about 95 to 98 per cent of the wave lengths in the range of 4500A will be reflected and substantially all of the wave lengths of light for yellow and red will be transmitted.

Likewise, for yellow light having a mid range of 5500A, it is seen that there is, approximately, 95 to 98 per cent reflection of light waves of 5500A in length and transmission of the majority of the blue light waves in the 4000A to 5000A range and the red light waves in the 6000A to 7000A range. Also, for red light having a mid range of 6500A there is approximately 95 to 98 per cent reflectivity and substantial transmission of all the blue and yellow light waves. In fact, for red having a mid range of 6500A, there is transmission of all the blue light waves and substantial transmission of all the yellow light waves. FIG. 6 further shows that as the wave length of the light waves deviates from the mid range that there is a decrease in the reflectivity of the light waves. For example, for blue light with a mid range of 4500A it is seen that at about 3900A there is only a small percentage of reflectivity and likewise for 5200A wave length light waves there is only a small percentage of reflectivity of the light. This is also true for yellow light having a mid range of 5500A and where light of 4900A or 5000A the degree of reflectivity is considerably less than 100 per cent and also for light waves of 6000A or 6200A the degree of reflectivity is quite low. The same can be said for red light having a mid range of 6500A wherein for light having a wave length of 5900A or 6000A the degree of reflectivity is, relatively, low and likewise, for light waves of 7000 to 7200A the degree of reflectivity is relatively low. As the light waves deviate in length from the mid range the degree of reflectivity decreases.

In FIGS. 1 through 6 it is seen that there is presented dichroic reflector or "interference filter" which is useful in selecting discrete ranges of light. This is diagrammatically illustrated in FIG. 6. Of importance is the fact that with the use of a dichroic filter there is the conservation of light or the conservation of light energy in that light is not absorbed but is separated by reflection and transmission. As will be more clearly brought forth in a latter part of this discussion it will be seen that by conserving the light that the light can be reflected and transmitted into discrete ranges as desired. In FIG. 6 it is seen that the discrete ranges are in the blue, yellow and red ranges wherein the mid range is the desired range. If it is desirable for blue light there may be a compromise to two mid ranges of 4300A and 4700A wherein there are two reflective means, also, for yellow light there may be two mid ranges of 5300A and 5700A and, likewise, for red light there may be two mid ranges of 6300A and 6700A, certain instances it may be desirable to have this greater selectivity of discrete ranges.

In regard to dichroic reflectors or "interference filters", above described, reference is made to two interesting patents which teach of such a reflector and such a filter. There two patents are Dimmick, U.S. Pat. No. 2,379,790, issuing date Jul. 3, 1945 and Edwards, U.S. Pat. No. 3,630,809, date of Dec. 28, 1971. Dimmick teaches of a high refractive index layer having a thickness equal to one-half of the desired wave length and a low refractive index layer having a thickness equal to one-quarter of the desired wave length of the light reflected. Edwards teaches of a high refractive index layer having a thickness equal to one-quarter of the desired wave length and a low refractive index layer having a thickness equal to one-eighth of the desired wave length of the light to be reflected. Dimmick and Edwards both teach of alternating layers of a high refractive index layer and a low refractive index layer to achieve selective reflectance of the desired wave length and transmission of other wave lengths.

The substrates 52, 64 and 72 are, preferably, of a high refractive index material having a refractive index in the range of about 1.55 to 1.65. A suitable substrate may be of a family of commercially manufactured inorganic lanthanum borate glosses having refractive indices of about or above 1.6. There are other substrates having a refractive indices of about 1.55. Such a substrate is, preferable, because of the high refractive index. The high refractive index layer 54 can be formed of various material such as composite mixtures consisting of zinc sulfite, zinc oxide, lead molybdate, lead tungstate and the like. The low refractive index layers 56 can be formed from composite mixtures consisting of calcium fluoride, aluminum fluoride, cryolite, magnesium fluoride, lithium fluoride or the mineral Gearksutite which is a naturally occurring calcium aluminum oxy flouride. As previously stated, it is desirable to have a substrate with an index of refraction in the range of 1.55 to 1.65 it is to be understood that a substrate with a lower index of refraction can be used. However, a substrate with a high index of refraction is preferable to a substrate with a low index of refraction. It is possible to use a boral-silicate glass having an index of refraction of 1.47 or to use a fused silica clear glass having a refractive index of 1.459 as a substrate. Further, additional substrates can be a fused quartz substrate having an index of refraction in the range of about 1.47; a silicate crown glass having an index refraction in the range of about 1.51 to 1.52; a substrate of quartz having an index refraction of about 1.55; a substrate of borate flint glass having an index refraction in the range of about 1.58 to 1.59; and a silicate flint glass as a substrate having an index refraction in the range of about 1.61 to 1.66.

In the preceding section I have described a dichroic reflector or an "interference filter" wherein there is, substantially, no loss of light energy or electromagnetic radiation energy. With a dichroic reflector, substantially, all of the incident light is reflected from the reflector or transmitted through the reflector. Naturally, there is a small amount of loss of light energy but for all practical purposes the light energy is reflected by the dichroic reflector or transmitted through the dichroic reflector. From a selective dichroic reflector, the readers attention is directed to FIG. 6, and, for example, for a blue light in the range of about 3900A to about 5250A it is seen that the reflected light spans this range so that some of the ultra-violet light rays are in the blue range as well as some of the yellow light rays. The dichroic reflector, as illustrated in FIG. 6, does not have a complete one-hundred percent reflectance of the desired wave length light waves but does have some adulteration. These comments are also applicable for yellow light in the range of about 4750A to about 6250A wherein the shorter wave length the yellow overlaps into the blue range and on the longer wave length the yellow overlaps into the red range. Similarly, for red light in the range of about 5750A to about 7250A the red light on the shorter wave lengths overlaps into the yellow range and on the longer wave lengths overlaps into the infra-red range.

Because of this characteristic of the dichroic reflector of not reflecting, completely, the desired wave length light wave, we can use an absorption filter to remove the undesirable overlapping wave length light waves. With the aid of an absorption filter, we are able to achieve a more pure color. The absorption filter we use comprises a carrier for an absorbant material and said carrier is also a carrier for a photochromic material. A photochromic or phototropic material is one which has the ability to alter optical density when irradiated with light in a particular wave length region and whose optical density decreases when the exciting radiation is removed. More particularly, substances or materials which change their transmission or reflectance upon being subjected to ultraviolet or visible irradiation or infra-red irradiation and, subsequently revert to their original state upon subjection thereof to a different wave length or irradiation, or removal of the initial untra-violet source. The materal may comprise a glass or a plastic such as a polyester resin. The photochromic materials are mixtures of inorganic metal oxide such as $TiO_2$ doped with $Fe_2O_3$, FeO $Cr_2O_3$, CuO, NiO, or $Mn_2O_3$; $Nb_2O_5$ doped with $Fe_2O_3$, FeO, $Cr_2O_3$, CuO, $V_2O_5$, $MnO_2$ or $Mn_2O_3$; $Al_2O_3$ doped with $Cr_2O_3$ or $V_2O_5$; ZnO doped with CuO or $V_2O_5$; $SnO_2$ doped with CuO; or $ZrO_2$ doped with CuO or Nio. Or, there may be a glass such as lanthanum borate glass having a high refractive index doped in weight percent on the oxide basis as calculated from the batch, selected from the group consisting of 0–40% $Ta_2O_5$, 0–40% $Nb_2O_5$, 0–45% $ThO_2$, 0–30% $Al_2O_3$, 0–15% $TiO_2$, 0–15% $ZrO_2$, and 0–30% RO wherein RO consists of one or more of the bivalent metal oxides from the group consisting of ZnO, CdO, CaO, SnO, BaO, MgO and PbO. The silver halides such as silver chloride and/or silver bromide and/or silver iodide will exhibit some photochromic behaviour with lanthanum borate glasses and the various mixtures above described. The silver halides are some microscopic crystals dispersed in a glass matrix. These submicroscopic crystals of silver halide increase in optical density when exposed to ultra-violet radiation and return to their original state when the ultra-violet radiation is removed.

I incorporate, by reference, where appropriate, the teachings of U.S. Pat. No. 3,208,860, No. 3,317,321, issuing date of May 2, 1967; No. 3,278,319, issuing date of Oct. 11, 1966; No. 3,255,026, issuing date of Jun. 7, 1966; and No. 3,703,388, issuing date of Nov. 21, 1972; in regard to photochromic or phototropic properties of various materials using a glass or a plastic as the carrier for the phototropic or photochromic material.

In FIGS. 7 through 13 there is illustrated a number of variable density filters comprising a light absorbent material or dyestuff and also a photochromic material or a phototropic material. Further, in some of these variable density filters there is included a reflector. In other words, the variable density filter has the ability to, simultaneously, selectively reflect waves of a first wave length, to, selectively, transmit waves of a second wave length, and to absorb waves of the first wave length. By way of example, the variable density filter comprising a dichroic reflector, a light absorbent material or dyestuff, and a photochromic material or phototropic material, has the ability to transmit yellow and also has the ability to reflect red and blue and to absorb red and blue. Similarly, this example can be used for transmitting blue and reflecting and absorbing yellow and red or for transmitting red and reflecting and absorbing blue and yellow.

In FIG. 7 there is illustrated a variable density filter 90 comprising a carrier for light absorbent material or dyestuff and also a carrier for photochromic material or phototropic material. As previously stated, the carrier may be a high refractive index glass or may be a plastic such as a polyester resin. The appropriate doping materials have been stated and also have been referred to in the cited patents, and are incorporated by reference where appropriate. The variable density filter 90 upon being irradiated with ultra-violet light or visible light or other electromagnetic waves will increase in optical density so as to increase the light absorption ability of the incorporated dyestuff.

In FIG. 8 there is illustrated a combination of a variable density filter having dichroic reflective ability, photochromic or phototropic properties and a light absorbent material or dyestuff. In FIG. 8 this variable density filter is referred to by reference numeral 92 and comprises the high refractive index layers 94 and the low refractive index layers 96. Again, in FIG. 8 the high refractive index layers 94 may have a thickness equal to one-half the desired wave length or one-quarter the desired wave length and the low refractive index layers may have a thickness of one-quarter the desired wave length or one-eighth the desired wave length, as previously explained with reference to the patents to Dimmick and Edwards. Also, the dyestuffs and the photochromic materials may be evenly dispersed in the high refractive index layers 94 and in the low refractive index layers 96; or, may be dispersed, only, in the high refractive index layers 94, or, only, in the low index refractive layers 96; or, the high refractive index layers 94 may comprise a different concentration of dyestuffs and photochromic materials than the low refractive index layers 96; or, the dyestuffs may be in the high refractive index layers 94 and the photochromic materials in the low refractive index layers 96 or, vice versa. It is to be realized that the distribution of the dyestuffs and the photochromic materials in the layers 94 and 96 may be in many combinations. In other words, the concentration of the dyestuffs and the photochromic materials in the layers 94 and 96 may be variable to correspond to the selective wave lengths to be reflected and absorbed and also to the selective wave lengths to be transmitted.

In FIG. 9 there is illustrated a variable density filter 100 comprising two variable density filters 90, see FIG. 7, and electro-conductive inner layer 102 connecting to an electrode 104. The electro-conducting layer 102 may be one of many materials such as a composition of matter comprising polyethylene glycol, lead acetate, polyvinylbutyrial and hydroquinone. The inner layer 102 should be transparent to allow light to pass through it and also should be electrically conductive so that with the application of electricity there is resistance to the passage of electricity which heats the inner layer and also heats the two variable density fliters 90. Further, the inner layer 102 should have no absorption factor to light waves in the visible light spectrum. Again, the variable density filters 90 comprise light absorption material or dyestuffs and also photochromic material or phototropic material as previously explained with respect to the explanation of FIG. 7. Also, the variable density filters 90 may comprise different concentrations of the light absorption material and the photochromic materials different absorption properties. In fact, one of the variable density filters 90 may contain a light absorption material and the variable density filter 90 may contain a photochromic material.

In FIG. 10 there is illustrated a sandwich or a layer construction variable density filter 110 comprising the variable density filters 90 on the outside, see the explanation for FIG. 7, and the high refractive index layers 94 interspersed by the low refractive index layers 96, as, previously explained, with respect to FIG. 8.

In FIG. 11 there is illustrated a variable density filter 114 comprising the features of FIGS. 9 and 10 wherein there is the variable density filters 90 on the outside, the high refractive index layers 94 and the low refractive index layers 96. Between the variable density filters 90 and the outer high refractive index layers 94 there is an interlayer 102, see the explanation for filter 100 of FIG. 9, and an electrode 116. The interlayer 102 can be heated to vary the photochromic properties of the variable density filters 90 or the photochromic properties of the appropriate layers 94 and 96. Although, the placing of the dyestuffs and the photochromic materials has been previously explained with respect to FIGS. 8 and 9 by way of repetition it will be stated that the dyestuffs may be in the variable density filters 90 while the photochromic materials may be in the layers 94 or in the layers 96 or in the layers 94 and 96 or, conversely, the photochromic materials may be in the variable density filters 90 while the dyestuffs may be in the layers 94 or the layers 96 or the layers 94 and 96 or, again, the dyestuffs and the photochromic materials may be in the variable density filters 90 and the layers 94 and 96.

In FIG. 12 there is illustrated a variable density filter 120 similar to the filter 110 but comprising busbars 122 and 124 on each side of the sandwich construction so as to utilize the dyestuffs and the photochromic materials for conducting electricity in the appropriate materials such as the variable density filter 90 and the high refractive index layers 94 and the low refractive index layers 96. In other words, by conducting electricity through the materials of the variable density filter it is possible to vary the photochromic or phototropic properties of the variable density filter.

In FIG. 13 there is illustrated a variable density filter 126 comprising the variable density filter 90 and a first high refractive index layer 94, a first low refractive index layer 96 and a second high refractive index layer 94. The high refractive index layer 94 may have a thickness equal to one-half of the desired wave length and the low refractive index layer may have a thickness equal to one-fourth of the desired wave length or the high refractive index layer 94 may have a thickness equal to one-fourth of the desired wave length and the low refractive index layer 96 may have a thickness equal to one-eighth of the desired wave length. From the preceding description of the variable density fliter it is seen that certain of the variable density fliters there is a carrier for light absorption material or dyestuffs and also for the photochromic materials or phototropic materials. This is particularly true with respect to the variable density filter 90 in FIG. 7, the variable density filter 100 of FIG. 9, the variable density filter 110 of FIG. 10, the variable density filter 114 of FIG. 11, the variable density filter 120 of FIG. 14 and the variable density filter 126 of FIG. 13. The carrier, as previously explained at the start of the description of the variable density filter, may be a glass such as a high refractive index glass like lanthanum borate glass or maybe a plastic such as polyester resin. The carrier is doped with appropriate materials for light absorption such as cupric sulfate for blue, cobalt chloride for red property and ferric chloride of green-yellow property. The photochromic material or the phototropic material may be a silver halide, submicroscopic crystals in the carrier or in the matrix and such crystals may be silver chloride or silver bromide or silver iodide, for example. Further, as previously explained with reference to U.S. Pat. No. 3,317,321 the titanium dioxide doped with ferric oxide or nubidium pentaoxide doped with ferric oxide or aluminum oxide doped with chromic oxide or zinc oxide doped with cupric oxide, to name a few. Also, the variable density filter may have reflective capabilities such as the variable density filter 92 of FIG. 8, the variable density filter 110 of FIG. 10, the variable density filter 114 of FIG. 11, the variable density filter 120 of FIG. 12, and the variable density filter 126 of FIG. 13. With the reflective properties, as previously stated, the variable density filter has the ability to, selectively, reflect and absorb light waves of a first wave length and to, selective, transmit light waves of the second wave length.

In regard to color absorption and standards for color absorption reference is made to the U.S. Department of Commerce, National Bureau of Standards, NBS Monograph 104, entitled "Colorimetry issued January 1968, page 25 wherein it is stated:

"The Arny solutions consist of groups of solutions whose concentrations are adjusted to produce the color match. The required concentrations are the specifications of the color. The most used group is a triad consisting of half-normal aqueous solutions of cobalt chloride (red), ferric chloride (yellow), and copper sulfate (blue) in 1 percent hydrochloric acid. This group produces all colors except deep blue and deep red; it is supplemented by a triad of ammonia ted aqueous solutions of potassium permanganate and potassium dichromate . . . . Mellon and Martin . . . . . have reported the spectral transmittances for a number of solutions for colorimetric standards, including the Arny solutions at three or four concentrations, each for the spectral range 440 to 700 nm . . . . "

From this National Bureau of Standards publication it is seen that the absorption filter may comprise cobalt chloride for red, ferric chloride for yellow, copper sulfate for blue, and where it is desirable potassium permanganate for deep blue and potassium dichromate for deep red.

In FIG. 14 there is illustrated the wave length curves and the selective wave length band for blue, yellow and red. In FIG. 14 it is seen that substantially all of the blue color is in the 4000A to 5000A range, substantially, all of the yellow color is in the 5000A to 6000A range; and, substantially, all of the red color is the 6000A to the 7000A range. The wave lengths in the FIG. 14 are a result of the variable density filter wherein the desired selective wave lengths are transmitted through the falter and the other wave lengths are absorbed by the falter and/or reflected by the filter, depending upon the appropriate filter. In FIG. 6 the curves for the blue, yellow and red colors are produced by a reflector and which reflector, by way of recall, reflects substantially all of a certain bend of wave lengths and transmits other wave lengths. A comparison of FIGS. 6 and 14, graphically, illustrates the selective features of the variable density filter. Another way of expressing this is that by a comparison of FIGS. 6 and 14 it is seen that in FIG. 14 the variable density filter has the ability to have a more selective band width for the wave lengths. In other words, there can be a more shard differentiation between a red and a yellow and between a yellow and a blue. With the variable density filter and the photochromic property or the phototropic property of the variable density filter and also because of the ability to vary the optical density of the variable density filter it is possible to absorb those wave lengths of light waves which are outside of that, relatively, narrow band width. The variable density filter transmits those wave lengths in that, relatively, selective narrow band width. The variable density filter with its photochromic or phototropic properties, upon excitation, increases in optical density to increase the absorption power of the dyestuffs in the variable density filter. As, previously, stated in the forepart of this description it was brought forth that an object of this invention was to achieve a purity of color. In other words, an object of this invention is to achieve a selective band width of color such as is illustrated by the graphs or curves of FIG. 14 wherein the blue color is for practical purposes, separated from the yellow color and also from the red color: the yellow color, for practical purposes, is separated from the blue color and the red color; and, likewise, for practical purposes, the red color is separated from the blue color and the yellow color. In other words the variable density filter or falters as described make it possible to, substantially, realize a purity of color which is desirable in color separation processes.

With the variable density filter it is possible to narrow the selective band width or to broaden the selective band width. With a variation in the optical density of the variable density filter it is possible to broaden and, also, to narrow the selected band width of the various colors. By way of example, it is possible when appropriate, by judicious use of the optical density of appropriate variable density filters to narrow the band width for the blue color range while broadening the band width for the yellow color range and maintaining the band width, as desired for the red color range. Such an example can be expanded to state that it is possible to narrow the band width of the yellow color range and to broaden the band width of the blue color range and for the red color range or, to narrow the band width for the blue color range and the red color range. Also, it is possible , with the control of the optical density, to broaden the band width of the red color range and narrow the band width of the yellow color range or to narrow the band width of the red color range and to broaden the band width of the yellow color range while maintaining the blue color range as desired. From these examples it is seen that by Judicious use of the optical density of the variable density filter the band width range of the selected wave lengths, or colors, can be controlled to be narrow or wide or normal in various combinations for red, yellow and blue. It is to be understood that by narrowing all of the color ranges for the red, yellow and blue that the respective colors would be, necessarily, restricted while if the other extreme is approached wherein the band width ranges for the blue, yellow and red are broad then there results impure colors and a mixture of the various colors. To repeat, one of the primary objects of this invention is to realize a selective band width range with only a minimum of mixing of the colors and yet which band width range is sufficiently broad to include all of the necessary wave lengths in its range for the blue color, for the yellow color and for the red color.

Figure 15:
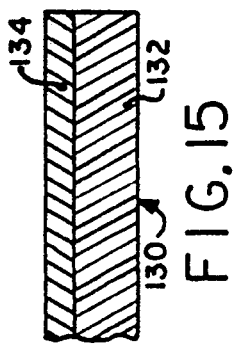
FIG. 15 is a fragmentary cross-sectional view of an integral substrate and a photosensitive emulsion.

In FIG. 15 there is illustrated a film 130 comprising a substrate 132 and an emulsion 134. The emulsion 134 may be activated by light waves of a certain wave length such as light waves of a blue wave length or light waves of a yellow wave length or light waves of a red wave length. In other words, the emulsion 134 is selective with respect to the light waves which activate it.

Figure 16:
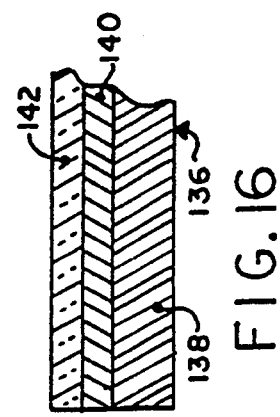
FIG. 16 is a fragmentary cross-sectional view of an integral substrate; photosensitive emulsion and a filter for absorbing wave lengths of a selected range.

In FIG. 16 there is illustrated a film 136 comprising a substrate 138, an emulsion 140 and a filter 142. The filter 142 may be an emulsion which absorbs light waves of a certain wave length. Also, the emulsion 140 may be activated by light waves of all wave lengths or may be activated by light waves of a certain wave length. In other words, in FIG. 16, there is illustrated a film 136 which has an integral filter for absorbing light waves of a certain wave length and for transmitting light waves of a selected wave length to activate the emulsion 140.

It is to be understood that the emulsions 134 and 140 may be of a panchromatic type emulsion which are activated by light waves of all wave lengths, at least, in the visible spectrum.

It is to be realized that the emulsions 134 and 140 may comprise a silver halide such as silver chloride, silver bromide and silver iodide, as is common to many emulsions, and in addition may comprise a dyestuff which, upon being activated by light, changes its form. An example of such a dyestuff or dye is U.S. Pat. No. 3,275,442, issuing date of Sep. 27, 1966 to Hans Kosendranius. This is of value in that for the emulsions 134 and 140, which are activated by light of a selective wave length or a selective wave length range as a dyestuff may be used in place of a silver halide. For example, the dyestuffs are compositions or materials which are pellucid, transparent or translucent, in the absence of light of certain wave length. Upon exposure of a selective wave length or wave length range the pellucid materials or dyestuffs are irreversibly converted with a high quantum efficiency to compositions of increased optical intensity, including compositions which are, substantially, opaque to visible light. In other words, in certain instances these dyestuffs are converted, when radiated with electromagnetic waves of a selective wave length range, to opaque material or are converted to the opaque form.

In FIG. 17 there is illustrated a system comprising reflectors and filters for producing a, substantially, pure selected range of wave lengths of electromagnetic radiation or light. There is a first reflector 142 which reflects a first selected range of wave lengths and transmits other wave lengths. For ease of illustration, but not to limit the invention, it will be stated that reflector 142 reflects a majority of wave lengths in the blue light range or having a wave length of approximately 4000A to 5000A and identified by reference numeral 144. The reflector 142 reflects the light waves to variable density filter 146. The variable density filter 146 will transmit substantially all of the light waves 144 and absorb the other light waves. More particularly, it is seen in FIG. 17 that there is a geometric image 150. The light waves from the geometric image 150 comprise those waves 144 in the blue region, and by way of illustration, waves 152 in the yellow region or in the range of about 5000A to 6000A and those light wave. 154 in the red range or in the range of about 6000A to 7000A. The light waves 144, 152 and 154 strike the reflector 142 and substantially all of the light waves 144 are reflected to the filter 146, as previously explained and a very small percentage of the light waves 152 and 154 are directed to the filter 146. The filter 146 absorbs the light waves 152 and 154 and, may, reflect the light waves 152 and 154 depending upon the variable density filter 146.

The reflector 14 transmits a small percentage of the light waves 144 and transmits substantially all of the light waves 152 and 154. The light waves strike a reflector 156 and which reflector 156 reflects, substantially, all of the light waves 152 in the yellow range, also reflects a small percentage of the light waves 144 and 154 toward the filter 158. The filter 158 is a variable density filter which, selectively, transmits light waves 152 in the yellow range and absorbs and/or reflects and absorbs light waves 144 and 154 in the blue and red ranges.

From the reflector 156, substantially, all of the light waves 154 in the red range are transmitted and a small percentage of the light waves 144 and 152 are transmitted to the reflector 160. The reflector 160 reflects substantially all of the light waves 154 in the red range and reflects only a small percentage of the light waves 144 and 152 in the blue and yellow ranges to the filter 162. The filter 162 absorbs and/or absorbs and reflects the light waves 144 and 154 and transmits a substantially, pure light wave 154 in the red range. The reflector 160 transmits a small percentage of the light waves 144, 152 and 154. The filter 162 is a variable density filter.

In this manner I realize a, substantially, pure blue light wave 144 having a wave length in the range of about 4000A to 5000A; a, substantially, pure yellow light wave 152 having a wave length in the range of about 5000A to 6000A; and, substantially, pure red light wave 154 having a wave length in the range of about 6000A to 7000A. Also, there is realized a small proportion of light waves 144, 152 and 154 which function as a complementary color in the color separation and the reproduction process.

As a modification of the system of FIG. 17 there is illustrated in phantom line the filter 162 for receiving the light waves 144, 152 and 154 from the reflector 156. The filter 162 will absorb and/or reflect, as previously explained, the light waves 144 and 152 and transmit a, substantially pure, light wave 154 in the red range. With the configuration showing the filter 162 in line with the reflector 156 it is not necessary to have the reflector 160 and there is not produced the small percentage of color 144, 152 and 154 comprising a complementary color.

It is to be realized that the configuration in FIG. 17 can be different so that the reflector 142 need not be the first reflector but can be the second or third reflector and that the reflector 156 can be the first or third reflector and the reflector 160 can be the first or second reflector, with consequent changes in the position of the filters 146, 158 and 162. The arrangement of the reflectors and filters can be varied. Further, it is to be realized that the reflectors 142, 156 and 160 can be the reflectors 50, 60, 62, 70 and 80 of FIGS. 1 through 5, as previously described. Also, the filters 146, 158 and 160 can be the filters 90, 92, 100. 110. 114, 120 and 126 of FIGS. 7 through as, previously, described. The variable density filters 146. 158 and 162 can be activated by the electromagnetic waves from the reflectors 142, 156 and 160.

In FIG. 17 the length of the lines for the blue wave lengths 144, yellow wave lengths 152 and red wave lengths 154 are symbolic and, to a degree, try to illustrate the percent of light waves reflected and transmitted. The length of these lines is not an accurate measurement of the percent of light waves reflected and transmitted but is a symbolic representation to convey to the viewer the reflection, transmission and filtration of the light waves to achieve a, substantially, pure light wave.

In FIG. 18 there is illustrated a series of reflectors and film for recording the desired wave length reflected. More particularly, there is the reflector 142, the reflector 156, the reflector 160, as previously described with respect to FIG. 17. Also, there is the geometric image 150 and the light waves 144, 152 and 154 from the geometric image 150. Again, the reflector 142 reflects substantially all of the light waves 144 to photosensitive emulsion 170. Photosensitive emulsion 170 is activated by the light waves 144. The photosensitive emulsion 170 may be sensitive only to the light waves 144 or may have an absorption material for absorbing the light waves 152 and 154 in transmitting the light waves 144.

The reflector 156 reflects the light waves 152 to the photosensitive emulsion 172. The photosensitive emulsion 172 may be sensitive only to the light waves 152 or may have an absorption means for absorbing the light waves 144 and 154 and for transmitting the light waves 152.

Further, the reflector 160 may reflect the light waves 154 to the photosensitive emulsion 174. The photosensitive emulsion 174 may be sensitive only to light waves 154 or may comprise absorption means for absorbing the light waves 144 and 152. The reflector 160 transmits a small percent of the light waves 144, 152 and 154 to the photosensitive emulsion 176. The photosensitive emulsion 176 is sensitive to the light waves 144, 152 and 154 and, may, for example, be a panchromatic emulsion.

In FIG. 18 it is seen that there is, in phantom, the flim 174. The film 174 is in line with the light waves transmitted from the reflector 156. Also, in the FIG. 18 it is not necessary, when having the flim 174 in line with the reflector 156 to have the reflector 160. The photosensitive emulsion 174 is sensitive to the light waves 154, as previously explained, and may have an absorption means for absorbing the light waves 144 and 152. With the photosensitive emulsion 176 there is produced a complimentary color. With the photosensitive emulsion 176 there are four photosensitive emulsions, one for blue, one for yellow, one for red, and, the photosensitive emulsion 176 for the complementary color. Without the photosensitive emulsion 176 there is no complimentary color and the photosensitive emulsions 170, 172 and 174 are activated by the blue, yellow and red light waves.

In FIG. 18 the reflectors 142, 156 and 160 may be the reflectors 50, 60, 62, 70 and 80 of FIGS. 1 through 5. Also, the photosensitive emulsions 170, 172, 174 and 176 may be those photosensitive emulsions as referred to by reference numerals 130 and 136 of FIGS. 15 and 16, or may be panchromatic emulsions.

Figure 19:
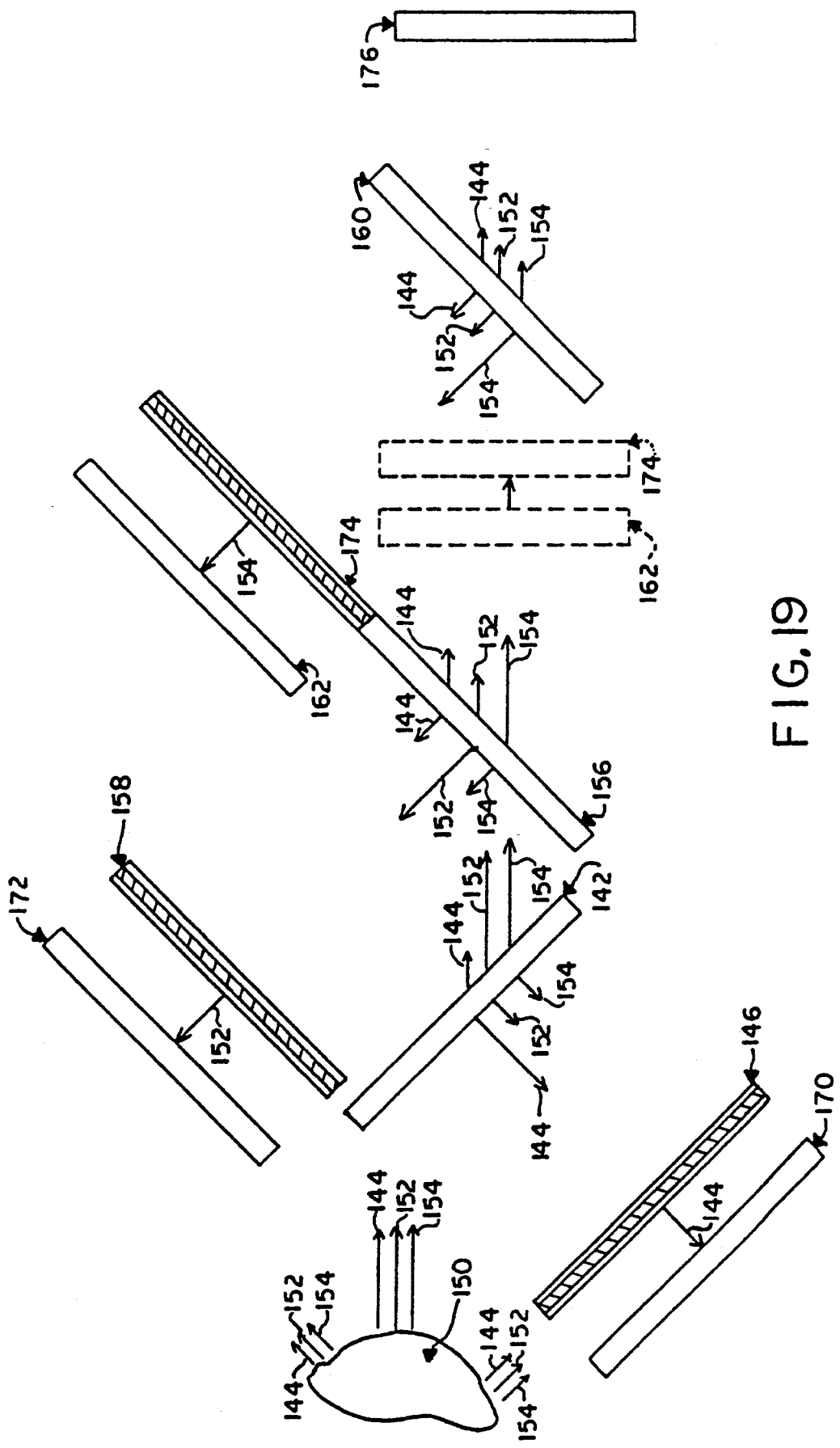
FIG. 19 is a schematic diagram of an arrangement of dichroic reflectors, variable density filters and photosensitive emulsions for the separation of wave lengths into selected ranges of desired wave lengths and for activating the photosensitive emulsions by the selected ranges of desired wave length.

In FIG. 19 there is illustrated a combination of reflectors, variable density filters, and film.

The light waves from the geometric image 150 are partially reflected and partially transmitted by the reflector 142. The reflector 142 reflects, substantially, all of the light waves 144 the filter 146. The filter 146 transmits, substantially, pure light waves 144 to the photosensitive emulsion 170 which is activated, as previously explained. 4 The reflector 142 transmits, substantially, all of the light waves 152 and 154 to the reflector 156 which, in turn, reflects, substantially, all of the light waves 152 to the variable density filter 158. The variable density filter 158 transmits light waves 152 to the photosensitive emulsion 172.

The reflector 156 transmits, substantially, all of the light waves 154 to the reflector 160 which reflects, substantially all of the light waves 154 to the variable density filter 162. The variable density filter 162 transmits, substantially, pure light waves 154 to the photosensitive emulsion, 174.

The reflector 160 transmits a small percentage of the light waves 144, 152 and 154 to the photosensitive emulsion 176.

The photosensitive emulsion 170 is activated by the blue light waves 144; the photosensitive emulsion 172 is activated by the yellow light waves 152; the photosensitive emulsion 174 is activated by the red light waves 154; and, the photosensitive emulsion 176 is activated by the complementary color comprised in the light waves 144,152 and 154. The photosensitive emulsions 170, 172, 174 and 176 may be panchromatic emulsions, In FIG. 19 it is seen that the variable density filter 162 and the photosensitive emulsion 174 are in phantom lines and in direct line with the light waves from the reflector 156. In this configuration it is not necessary to have the reflector 160 and the photosensitive emulsion 176 as the red light waves 154 are directed in a, substantially, pure form to the photosensitive emulsion 174.

It is seen that the system of FIG. 19 is a combination of the systems of FIG. 17 and FIG. 18. Again, the reflectors 142, 156 and 160 may be the reflectors 50, 60, 62, 70 and 80 of FIGS. 1 through 5. Also, the variable density filters 146, 158 and 162 may be the variable density filters 90. 92, 100, 110, 114, 120 and 126 of FIGS. 7 through 13. And, the photosensitive emulsions 170, 172. 174 and 176 may be the photosensitive emulsions 130 and 136 of FIGS. 15 and 16, or may be panchromatic emulsions.

Figure 20:
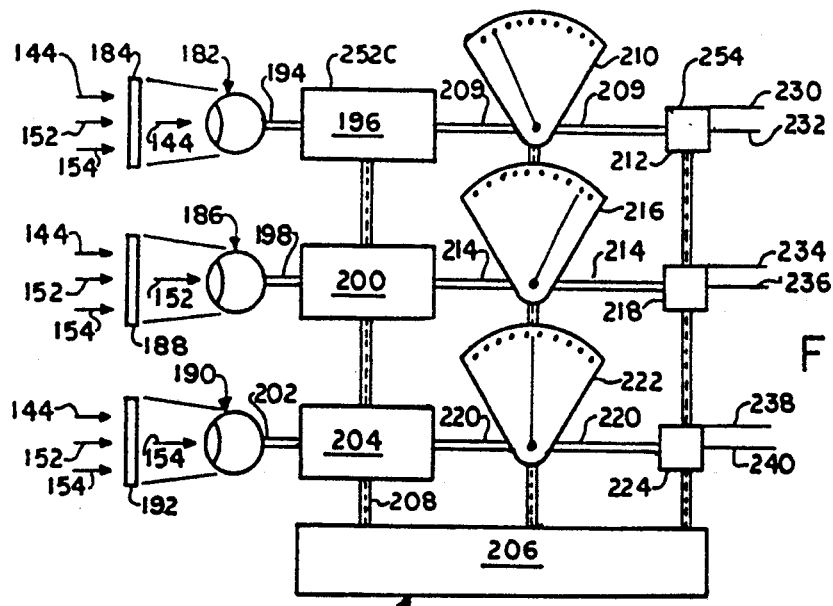
FIG. 20 is a schematic illustration of the selective wave length sensor and control for the variable density filter and, as illustrated, for three variable density filters.

In FIG. 20 there is illustrated a selective wave length sensor and control 180.

The sensor and control 180 comprises three sensing means for the light waves in the general range of the blue light, 4000A to 5000A, yellow light in the range of 5000A to 6000A and red light in the range of 6000A to 7000A. There is a first photosensing element 182. In front of the element 182 there is a color filter 184 for transmitting light waves 144, blue light waves in the range of 4000A to 5000A and absorbing the light waves 152 and 154, see FIGS. 17, 18 and 19 and the explanation for these figures. Also, there is a sensor 186 and a color filter 188. The color filter 188 transmits yellow light waves 152 in the range of 5000A to 6000A and absorbs the light waves 144 and 154. Also, there is a light sensitive means 190 and a corresponding color filter 192. The color filter 192 transmits red light waves 154 in the range of 6000A to 7000A and absorbs the light waves 144 and 152.

The light sensitive means 182 by means of appropriate circuitry 194 connects with a photomultiplier 196. The light sensitive means 186 by means of appropriate circuitry 198 connects with a photomultiplier 200. The light sensitive means 190 by means of appropriate circuitry 202 connects with a photomultiplier 204.

There is s power source 206 which connects with the photomultipliers 196, 200 and 204. The power source may be alternating current or direct current as appropriate. The power source 206 connects with the photomultipliers 196, 200 and 204 by appropriate circuitry 208.

The photomultiplier 196 by means of circuitry 208 connects with a light volume indicator 210, graphically illustrated in FIG. 20. Also the photomultiplier 196 connects with a control 212 by means of the circuitry 208.

The photomultiplier 200 by means of circuitry 214 connects with the light volume indicator 216, graphically illustrated in FIG. 20, and also connects with the control 218.

The photomultiplier 204 by means of appropriate circuitry 220 connects with a light volume indicator 222 and also connects with the control 224.

The controls 212, 218 and 224 control the means for exciting the photochromic materials or phototropic materials in the variable density filter.

The light volume indicators 210, 216 and 222 are responsive to the electrical impulses or electrical signals from the photomultipliers 196, 200 and 204 and give a graphical illustration of the light volume.

In FIG. 20 it is seen that the control 212 has electrical lines 230 and 232: the control 218 has electrical line 234 and 236; and, the control 224 has electrical lines 238 and 240.

Figure 21:
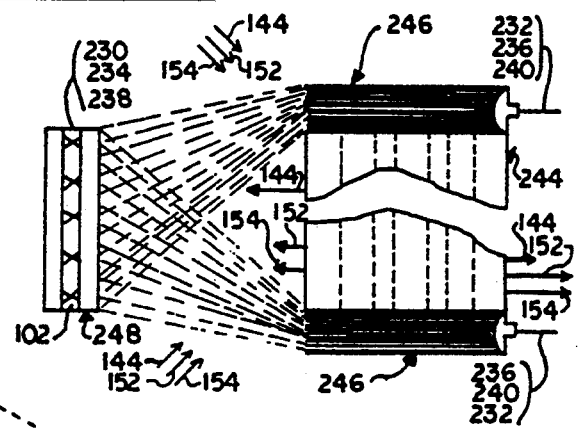
FIG. 21 is a schematic illustration of an exciting means for exciting the photochromic material or the phototropic material of the variable density filter.

In FIG. 21 there is, schematically, illustrated a reflector 244 for, selectively, reflecting light waves of a certain wave length and transmitting light waves of another wave length. By way of example the light waves 144,152 and 154 can be directed to the reflector 244. The reflector 244, selectively, reflects the blue light waves 144 and, substantially, transmits the yellow light waves 152 and the red light waves This is illustrated by the length of the lines 144,152 and 154 in FIG. 21 and, as already explained with reference to FIGS. 17, 218 and 19. There is associated with the reflector 244 an exciting means 246. It is to be clearly understood that the exciting means 246 need not be physically connected to the reflector 244 and may be positioned away from the reflector 244. Or, the exciting means may be juxtapositioned to the reflector 244 as illustrated in FIG. 21. The exciting means will direct electromagnetic radiations to a filter 248. The filter 248 is for transmitting blue light waves 144 and for absorbing and/or for absorbing and reflecting light waves 152 and 154, as, previously, explained. The control for the exciting means 246 is a control 212 and connects with the exciting means 246 by means of the line 232. In certain instances it may be desirable to use a filter such as filter 100, 114 or 120 of FIGS. 9, 11 and 12 wherein there is a unit 102 for varying the temperature of the variable density filter or a bus bar arrangement 122 and 124. Then, the variable density filter 248 connects with the control 212 by means of electrical connection 230 or electrical line 234.

It is to be realized that the reflector 244 can be selective for tranmitting wave lengths 152 and reflecting wave lengths 144 and 154 or for tranmitting wave lengths 154 and reflecting wave lengths 144 and 152. Where appropriate, the control for the exciting means 246 may be the control 218 connecting with the exciting means 246 by means of electrical connection 236 or the control may be control 224 connecting with the exciting means 246 by means of the electrical connection 240. Also, where appropriate the control for the variable density filter 248 may be the control 218 connecting by means of electrical connection 234 or may be the control 224 connecting by means of the electrical connection 238.

Again, the reflector 244 may be a reflector, where appropriate, reflector 50, 60, 62, 70 or 80 as previously described and illustrated with respect to FIGS. 1 through 5 and, the filter 248 may be a filter 90, 92, 100, 110, 114, 120 and 126, where appropriate, as previously described with respect to FIGS. 7 through 13.

The exciting means 246 may be a source of ultra-violet electromagnetic radiation or infra-red electromagnetic radiation and may comprise fiberoptics to assist in the distribution of the radiation onto the variable density filter 248. As is well known the ultra-violet radiation and the infra-red radiation excite the photochromic materials or the phototropic materials in the variable density filter 248.

To lessen the excitement of the photochromic materials or phototropic materials in the variable density filter 248 it may be necessary to resort to one of may situations such as deactivating the exciting means 246 by turning off the exciting means 246 to assist in returning the photochromic materials to the original pellucid state; to direct a white light onto the variable density filter 248 to return the photochromic materials to their original pellucid state. The exciting means may incorporate three sources or wave lengths such as a blue wave length, a yellow wave length and a red wave length, in the appropriate mixture or intensity to form a white light for radiating the variable density filter 248 to return the photochromic materials to their original pellucid state. Another means for deactivating the photochromic materials in the variable density filter 248 would be to decrease the temperature of the variable density filter 248. One way of decreasing the temperature of the filter 248 would be to cool the filter 248 by letting the layer 102 generate electricity and dissipate the electricity outside of the filter 248. Another way of expressing this is for the filter 248 to have an inversion coupler for lowering the temperature of the variable density filter 248.

In FIG. 20 it is seen that an electrical connecting means 252 connects with the photomultipliers 196, 200 and 204. Also, an electrical connecting means 254 connects with the controls 212, 218, and 224.

Figure 22:
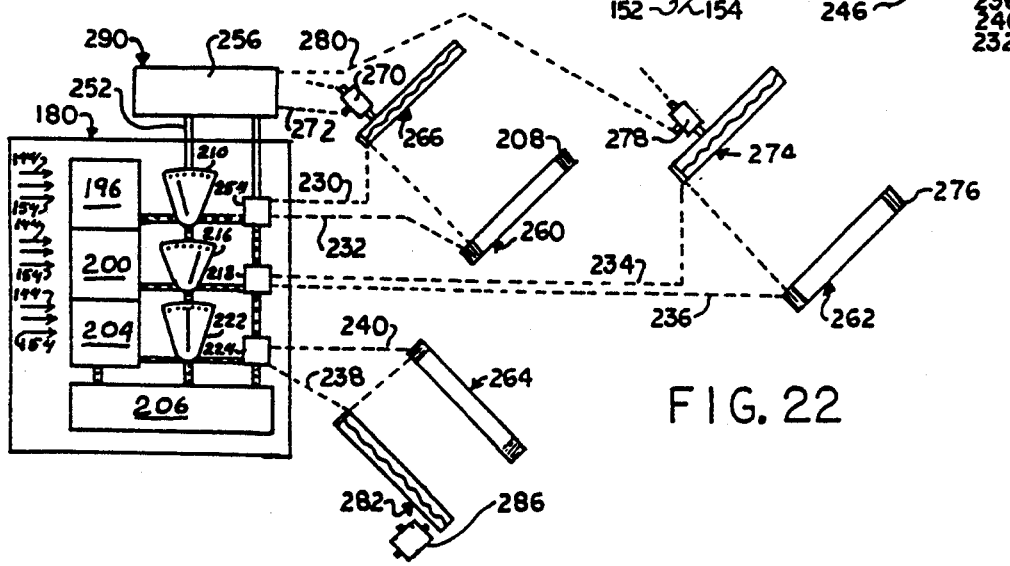
FIG. 22 is a schematic illustration of a combination of a selective wave length sensor and control and power source for exciting the variable density filter.

In FIG. 22 it is seen that the selective wave length sensor and control 180 connects by the electrical connecting means 252 and 254 with a power source 256.

In FIG. 22 it is seen that there is a first reflector 260, a second reflector 262 and a third reflector 264.

There is associated with the first reflector 260 a first variable density filter 266. An exciting means 268 is associated with the reflector 260 and connects with the sensor and control 180 by means of electrical connection 232. There may be an electrical connection 230 between the variable density filter 266 and the sensor and control 180. The power source 256 connects with a suitable recording means 270, such as a photoscanner, by means of an electrical connection 272.

Likewise, there is associated with the reflector 262 a variable density filter 274. Associated with the reflector 262 is an exciting means 276 for the filter 274. The exciting means 276 connects with the sensor and control 180 by means of the electrical connection 236. Where appropriate the variable density filter 274 connects with the sensor and control 180 by means of an electrical connection 234. There may be a recording means associated with the variable density filter 274, such recording means being a photoscanner 278. The photoscanner 278 may connect with the power source 256 by means of an electrical line or connection 280.

Likewise, there is associated with the reflector 264 a variable density filter 282. Associated with the reflector 264 is an exciting means 284 for exciting the filter 282. An electrical line 240 connects with the exciting means 284 and also with the sensor and control 180. Where appropriate, an electrical line 238 connects with the variable density filter 282 and the sensor and control 180. There may be a recording means 286 associated with the variable density filter 282, such recording means being a photoscanner. The photoscanner 286 connects with the power source 256 by means of an electrical connection 288. In certain instances, it may be desirable to have a fourth recording means such as a photoscanner for complementary color.

The reflector 260 may, selectively, reflect blue light in the range of 4000A to 5000A and transmit yellow and red light. The reflector 262 may reflect yellow light in the range of 5000A to 6000A and transmit blue and red light. Also, the reflector 264 may reflect red light in the range of 6000A oo 7000A and transmit blue and yellow light.

For ease of illustration and explanation the selective wave length sensor and control 180 and the power source 256 will hereafter, be referred to by reference numeral 280, a combination of a selective wave length sensor and control and power source.

In FIG. 23 there is a symbolic representation of the use of the reflectors, variable density filter and the combination of a selective wave length sensor and control and Dower source 290 to achieve a, substantially, pure color for recording on such as photosensitive emulsion, with a photoscanner, with a photoscanner for converting to digital information or for converting to analogue information or for recording on tape such as magnetic tape or other recording means. FIG. 23 is a combination of FIGS. 19 and 22. In fact, FIG. 23 is a result of the evolution and combination of FIGS. 17, 18, 19, 30 and 22. FIGS. 17 through FIG. 22 build and lay a background for FIG. 23. The appropriate reference numerals in FIG. 23 may be found in FIGS. 17 through 22. There is a geometric image 150. The wave lengths 144, 152 and 154 pass to the combination selective wave length sensor and control and power source 290 and also to the reflector 142. The reflected blue light 144 goes to the filter 146. The radiation means 268 can radiate the filter 246. There may be a recording means such as a photosensitive emulsion 170 or there may be a recording means such as a photoscanner 270. Again, the use of the photosensitive emulsion 170 and the photoscanning means 270 are symbolic in the sense that under normal circumstances a photoscanning means 270 will not be used in conjunction with the photosensitive emulsion 170. For ease of illustration both are illustrated in FIG. 23. There an electrical connection means 300 connecting with the photoscanner 270. The electrical connections means 300 can connect with another recording means.

From the reflector 142 the light waves travel to the reflector 156. The reflector 156 reflects, mainly, the yellow light waves 152 which are directed to the variable density 158. Associated with the reflector 156 is an exciting means 276 for exciting the variable density filter 158. The light waves 152 from the variable density filter 158 pass to recording means such as a photosensitive emulsion 172 or a photoscanner 278. The photoscanner 27B by means of an electrical connection 302 goes to a recording means.

The reflector 156 transmits, mainly, light waves 154 which flow to the reflector 160. The reflector also reflects the light waves 154 to the variable density filter 162. There is associated with the reflector 160 and exciting means 284 which activates the photochromic properties of the variable density filter 162. From the variable density filter 162 the light waves 154 flow to a recording means such as a photosensitive emulsion 174 or a photoscanner 286. The photoscanner 286 may connect with another recording means by an electrical connection 304.

From the reflector 160 there flows the complementary color comprising wave length 144, wave length 152 and wave length 154. The complimentary color flows to recording means such as a sensitive emulsion 308 or a photoscanner 310. The photoscanner 310 connects with time combination of a selective wave length sensor and control and power source 290 by means of electrical connection 312. Also, the photoscanner connects with recording means by an electrical connection 314.

In FIG. 23 it is seen that there is a recording means 316 connecting with the appropriate photoscanners by the electrical connections 300, 302, 304 and 314, The recording means 316 may be a magnetic tape for recording digital information and analogue information or may be other appropriate recording means such as a photosensitive emulsion. Such recordings may be recorded as separate individual colors such as blue color, red color and yellow color, or may be combined and recorded as one color or, separately, recorded on one recording medium. Also, the information contained in the recording may be used for projection purposes at a more suitable time or a more suitable place. For example, the photoscanners may send the information to appropriate means such as cathode ray tubes for projection onto a cathode ray screen wherein the colors, as beams of electrons, are converged so as to recreate the original image 150 on a cathode ray screen. In other words, this system has value in making a clear projection 150, in color, on a cathode ray screen such as color television.

Further, with the photosensitive emulsions 170, 172,174, and 308, it is possible to make color separations for use in colored printing. With the reflectors reflecting, substantially, pure light such as blue light or yellow light or red light and also with filters absorbing light other than the desired light, it is possible to realize a, substantially, pure light. This pure light may be blue or yellow or red. In color printing the basic color separations are blue, yellow and red. In certain instances where it is desired and deemed necessary there may be used the complementary color comprising the colors 144, 152 and 154 to activate the photosensitive emulsions 308. From the foregoing, it is seen that there is provided a system, as outlined in FIG. 23, wherein the colors are not absorbed to subtract from the initial energy. In fact, substantially all of the pure colors are transmitted to the recording means such as a photosensitive emulsion or to the photoscanners. In many color separation processes the undesirable colors are absorbed reducing the overall color intensity or color density. In the system it is seen that the undesirable colors are not absorbed but are reflected and transmitted and the small amount or small percentage of extraneous color which is not desired is absorbed by a variable density filter. This means that, substantially, all of a pure color and almost all of the color as orignirated from the basic geometric image is transmitted to the recording means such as the photosensitive emulsion or to the photoscanner. In other words the process is not a subtractive process for absorbing a large quanity of light waves to produce the, substantially, pure color. Instead, the process is a process for separating a selective band width of light waves from other light waves by reflection and transmission and then absorbing the small percent or small quantity of the light waves outside the selected band width of light waves to produce, substantially, pure color.

One of the beneficial side effects of the system and process is that it produces, substantially, pure color waves in desired wave length bands or desired wave length ranges. This means that there is not the necessity to make color corrections or to mask for the color wave lengths outside of the desired selected color bands or selected color wave lengths. More particularly, in making color separations, either negatives or positives, it is often necessary to mask the color separation outside the desired colored band width. For example, in a color separation for blue, prior to my invention, there was often some yellow color and some red color. It was necessary to mask the blue color separated negative or positive to remove the yellow and red or to make correction for the yellow and red colors. This masking or removal of the colors outside the blue color was done in a separate process and which process was time consuming and expensive. The example can be expanded to state the same for a selected band with the color in the yellow range from about 5000A to 6000A. In the color separated negative or positive, there would be some blue color and also some red color. Again, it was necessary, prior to the invention, to mask the color separated negative or positive or to make corrections, in a separate process, to remove the undesirable blue and red colors from the yellow separated negative or positive. This example can be expanded for red to make corrections for blue and yellow colors in the red separated negative or positive.

Also, from the foregoing, it is seen that there is provided a means and a method for making color separations either in blue and yellow and red or in blue and yellow and red and the complementary color and which color separations are of substantial purity and can be used for making color prints without the necessity of making corrections or masks. Another advantage flowing from the means and method with regard to color separations is that, prior to this invention, the time required to make a set of colored separations, either three or four colored separations, would be hours as it is necessary to make each color separation in a separate step. With this invention, it is possible to make a set of color separations, either three color separations or four color separations, simultaneously, and, essentially, in the time required to develop the photosensitive emulsions, which is, with automatic processing, approximately, three to five minutes and with manual processing somewhat longer.

Another benefit from the invention is that it is possible to make a recording of, substantially, pure color in digital information or analog information and to dispense with photosensitive emulsions. In other words, the photosensitive emulsion or film can be eliminated and yet color can be reproduced from the digital information or analog information stored on a recording material such as a magnetic tape or other suitable recording material. As previously stated, it is possible to take this stored information and to introduce it into a cathode ray tube, under proper means and circumstances, such as color television and reproduce the substantially pure colors upon being converged to form a replica of the original geometric image 150. Further, this stored information, in digital form or analog form, in its separated form, is used for making etched plates, three etched plates or four etched plates, for use in color printing such as lithograhic printing, gravure printing or engravings, To repeat, it is possible with my means and method to eliminate the use of photosensitive emulsions for making color separations and to go directly from the geometric image from the variable density filter to making etched plates for lithographic printing or rotogravure printing or etchings. From this, it is seen that there is a saving in three and also a saving in steps by eliminating activating a photosensitive emulsion to make a series of color separations of three separations or four separations as it is possible to make three or four plates, simultaneously, for colored printing.

The system diagrams of FIGS. 17, 18, 19 and 23 may be used for geometric imaging without a lens or a lens means. In other words, the systems of these figures are lensless or, as sometimes termed, holographic systems. The systems of FIGS. 17, 18, 19 and 23 are lensless image recreations. Such systems may be used in holography and methods wherein the geometric images are recreated by electrical impulses.

Figure 25:
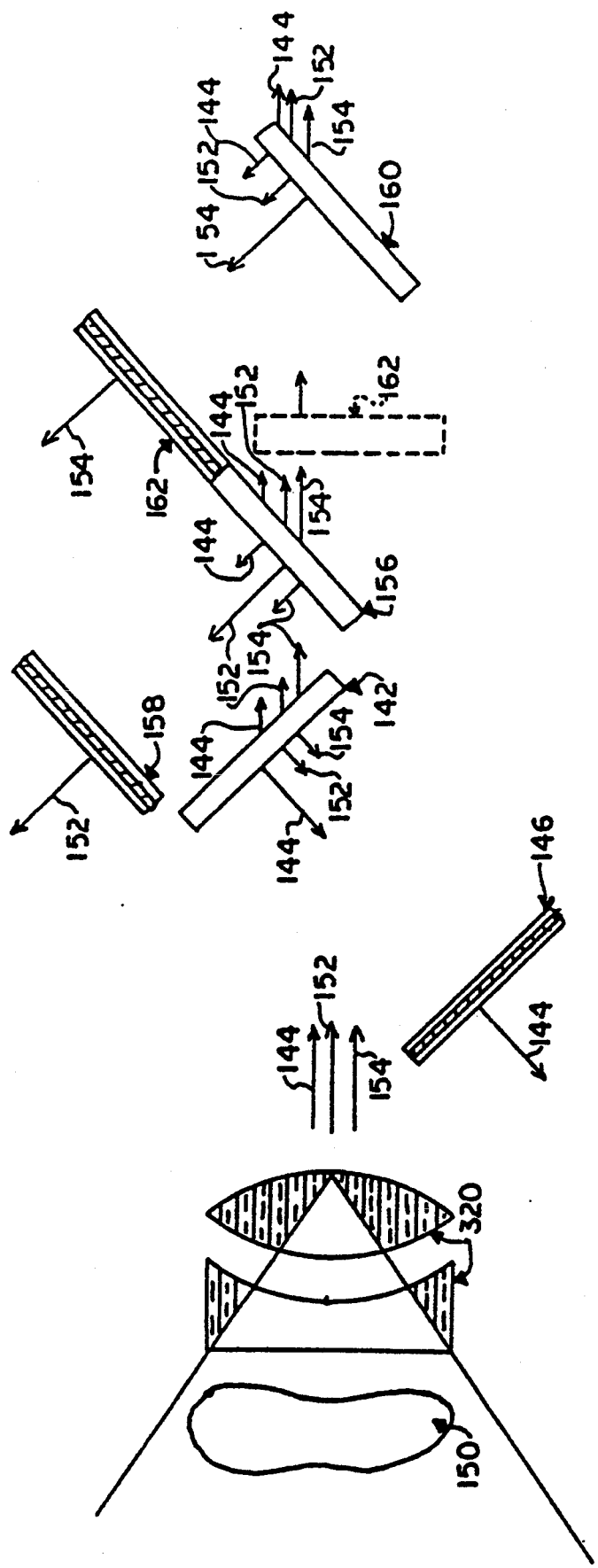
FIG. 25 is a schematic illustration of a lens, dichroic reflectors, and variable density filters for separating wave lengths into selected ranges of desired wave length.

In FIGS. 24 and 25 there is illustrated a system using a collimating lens 320. FIG. 24 is similar to FIG. 18 except in FIG. 24, as contrasted with FIG. 18, there is the collimating lens 320. In FIG. 24 there are reflectors and photosensitive material. The same reference numerals are used in FIG. 24 as are used in FIG. 18, and the comments with respect to FIG. 18 are also applicable with respect to FIG. 24. The reader is put on notice that in FIG. 24 there is the collimating lens 320 while in FIG. 18, the system is a lensless system.

In FIG. 25 there is illustrated a system similar to FIG. 17, but in FIG. 25 there is a collimating lens 320. As is recalled in FIG. 17 there is no lens in the system of FIG. 17 as the system in FIG. 17 is a lensless system. In FIG. 25 the same reference numerals are used for the light waves, the reflectors and the filter as are used in FIG. 17. The comments with regard to FIG. 17 are also applicable to FIG. 25. In FIG. 25, there is illustrated the filters 146, 158 and 162. As explained with respect to FIG. 17, the filters 146, 158 and 162 may be variable density filters. There may not be a separate exciting means for these variable density filters but the light rays themselves will, to a degree, change the photochromic or phototropic properties of the filters so as to add a variation in absorption of the light waves. In other words, the light waves themselves act as an exciting means. More particularly, the filter 146 can be for the blue range; the filter 158 can be for the yellow range; and, the filter 162 can be for the red range.

Figure 26:
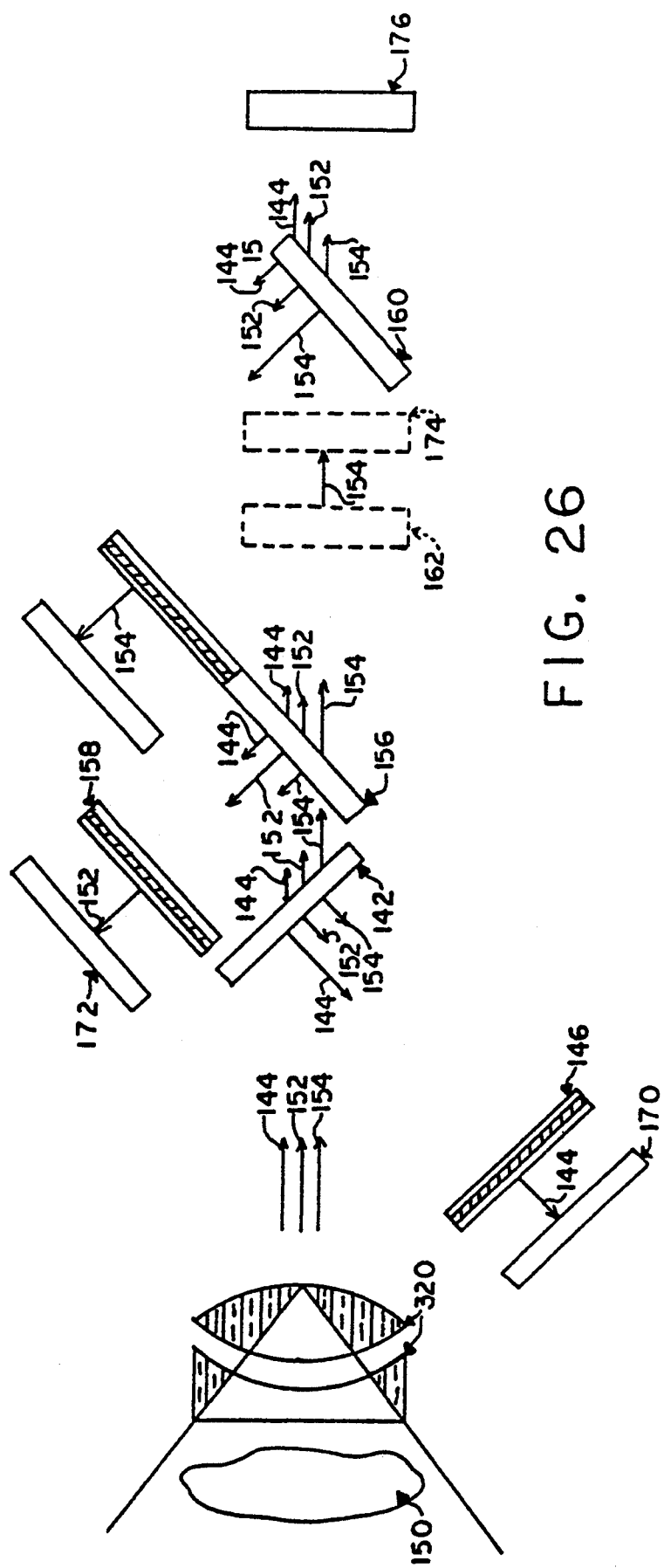
FIG. 26 is a schematic illustration of a lens, dichroic reflectors, variable density filters and photosensitive emulsions for separating wave lengths into desired ranges of wave lengths and activating the photosensitive emulsions.

In FIG. 26 there is illustrated a system using a lens 320. FIG. 26 is similar to FIG. 19 in that there is a series of reflectors, filters, and photosensitive material. It is to be, clearly, understood that in FIG. 26, there is the collimating lens 320 while the system of FIG. 19 is a lensless system or does not have a lens. The reference numerals used in FIG. 19 are also used in FIG. 26 and the comments with respect to FIG. 19 are also applicable to FIG. 26. By way of recall, the filters 146, 158 and 162 can be variable density filters and can be excited by the light waves themselves from the respective reflectors. The filter 146 can be a blue filter; the filter 158 can be a yellow filter; and, the filter 162 can be a red filter. Again, these filters can be a variable density filter. The photosensitive material 170, 172, 174 and 176 can be sensitive to certain wave lengths or colors of a selective wave length or can be a photosensitive material like a panchromatic photosensitive material sensitive to wave lengths in the visible wave length range or can have an absorbing means or an absorption means for absorbing wave lengths other than the wave lengths selected to be transmitted.

In FIG. 27 there is illustrated a system with a lens 320 and which system is similar to the system of FIG. 23. It is to be clearly understood that in FIG. 27 there is a lens or lens means 320 and in FIG. 23 there is no lens, or the system of FIG. 23 is a lensless system. The system of FIG. 27 comprises reflectors, filters, recording material such as photosensitive means or a photoscanner such as the system of FIG. 23. The like components of FIG. 23 and FIG. 27 are given the same reference numerals, and the comments with respect to the system of FIG. 23 are also applicable with respect to the system of FIG. 27. The details of FIG. 27 will not be repeated in order to be more concise, but it is clearly to be understood that the like components of the two systems function in the like manner.

In FIG. 28 there is illustrated a system for converting information in one form to information in another form. The information in one form may be referred to by reference numeral 330 and may be recorded material such as a geometric image on photosensitive material, a color separation, digital information, analog information, material recorded on a magnetic tape, material recorded on a paper tape, and material recorded on a hollerith card, to name a few, or the material 330 may be the information, see FIGS. 17, 19, 23, 25, and 26 and 27, where the information is on the filters 146, 158 and 162 and 308. This information can be observed and read by appropriate means such as a photoscanner or can be read by other appropriate means such as read heads for magnetic tape, paper tape and hollerith cards as indicated by reference numeral 332 which connects with an intense source of radiation 334 such as a quartz-iodine lamp or a monochromatic radiation, commonly known as a laser. An electrical connection means connects the scanning means 332 for the information 330 with the intense source of electromagnetic radiation. The intense source of electromagnetic radiation 334 is directed to a material 336. The material 336 may be a photosensitive material comprising a silver halide such as silver chloride, silver iodine, silver bromide and, even, silver fluoride, or the photosensitive material may comprise an irreversible dyestuff which upon being activated assumes an irreversible form, or the material 336 may be a metal which is etched away to form a plate for printing purposes. There is a power source 338 connecting with the scanning means 332 by an electrical connection 340 and connecting with the intense source of radiation 334 by an electrical connection means 342.

An example of the use of the system of FIG. 28 is one for making plates for use in color printing. If there be three or four color separations, the plate may be made directly from a color separation by scanning the color separation with the scanning means 332 and using the intense source of radiation, such as monochromatic light, to recreate the geometric image on the material 336. Another example of this is that a person may have a page from a newspaper or a page from a printed publication and scan that page by the scanning means 332 and recreating the geometric images on that page on the material 336. Further, it is to be realized that in transforming the information on 330 or the information 330 to the material 336, it is possible to reduce the size of the original geometric image to a smaller size; to retain the size of the geometric image on the material 336 as the same size; or, to enlarge the geometric image on the material 336 as compared with the original geometric image. One value of this is that a printed publication can be reduced in size to make the information 330 or recorded material 330. This means that the information being stored is of small size and can easily be stored and requires less volume for storage. Then, upon recall, this information can be scanned by the scanning means 332 and enlarged to any size desired on the material 336.

In FIG. 29, which is a combination of FIGS. 23, 27 and 28 there is illustrated a system for scanning a geometric image and producing a plurality of recorded images, substantially, instantaneously. The reference numerals common to FIGS. 23, 27 and 28 are also common to FIG. 29.

In FIG. 29 the geometric image may be a color transparency.

In FIG. 29 it is seen that the three ranges of light waves, 144, 152 and 154 are from the geometric image 150 and by means of the reflectors 142, 144 and 160 these three ranges of light waves are separated into, mainly, the blue range 144, the yellow range 152 and the red range 154. Then, the variable density filter 146 transmits, substantially, a pure blue light range 144 which is scanned by the scanner 270 and transmitted by electrical connection 300 to a writing head 334 for making a recording on the recording material 336. Also, the reflector 154 reflects, mainly, yellow light 152 to the variable density filter 158. The variable density filter 158 transmits, substantially, pure yellow range of light 152 which is scanned by the scanner 278. The scanner 278 by means of electrical connection 302 connects with a writing head 340 for making a recording on recording material 342. The reflector 160 reflects mainly, red light 152 and the variable density filter 162 transmits, substantially, a pure red light range 152 which is scanned by the scanner 286. The scanner 286 by means of electrical connection 304 connects with writing head 346 for writing on recording material 348. The dichroic reflector 160 transmits a complementary color comprising the three colors 144, 152 and 154 and which complementary color is scanned by the scanner 310. The scanner 310 connects by electrical connection 314 with the writing head 352 which writes on recording materials 354.

More, particularly, the writing heads 334, 340, 346 and 352 may be a high intensity source of energy such as a laser or monochromatic light, or, even, polychromatic light of high intensity. The recording materials 336, 342, 348 and 354 may be photosensitive material or may be materials to be made into printing plates. From this example it is seen that it is possible to transform a geometric image 150 into substantially pure ranges of color such make a recording of, substantially, pure color in digital information or analog information and to dispense with photosensitive emulsions. In other words, the photosensitive emulsion or film can be eliminated and yet color can be reproduced from the digital information or analog information stored on a recording material such as a magnetic tape or other suitable recording material. As previously stated, it is possible to take this stored information and to introduce it into a cathode ray tube, under proper means and circumstances, such as color television and reproduce the substantially pure colors upon being converged to form a replica of the original geometric image 150. Further, this stored information, in digital form or analog form, in its separated form, is used for making etched plates, three etched plates or four etched plates, for use in color printing such as lithograhic printing, gravure printing or engravings. To repeat, it is possible with my means and method to eliminate the use of photosensitive emulsions for making color separations and to go directly from the geometric image from the variable density filter to making etched plates for lithographic printing or rotogravure printing or etchings. From this, it is seen that there is a saving in time and also a saving in steps by eliminating activating a photosensitive emulsion to make a series of color separations of three separations or four separations as it is possible to make three or four plates, simultaneously, for colored printing.

The system diagrams of FIGS. 17, 18, 19 and 23 may be used for geometric imaging without a lens or a lens means. In other words, the systems of these figures are lensless or, as sometimes termed, holographic systems. The systems of FIGS. 17, 18, 19 and 23 are lensless image recreations. Such systems may be used in holography and methods wherein the geometric images are recreated by electrical impulses.

In FIGS. 24 and 25 there is illustrated a system using a collimating lens 320. FIG. 24 is similar to FIG. 18 except in FIG. 24, as contrasted with FIG. 18, there is the collimating lens 320. In FIG. 24 there are reflectors and photosensitive material. The same reference numerals are used in FIG. 24 as are used in FIG. 18, and the comments with respect to FIG. 18 are also applicable with respect to FIG. 24. The reader is put on notice that in FIG. 24 there is the collimating lens 320 while in FIG. 18, the system is a lensless system.

In FIG. 25 there is illustrated a system similar to FIG. 17, but in FIG. 25 there is a collimating lens 320. As is recalled in FIG. 17 there is no lens in the system of FIG. 17 as the system in FIG. 17 is a lensless system. In FIG. 25 the same reference numerals are used for the light waves, the reflectors and the filter as are used in FIG. 17. The comments with regard to FIG. 17 are also applicable to FIG. 25. In FIG. 25, there is illustrated the filters 146, 158 and 162. As explained with respect to FIG. 17, the filters 146, 158 and 162 may be variable density filters. There may not be a separate exciting means for these variable density filters, but the light rays themselves will, to a degree, change the photochromic or phototropic properties of the filters so as to add a variation in absorption of the light waves. In other words, the light waves themselves act as an exciting means. More particularly, the filter 146 can be for the blue range; the filter 158 can be for the yellow range; and, the filter 162 can be for the red range.

In FIG. 26 there is illustrated a system using a lens 20. FIG. 26 is similar to FIG. 19 in that there is a series of reflectors, filters, and photosensitive material. It is to be, clearly, understood that in FIG. 26, there is the collimating lens 320 while the system of FIG. 19 is a lensless system or does not have a lens. The reference numerals used in FIG. 19 are also used in FIG. 26 and the comments with respect to FIG. 19 are also applicable to FIG. 26. By way of recall, the filters 146, 158 and 162 can be variable density filters and can be excited by the light waves themselves from the respective reflectors. The filter 146 can be a blue filter; the filter 158 can be a yellow filter; and, the filter 162 can be a red filter. Again, these filters can be a variable density filter. The photosensitive material 170, 172, 174 and 176 can be sensitive to certain wave lengths or colors of a selective wave length or can be a photosensitive material like a panchromatic photosensitive material sensitive to wave lengths in the visible wave length range or can have an absorbing means or an absorption means for absorbing wave lengths other than the wave lengths selected to be transmitted.

In FIG. 27 there is illustrated a system with a lens 320 and which system is similar to the system of FIG. 23. It is to be clearly understood that in FIG. 27 there is a lens or lens means 320 and in FIG. 23 there is no lens, or the system of FIG. 23 is a lensless system. The system of FIG. 27 comprises reflectors, filters, recording material such as photosensitive means or a photoscanner such as the system of FIG. 23. The like components of FIG. 23 and FIG. 27 are given the same reference numerals, and the comments with respect to the system of FIG. 23 are also applicable with respect to the system of FIG. 27. The details of FIG. 27 will not be repeated in order to be more concise, but it is clearly to be understood that the like components of the two systems function in the like manner.

In FIG. 28 there is illustrated a system for converting information in one form to information in another form. The information in one form may be referred to by reference numeral 330 and may be recorded material such as a geometric image on photosensitive material, a color separation, digital information, analog information, material recorded on a magnetic tape, material recorded on a paper tape, and material recorded on a hollerith card, to name a few, or the material 330 may be the information, see FIGS. 17, 19, 23, 25, and 26 and 27, where the information is on the filters 146, 158 and 162 and 308. This information can be observed and read by appropriate means such as a photoscanner or can be read by other appropriate means such as read heads for magnetic tape, paper tape and hollerith cards as indicated by reference numeral 332 which connects with an intense source of radiation 334 such as a quartz-iodine lamp or a monochromatic radiation, commonly known as a laser. An electrical connection means connects the scanning means 332 for the information 330 with the intense source of electromagnetic radiation. The intense source of electromagnetic radiation 334 is directed to a material 336. The material 336 may be a photosensitive material comprising a silver halide such as silver chloride, silver iodine, silver bromide and, even, silver fluoride, or the photosensitive material may comprise an irreversible dyestuff which upon being activated assumes an irreversible form, or the material 336 may be a metal which is etched away to form a plate for printing purposes. There is a power source 338 connecting with the scanning means 332 by an electrical connection 340 and connecting with the intense source of radiation 334 by an electrical connection means 342.

An example of the use of the system of FIG. 28 is one for making plates for use in color printing. If there be three or four color separations, the plate may be made directly from a color separation by scanning the color separation with the scanning means 332 and using the intense source of radiation, such as monochromatic light, to recreate the geometric image on the material 336. Another example of this is that a person may have a page from a newspaper or a page from a printed publication and scan that page by the scanning means 332 and recreating the geometric images on that page on the material 336. Further, it is to be realized that in transforming the information on 330 or the information 330 to the material 336, it is possible to reduce the size of the original geometric image to a smaller size; to retain the size of the geometric image on the material 336 as the same size; or, to enlarge the geometric image on the material 336 as compared with the original geometric image. One value of this is that a printed publication can be reduced in size to make the information 330 or recorded material 330. This means that the information being stored is of small size and can easily be stored and requires less volume for storage. Then, upon recall, this information can be scanned by the scanning means 332 and enlarged to any size desired on the material 336.

In FIG. 29, which is a combination of FIGS. 23, 27 and 28 there is illustrated a system for scanning a geometric image and producing a plurality of recorded images, substantially, instantaneously. The reference numerals common to FIGS. 23, 27 and 28 are also common to FIG. 29.

In FIG. 29 the geometric image may be a color transparency.

In FIG. 29 it is seen that the three ranges of light waves, 144, 152 and 154 are from the geometric image 150 and by means of the reflectors 142, 144 and 160 these three ranges of light waves, are separated into, mainly, the blue range 144, the yellow range 152 and the red range 154. Then, the variable density filter 146 transmits, substantially, a pure blue light range 144 which is scanned by the scanner 270, and transmitted by electrical connection 300 to a writing head 334 for making a recording on the recording material 336. Also, the reflector 154 reflects, mainly, yellow light 152 to the variable density filter 158. The variable density filter 158 transmits, substantially, pure yellow range of light 152 which is scanned by the scanner 278. The scanner 278 by means of electrical connection 302 connects with, a writing head 340 for making a recording on recording material 342. The reflector 160 reflects mainly, red light 152 and the variable density filter 162 transmits, substantially, a pure red light range 152 which is scanned by the scanner 286. The scanner 286 by means of electrical connection 304 connects with writing head 346 for writing on recording material 348. The dichroic reflector 160 transmits a complementary color comprising the three colors 144, 152 and 154 and which complementary color is scanned by the scanner 310. The scanner 310 connects by electrical connection 314 with the writing head 352 which writes on recording materials 354.

More, particularly, the writing heads 334, 340, 346 and 352 may be a high intensity source of energy such as a laser or monochromatic light, or, even, polychromatic light of high intensity. The recording materials 336, 342, 348 and 354 may be photosensitive material or may be materials to be made into printing plates. From this example it is seen that it is possible to transform a geometric image 150 into substantially pure ranges of color such as 144 for a blue range and 152 for a yellow range and 154 for a red range. Then, these ranges of color can be recorded on suitable recording material. More, particularly, the geometric image 150 can be recorded on the recording materials 336, 342, 348 and 354, substantially, instantaneously, and, simultaneously. With the use of the scanning means 270, 278, 286 and 310 and with the use of the writing heads 334, 340, 346 and 352 it is possible within a very short time period, such as one-tenth of a second, to form the printing plates 336, 342, 348 and 354. It is to be understood that if the geometric image 150 comes from a color transparency or other still subjects, such as a stationary landscape scene or filming of the like, it is not necessary to scan and form the printing plates or recorded material 336, 342, 348 and 354 in one-tenth of a second but a longer time period may be used. Or, with the geometric image 150 being a live subject which may change position, for example, a model modeling a fur coat or a leather jacket or the like, the separation of the light waves from the live subject and the scanning of the resulting, substantially, pure bands of light waves and the scanning of these, substantially, pure bands of light waves and the making of the printing plates 336, 342, 348 and 354 can be accomplished in a short time period such as one-tenth of a second or, even, less time. From this description and disclosure of the apparatus and method of FIG. 29 it is seen that it is not necessary to first form three or four color separations using standard photographic film procedures and means. And then from the three or four photographic films comprising the color separation the printing plates can be made. Instead, with what we have invented and disclosed the printing plates can be made directly from a color transparency or a live subject. The printing plates can be lithographic plates or gravure plates and can be considered to be etched. Also, the printing plates may be considered to be photosensitive emulsions on a substrate such as paper, metal, plastic, glass and the like. The writing heads 334, 340, 346 and 352 are high intensity source of energy such as a pulsed laser of other monochromatic or polychromatic sources of light. An example of a polychromatic source of light is the quartz-iodine lamp, carbon arc. Also, where appropriate the writing heads 334, 340, 346 and 352 can be heads for writing on other materials such as for writing on magnetic tape, punching holes in paper or in plastic, such as paper tape or plastic tape, and Hollerith tape. The information can be in analogue form or can be in digital form.

In summary, it is seen that with this invention it provides a means and method for taking wave lengths from a geometric image and separating these wave lengths into the primary color ranges or bands for blue, yellow and red without any substantial loss of electromagnetic wave energy. Further, the separated bands of primary colors or range of primary colors are further refined to a, substantially, pure band of light for each of the primary colors. For example, there results a, substantially, pure blue or range of blue for the range of, approximately, 4000A to about 5000A. Similarly, for yellow there results, substantially, a pure band of yellow light or a range of yellow light for the range of about 5000A to, approximately, 6000A. And, for red color there results a, substnatially, pure red in the range of about 6000A to about 7000A. This ability to take the wave lengths from a geometric image and to separate and refine these wave lengths into the three primary color ranges is accomplished, substantially, simultaneously, and, instantaneously without any substantial loss of the electromagnetic wave energy. The three primary ranges of color can be recreated by various methods of reproduction under varied circumstances to form the recreated geometric image. For example, the three primary ranges of color may be recreated, substantially, instantaneously, to form the recreated geometric image. Or, the three, substantially, pure ranges of color may be recorded and recreated at a later period of time. Further, from this invention it is seen that it is possible to achieve, substantially, instantaneously, a color separation of high quality or optimum quality in a, substantiality, pure desired range and without the necessity of making color correction. This ability to achieve three, substantially, pure ranges of color for blue, for yellow and for red can be achieved in less time and with less cost than any other means or method known. An added advantage is that this can be realized without an expert doing the color separation. One of the features that makes possible this realization of, substantially, pure bands or ranges of the three primary colors, blue, yellow and red, is the variable density filter having photochromic materials or phototropic materials, absorbent materials such as dyestuffs, and, where applicable, the ability to, simultaneously, reflect selective wavelengths or colors and to transmit selective wavelengths of colors.

In preparing this patent application a visit to the U.S. Patent Office was made and a search conducted to determine the state of the prior art and in the search there was found the following pertinent U.S. Pat. No.: Re 27,491; 2,379,790; 2,560,351; 2,757,232; 2,993,087;

3,001,460; 3,003,391; 3,107,578; 3,127,517; 3,205,767; 3,229,574; 3,237,513; 3,255,026; 3,260,152; 3,269,847; 3,272,646; 3,275,442; 3,278,317; 3,317,321; 3,322,025; 3,331,920; 3,403,262; 3,443,868; 3,467,468; 3,473,863; 3,482,916; 3,493,300; 3,504,971; 3,519,347; 3,536,402; 3,552,824; 3,574,458; 3,577,898; 3,585,281; 3,594,080; 3,630,809; 3,635,555; 3,647,296; 3,649,118; 3,653,759; 3,676,591; 2,679,290; 3,680,956; 3,681,521; 3,694,074; 3,697,174; 3,703,388; 3,704,061; 3,708,676; 3,714,430; 3,724,947; 3,726,584; 2,968,556; 3,193,509; 3,440,051; 3,482,978; 3,486,897; 3,563,748; 3,574,629; 3,672,898; 3,687,670; 3,681,081; 3,714,055; 3,723,422; 3,746,539; 3,322,678; 3,511,653; 3,645,909; 3,660,299. In making this patent search the following classes and subclasses were searched.

| Class | Subclasses |
|---|---|
| 95 | 12.2 |
| 350 | 160, 160P, 166, 171, 172, 173, 288, 290 and 314 |
| 355 | 32, 35, 38, 68, 71 and 77 |
| 356 | 175 |
| 252 | 300 |
| 96 | 84 |

Also, where appropriate the pertinent teachings from the above listed patents are incorporated in this disclosure. In U.S. patent numbers there is listed the following patents:

| PATENTEE | U.S. Pat. No. |
|---|---|
| Brimberg | 2,112,010 |
| Bowker et al | 2,519,347 |
| Sites | 2,567,240 |
| Johnson et al | 2,575,714 |
| Carlson | 3,085,469 |
| Rogers | 3,443,859 |
| Choate | 3,496,662 |
| Deb et al | 3,521,941 |
| Balint | 3,533,693 |
| Hamann | 3,645,188 |
| Paulus | 3,724,947 |
| Becker et al | 3,792,423 |
| Castellion | 3,807,832 |
| Deb | 3,829,196 |
| Maricle et al | 3,844,636 |
| Tulbert | 4,076,414 |
| Japan | 34-24719 |
| Japan | 38-48101 |

In FIG. 30 there is presented a system for using variable density filters 400, 402 and 406. The variable density filters 402 and 406 have the ability to reflect light waves certain Wave lengths, transmit light waves of certain wave lengths and absorb light waves of certain wave lengths. An example of such a filter is filter 126, see FIG. 13. And also filter 92, see FIG. 8. These two filters have reflective layers for reflecting wave lengths and for transmitting wave lengths and also have photochromic materials or phototropic materials. Further, filter 110 of FIG. 10, filter 114 of FIG. 11, and filter 120 of FIG. 12 can be used when the photochromatic and phototropic materials are in the reflective layers. Again, these variable density filters should have absorption materials such as dyes for absorbing light of certain wave lengths.

The light waves 144, 152 and 154 come from the geometric image 150 and strike the variable density filter 402. The light waves 144 are transmitted and a majority of the light waves 152 and 154 are reflected with some of these light waves being absorbed. The light waves 152 and 154 from the variable density filter 402 strike the variable density filter 400. The majority of the light wave 152 is transmitted and the majority of the light wave 154 is reflected. Again, a small per cent of the light waves 144 and 152 are reflected. The light waves from the variable density filter 400 strike the variable density filter 406. A majority of the light wave 154 is transmitted and a small per cent of the light waves 144, 152 and 154 are reflected to form the complementary color.

As is seen in FIG. 29, there is a scanning means 270 for the filter 400 and which scanning means 270 connects by means of an electrical connection 300 to a writing head 334 for writing on a recording material 336.

Associated with the variable density filter 402 is a scanning means 278 which connects by means of electrical connection 302 with a writing head 340. The writing head 340 writes on the recording material 342.

There is associated with the variable density filter 406 a scanning means 286 which connects by means of an electrical connection 304 with a writing head 346. The writing head 346 writes on the recorded material 348.

Also, associated with the variable density filter 406 is a scanning means 310 for scanning the complementary color or the colors for 144, 152 and 154. The scanning means 310 connects with an electrical connection 314 to the writing head 352. The writing head 352 writes on recording material 354.

The above system is a photographic system as it does not employ a lens. There may be a sensor and control 290 having a lens 320. Then, there is a lens system.

There may be associated with the variable density filter 402 an exciting means 268; there may be associated with the variable density filter 400 an exciting means 276.

There may be associated with the variable density filter 406 an exciting means 284.

The writing heads 334, 340, 356 and 352, to repeat, may be a high intensity source of energy such as a monochromatic light or a pulse laser or a polychromatic light or light from a quartz-iodine lamp or a carbon arc or may be writing heads for magnetic tape, paper tape or hollerith cards, to name a few.

The recording material 336, 342, 348 and 354 may be a photosensitive emulsion, metal, plastic, paper and the like.

FIG. 31 is similar to FIG. 17. FIG. 31A is a schematic illustration of the apparatus for separating light waves. FIG. 31B is a block diagram illustrating the separation of light waves. One or more of the light waves 144, 152 and 154 can be received by 430, a gathering means for the light waves or a recording means or a transmitting or conveying means. The light waves 144, 152 and 154 can contain information. At 432 there is a mechanism for converting the information in the light waves to digital information 434. Then, there is a mechanism 436 for converting the digital information into a form which can be shown on a display 438. The display 438 may be a cathode ray tube, a projector for projecting information onto a screen, electric light bulbs which go on and off for showing the information or light emitting diodes for showing time information, to name a few.

Another path is for the mechanism 440 to receive the information from 430 and to convert the information into analogue information 442. The analogue information is converted by a mechanism 444 into a form which can be used in the display 438. Another path is that for the digital information to be converted by a mechanism 448 into analogue information 442. Then, again, the analogue information 442 can be converted by mechanism 444 into a form which can be shown on display 438.

Display 438 may be a cathode ray tube as used in a television set. In a television set the information is analogue information. However, there is research and development work for using digital information to be converted into a form which can be shown on the display 438. The digital information is so used as to form a better signal which is converted into analogue information for display on the cahtode ray tube. It is conceivable that in time the digital information can be used as such with a cathode ray tube display 438. Also, electric light bulbs can be used in an on-off state to illustrate digital information. Likewise, light emitting diodes can be used to display digital information.

FIG. 32 is similar to FIG. 23 FIG. 32A is a schematic illustration of the optical system and is based on FIG. 27. FIG. 32B is a block diagram of the optical system and is based on FIG. 23. FIG. 33 is similar to FIG. 27 FIG. 33A is a schematic outline of the optical system. FIG. 33B is a block diagram of the optical system FIG. 34 is similar to FIG. 29 and is based on FIG. 29. FIG. 34A is a schematic diagram of the optical system, FIG. 34B is a block diagram of the optical system.

FIG. 35 is similar to FIG. 30 and is based on FIG. 30. FIG. 35A is a schematic diagram of the optical system. FIG. 35B is a partial schematic diagram of the optical system. FIG. 35C is a partial schematic diagram of the optical system. FIG. 35D is a block diagram of the optical system.

The comments with respect to FIGS. 23, 27, 29 and 30 are also applicable with the corresponding FIGS. 32, 33, 34 and 35. In FIGS. 32, 33, 34 and 35 it is seen that the electrical connections 300, 302, 304 and 314 connect with 410, a gathering means or a recording means or a transmitting or conveying means for the information being conveyed from the photoscanner by electrical connection 300, 302, 304 and 314. The unit 410 may collect information from only one of the electrical connections or any combination of the electrical connections for the photoscanner. The analogue formation 412 from the photoscanners can be converted in mechanism 414 for illustration in the display 416. Or, the digital information 418 from the photoscanners can be converted by mechanism 420 for transmittal to the display 416. Another processing step is to take the digital information 418, and by mechanism 422 convert digital information into analogue information 412. Then, the analogue information 412 can be converted by mechanism 414 for conveyance to display 416. As previously explained with respect to FIG. 31, the display 416 can be a cathode ray tube, a projector for projecting onto a screen, electric light bulbs which go on and off to convey a message or a light emitting diode, to name a few of the elements which can be used in the display 416. Again, a common form of a cathode ray tube and the use to which it is placed is a television set. Most television sets function on analogue information. However, there is research and development work for using digital information to make a better picture on the television set. This digital information can be converted into analogue information for use in a cathode ray tube such as in a television set. It is conceivable that in time the digital information can be used without the necessity of going through the analogue information step for use in the display 416. Also, the information from the photoscanners can be processed so as to be projected onto a screen by a projector. A multiplicity of electric light bulbs can be arranged to display information. These electric light bulbs can be activated by analogue information or can be activated by digital information, with the proper equipment. Also, light emitting diodes can be activated by digital information and conceivably by the analogue information, with the proper equipment.

The chromatic bit disc storage system is a means to achieve an eightfold or larger increase of bit density storage in an optical storage system. The storage system is a computer adjunct for the storage of information used in or for, or both, calculations or control of external associated systems. The chromatic bit disc storage system is inherently denser in its ability to store information than a comparable optical storage system that is not chromatic. A chromatic bit is meant to mean that each bit has a value or weight by virtue of its chroma or color value. A chroma or color value is associated with a narrow bandwidth of electromagnetic radiation. A combination of bits can express values greater than their binary (number) value. Further, in the same cross-sectional area of a comparable optical storage system which describes one bit the chromatic bit disc storage system may store up to eight bits or more such as sixteen bits which is the equivalent of a byte of information for an eight bit byte computing system or two bytes of eight bits per byte.

The concept of imparting a weight or value to a bit, beyond its binary (number) value is sound in expressing that weight or value in a discrete color assignment. Such an assignment is made optically by coloring that bit by storing it in a medium that for a binary $\phi$ is clear to all wave lengths of light and for a binary 1 is optically dense over a clearly defined region of wave length light waves or over a narrow bandwidth of electromagnetic radiation. By sandwiching successive layers of different mediums (different in their abilities to pass the full spectrum of light when storing a binary 1) the storage density per given area rises proportionately or arithmetically to a number of layers of different mediums but the storage of information rises exponentially to the number of layers of different mediums.

There are two ways to achieve this increase in storage density. One of the ways is the subtractive filtering system. Another way is the additive filtering system.

The subtracting filtering system requires two or more sources of monochromatic light waves. There are two or more detectors. The number of detectors equal the number of sources of light. Each detector is sensitive to only one source of light in that the detector is responsive to a narrow band width of the spectrum. The detector is responsive to only one monochromatic source of light and whose output falls within the detectors's useable sensitivity. The subtractive system requires a storage medium which contains at least two filter layers (to match the two sources of monochromatic light) that pass all light of the sources for a binary $\phi$ stored within their medium or that pass only one wave length from one source of light to be detected by one detector for a binary 1 stored within their medium.

The number of filter layers equals the number of sources of discrete and separate monochromatic light waves, viz., a light wave of narrow bandwidth of electromagnetic radiation and the number of detectors for detecting the monochromatic light waves. The additive-filtering system requires two or more sources of monochromatic light waves. The additive system also requires two or more (this is to match the number of sources of monochromatic light waves) detectors of the monochromatic light waves. Each detector is sensitive to only one source of light wave (in that it is responsive to a narrow band width of the spectrum, and responsive to only one source which is monochromatic and whose output falls within that detector's useable sensitivity.) The additive system also requires a storage medium which contains at least two filter layers (to match the number of sources) that pass all light of the sources for a binary $\phi$ stored within their medium or pass all light of the sources except one for a binary 1 stored within their medium. The number of filter layers equals the number of sources of discrete and separate monochromatic light waves and the number of detectors for detecting the monochromatic light waves.

There is illustrated in FIG. 36 an example of the subtractive filtering system for storing chromatic bits. Such a system includes a source "A" composed of eight light emitting diodes, $L_1$ through $L_8$; a collimating apparatus 860; and a system "B" shown in a partial side view cross-section composed of eight layers labeled in their weight or value as 1, 2, 4, 8, 16, 32, 64, 128 as based on the binary system; a detector "C" with eight wave length sensitive sensors, $Q_1$ through $Q_8$ and a collimating apparatus 862. In this process each sensor is receptive to only one monochromatic wave length. Each of the eight light emitting diodes, $L_1$ through $L_8$, is of a discrete and different monochromatic wave length. The sensor "C" comprises eight detectors each of which responds to the monochromatic wave length of one light emitting diode $L_1$ through $L_8$. For example, only $\phi$ will respond to the monochromatic wave length from $L_1$ and it will respond to no other. It is to be under'stood that $\phi$ is a bit.

The shade portions correspond to a bit or to a 1. Each layer's bit has a particular color characteristic illustrated in FIG. 37. As each shade portion or each bit passes between source "A" and sensor "C" only one bit can be stored because this is a subtractive process, i.e., two bits would block out all light. In FIG. 37 there is schematically illustrated the wave lengths of the light waves from the eight light emitting diodes $L_1$ through $L_8$, in the upper part of the figure and in the lower part of the figure there is illustrated the wave lengths and the percent of intensity for the sensitive sensors, $Q_1$ through $Q_8$.

There is illustrated in FIG. 38 an example of the additive filtering system for storing chromatic bits. The additive system is similar to the subtractive filtering system for storing chromatic bits. A difference between these two systems is found in the method by which the bit is stored as a color within the medium of the storage system. In FIG. 38 there is illustrated a system which includes a source "D" composed of eight light emitting diodes $L_1$ through $L_8$, and a collimating apparatus 864; a storage system "E" illustrated in partial side view cross-section composed of eight layers labeled in their weight or value as 1, 2, 4, 8, 16, 32, 64, and 128; a detector "F" with eight wave length sensors $Q_1$ through $Q_8$ and a collimating apparatus 866. Each of the eight light emitting diodes $L_1$ through $L_8$, is of a discrete and different monochromatic wave length. In FIG. 39 in the upper part of the figure there is illustrated the wave lengths and the range of intensity from 0% to 100% for the eight light emitting diodes, $L_1$ through $L_8$. In the lower part of FIG. 39 there is illustrated the wave length band and the intensity from 0% to 100% for the eight wave length sensitive sensors $Q_1$ through $Q_8$. In this process the sensor receives any number of different colors or different wave lengths of light. The sensor "F" comprises eight detectors each of which will respond to only a single color or only one monochromatic wave length.

The shaded portions correspond to bits stored as filter elements in the substrate. Each shaded portion or each filter element blocks one monochromatic wave length from one light emitting diode and allows the rest of the monochromatic wave lengths from the light emitting diodes to pass without attenuation. In the additive filtering system the successive layers of bits or filter elements do not block all light as in the subtractive process.

In the hypothetical case illustrated in FIG. 36 for the subtractive system a bit of binary 1 is stored as a patch of optically dense medium large enough such that when it is collinear with the source "A" for the monochromatic light waves and the detector "C" for the monochromatic light waves it passes only one source color light wave. Each layer of medium has a singular light transmission versus wave length characteristic as illustrated in FIG. 37. These charts illustrate the wave length of the light waves from the eight light emitting diodes $L_1$ through $L_8$, and the wave lengths and the percent of intensity for the sensitive sensors, $Q_1$ through $Q_8$.

Each layer of medium must, in the subtractive system, be capable of passing only one monochromatic light wave and rejecting or greatly attenuating all other monochromatic light waves. Further, each layer of medium should be different in its filtering characteristics from all of the other layers.

In the hypothetical case illustrated in FIG. 38 for the additive system a bit of binary 1 is stored as a patch of optically dense medium large enough such that when it is collinear with the source "D" for the monochromatic light waves and the detector "F" for the monochromatic light waves it passes all source color light waves except one monochromatic light wave.

Each layer of medium ill the additive system must be capable of passing all monochromatic light waves except one monochromatic light wave. In the additive system the layer of medium filtering characteristics will reject or greatly attenuate only one monochromatic light wave while passing all other monochromatic light waves.

In the subtractive system and in the additive system all layers will pass all monochromatic sources for a binary $\phi$ stored.

In FIGS. 40 and 41 there is illustrated the physical arrangement of components for one method of incorporating the chromatic bit disc storage system. FIG. 40 is a top plan view and FIG. 41 is a side elevational view of the components. 868 is a synchronous platform drive system for synchronously moving together the light head 870, a source of monochromatic light waves, mounted on platform 872 and light detector head 874 mounted on platform 876. 878 is a screw drive coupled to the drive 868. The platform 872 is mounted on the screw drive 878. 880 is a screw drive coupled to the drive 860. The platform 876 is mounted on the screw drive 880. 882 is the drive motor and 883 is the hub for driving the disc 884. In FIG. 42 the disc 884 is also shown in a fragmentary partical enlargement to illustrate the layering of the different mediums.

In FIG. 41 and to the right in FIG. 42 there is an enlargment of a fragmentary part of the disc 884 having eight layers of material and of which each layer responds to a certain band width of light waves or a certain color or a single color or a certain width of the wave lengths of color. These eight layers of material are identified by reference letters A', B', C', D', E', F', G' and H', see FIG. 41. The layers of the disc 884 comprise different chemicals which respond to different wave lengths of light or different electromagnetic wave lengths.

FIG. 41 is a side elevational view of a schematic illustration of the apparatus and FIG. 40 is a fragmentary top plan view of a schematic illustration of the apparatus for admitting light waves of certain wave lengths from the light head 870 for the monochromatic light waves and also for receiving the light waves in the detector head 874 after the light waves have passed through the layers A', B', C', D', E', F', G' and H' in the disc 884.

This invention is directed to the generation, transmission, and recovery of selective wave length or monochromatic wave length electromagnetic radiation. Electromagnetic radiations with which most of us are familiar are the visible light spectrum. In this regard there is no distinction in any or all of the selective wave lengths of electromagnetic radiation being visible or invisible to the human eye. The means of detection of electromagnetic radiation is not related to and is not restricted to the visible spectrum. The term color separation may be invoked as a convenience of analogy. However, this does not limit the invention's usefulness to that portion of the electromagnetic specturm known as light or the visible spectrum. In fact, there is much application outside the visible spectrum. Those aspects described above as generation and transmission of selective wave length electromagnetic radiation are detailed in Schurman et al U.S. Pat. No. 4,506,626, issuing date of 26 March, 1985. That aspect described above as recovery of selective wave length electromagnetic radiation is detailed in patent of Robert E. Pearson, U.S. Pat. No. 4,355,888, issuing date of 26 October, 1982. With the combination of these technologies there is a novel technology, our invention, which may be used for the storage of mass data, both analog and digital, by optical means. By virtue of this technology the potential storage capacity is many orders of magnitude over that of currently available mass data storage systems. Further, this increase in the storage capacity may be accomplished without sacrificing speed in the processing of data or with physical constraints of the system size.

The medium for the storage of information can be many materials. For many years paper was used in large quantities. One of the favorite paper forms was the Hollerith card. Another paper form was paper tape. In recent years there has come into favor a magnetic medium. Also, another desirable storage medium is the compact disc and laser technology. All of these storage mediums are two-dimensional, viz., length and width, and are limited in storage capacity by surface area. As contrasted with a two-dimensional storage medium our invention is three-dimensional, viz., length and width and depth. The storage capacity of our invention is not limited by surface area. In our invention there is a packing factor and for a given surface area it is possible to have a packing or a stacking of information. There are layers of storage medium. As a result of these layers: of storage mediums it is possible to store more information than a two-dimensional storage medium can store. For example, a four layer storage medium can store at least four times the information of a single layer storage medium and, possibly, store twenty-four times ($4 \times 3 \times 2$) the information of a single layer storage medium.

As previously stated, current technology uses a magnetic media for the storage of information such as computer data in digital form. The magnetic media is used in many applications such as recording belts for recorders and transcribers; recording tapes as found in open reels and casettes; and, discs specifically used for computers such as floppy discs and hard discs. Access time is a term that denotes the time interval between a request for data transfer and the data transfer being accomplished. Current technology in magnetic media has been limited to an access time of 1 millisecond (1 ms.) to 100 milliseconds (100Ms.). This time limitation is actually a function of the hardware being used with the media. That is, there is a matter of physical. inertia in the movement of the read/write heads used with the magnetic media that limits the access time. With a decrease in the physical inertia and less time required for the movement of the read/write heads the access time is lessened.

Optical data storage mediums have come into the marketplace in the form of read-only discs that have been permanently imbedded with digital or binary information. A high power laser "burns" a permanent surface blemish in the form of a bubble or conversely a hole in the metallic surface of the medium, typically a tellerium based material. The blemishes are then "read" by a low power laser to demonstrate a binary code, either a "1" or a "0" depending upon the photodetection response. A distorted light bounced from the surface of a bubble or passed through a hole would serve to generate a distinct difference in characteristic than an un-blemished and consequently undistorted reflective surface.

Such examples of this approach can be found in audio-visual works of art on "Compact Disc—Read Only Media" or more popularly called "CD-ROM". The limitation is obvious. The user has no ability to reverse the surface blemish—it in fact is a permanent and destructive change to the media. The disc can only physically accomodate as many blemishes as the physical surface will allow. Once filled, regardless of whether the binary code is correct, the disc can only be read by the user.

Research in the past has demonstrated another approach which would provide a limited "Write" capability. This achievement allows the user to write binary information to the disc for retrieval by reading at a later point in time.

The technique requires an amorphous crystalline material that shifts in refractive index if exposed to a specific light frequency. Upon exposure to an alternate light frequency the structure returns to the original baseline refractive index.

The amorphous crystalline media is mono-layer by nature and could not, by present description, provide for multiple layers of binary information to be written and read.

The media of choice would be a material that would allow a read and write capability with a corresponding capability to accomodate more than one layer of information on one side of the physical disc. The material must have a characteristic similar to the amorphous crystalline and have the ability to respond to one light frequency while allowing other spectral light frequencies to pass through the surface undistorted to additional layers.

A crystalline structure exists in organic form that ideally provides spectral frequency specific response and allows other spectral frequencies to pass spectrally undistorted.

An examination of the process of photosynthesis demonstrates the principle in mind. At the cellular level one can observe a large protein complex embedded in the cellular membrane. Smaller "helper" molecules, such as chlorophyll, ar found imbedded inside the large protein complex. The helper molecules provide the conductive path that photoelectrons follow during photosynthesis. The photosynetic reaction occurs when a photon strikes chlorophyll molecules located near the inner surface of the membrane. The photoelectron is passed to a pheophytin molecule. When the photoelectron makes its transfer it leaves a positive charge on an adjacent chlorophyll molecule. The photoelectron continues its travel to a quinone molecule where it affects a cytochrome molecule to take a positive charge. This excited electron then makes a final transfer to a second quinone molecule. The result is a stored energy and a neutralization of charge permitting the entire process to re-occur. The polarization of the molecules occurs in approximately four trillinoths of a second.

The source of the photoelectrons in nature is of course the sun—a wide, spectrum light source. During the spring when plant metabolism is accelerated to generate growth the spectral characteristic of the sunlight contains a wider range of spectral character than during the summer, fall and winter due simply to the relative position of the earth to the sun's rays. At summertime the axis of the earth is in a position to receive the optimum spectral bandwidth. During fall and winter the shorter wavelengths are attentuated by the atmosphere and earthly position. The plant undergoes a change in spectral exposure that results in physical and matabolic changes. A representative example whould be the leafy tissue undergoing a stable color change due to an increase in infrared exposure and a reduction in exposure to the shorter wavelengths such as ultra and near ultra violet.

The photosynthetic and seasonal tissue change can be duplicated in an artifical spectral enviroment. A winterlike change in physical character can occur by stimulation with greater amounts of near ultraviolet radiation. The result will be a distinctive change in the spectral and refractive character of the cytochromatic molecule, Conversely, stimulation with near ultraviolet and adjacent wavelengths will result in an exactly opposite change in cytochromatic response or spectral and refractive character. The actual change occurs as a result of the refractive character of the molecule.

The molecules of cytochrome must be imbedded in a suitable enviroment to provide the desired reactive changes. Such a medium might be a hydaphobic polymer. The media might also be a chemically stabilized envelope that permits the molecules to be "sandwiched". Another approach might be to allow a tissue type medium developed by recombinant DBA techniques to facilitate a natural organic enviroment.

The optical read-write device will stimulate each layer of material with a different spectral characteristic thus permitting selective access to a specific layer depending upon the respective layer's spectral requirement. Upon stimulation with a specific wavelength the cytochromic material will react by physically changing it's refractive character to the extent that a low power light source can scan the area and perceive a change in refractive character so as to be interpreted as a binary code. The actual shift in character of the cytochrome is correspondent to the wavelength of spectral radiation. Therefore, the cytochromic material will react differently to different spectra. This difference is of sufficient measurable consequence to allow multiple layers that react distinctively as to position in the stack of layers, wavelength of light in use and spectral character of the dichroic interference layer between each layer of cytochromatic material.

The practical results are layers of cytochromic material that have extreme refractive changes when stimulated by infrared wavelength and far less refractive change when stimulated with an untraviolet wavelength. The layers between the aforemetioned spectral extreme would react to intermediate wavelengths in a similar manner. In combination, the assorted wavelengths create a working spectral bandwidth that permit spectrally dependent layers of photoreactive material that selectively reflect or transmit light depending upon the wavelengths used. The infrared layer, or for that matter any other layer in the stack, will react selectively and store a binary code for retrieval. Thus, a red responsive layer will store red binary code, a yellow layer will store a yellow binary code, a green layer will store a green binary code and a blue layer will store a blue binary code. Upon retrieval with an appropriate light spectrum each layer can be selectively accessed for retrieval or encoding without effect upon adjacent layers. Correspondingly, a wide spectrum source can be used to access a specific assortment of layers so long as the light spectrum only contains that specific combination of wavelengths that complement the layers to which access is desired. This specificity of accessability is dependent upon the dichroic interference layer between each cytochromic layer.

Our optical storage system does not directly attend to the issue of physical inertia of the physical components and will therefore have similar access time. However, by virtue of our technology's use of light generating and light detecting components, the use of fiber optics can significally reduce the mass of our physical components such as read/write heads to a mass where access time is considerably shortened. Our physical considerations include the fact that the greater surface area that a storage media encompasses, the greater amount of data that may be stored in that storage area. Our optical storage system may be identical in two-dimensional size as compared with existing storage systems such as magnetic media and compact discs and yet store more media. This increase in storage capacity is due to our use of the optical media which can store more information in layer of storage medium per given area than a single layer of magnetic media.

Our invention brings together two or more sources of radiant flux or electromagnetic waves. Each source of electromagnetic waves is distinct from any other source in terms of its dominant electromagnetic wave length, and then directs their combined flux of electromagnetic waves through the layers of storage medium in our optical storage medium. The optical storage media may take the form of a disc, tape, or cube. The detection system is capable of separating out time original special components or the electromagnetic waves from the source of radiant flux.

As with any system, the transmission and reception of power, with a minimum of loss due to mismatch, provides a stable system and also one that is efficient In achieving a high bit density in a given area of storage media there is a corresponding lowering of bit area. Thus for our claim of increasing memory density through the use of our invention we anticipate that we must work with storage cell areas correspondly smaller than those encountered in the available magnetic media storage. To this point it should be noted that to reliably read this cell requires that it should appear to be a point source of radiant flux to the detection system. To provide a higher signal to noise ratio, apertures are placed on both sides of the cell. One aperture lies between the cell and the source of radiant flux to mask adjacent storage cells from the radiant flux. Another aperture lies between the cell and the detection system to mask any spurious transmission of radiant flux from adjacent memory cells. Typically such apertures would have a radius on the same scale as the cell that is being masked. By the use of apertures, the cell appears to become a point source of radiant flux when radiated on one side by a true source of flux, and viewed on the other side by the detection system. For any increase in memory density there is a corresponding decrease in both bit cell size and the amount of flux passed through it if there is no corresponding increase in source flux density.

Thus flux density within the area of a storage cell becomes the most important specification when defining source and detector requirements. And by extension, it may also be related to flux density within the area of the aperture. Presently, optical fiber technology provides fiber radii on the scale of 100 μm (micrometers) As such a fiberoptic could be used to define the aperture, serve as a conduit for radiant flux from the source to the optical storage media, and also serve as a conduit for radiant flux from the storage media to the detection system. A fiber optic 10 inch diameter disc design would result in a storage system capacity of 100 million bits. This is achievable only if enough power or radiant flux is transmitted to the optical storage media. At this Dower requirement, it is difficult to couple incandescent sources to fiber optics. Other factors to consider are that a lens system is expensive and requires filtering of the radiant flux to provide the necessary light wave length spectrum. With a lens system it is necessary to maintain critical alignment, bulb geometry, and focusing to efficiently couple radiant flux to the small cross-section of a fiber optic head. As contrasted with a lens system and its' associated problems light emitting diodes, infra red emitting diodes and injection laser diodes all provide high power of flux density over a narrow band width of radiant flux or a narrow spectrum from a source of radiant flux that is physically on the same scale as fiber optic cable. These sources, light emitting diode infra red emitting diodes and injection laser diodes are suited for coupling radiant flux to the small radii of fiber optics.

Again, for the sake of convenience, the discussion that follows uses concepts of colorimetry and optics to describe the principles of our invention and this does not imply that our technology is restricted to operation within the wave length bounds of that region of electromagnetic radiation known as "light" or "visible light."

In our invention we take several distinct and separate sources of monochromatic wave lengths and connect their outputs to light conducting fiber optics. These fiber optic leads are in turn fed into a fiber optic device capable of integrating the combined distinct and separate monochromatic wave lengths into a single output fiber optic. Such devices are presently available for non-colormetric application and by analogy operate in much the same way as directional couplers of present microwave technology. The single fiber optic lead then serves to both conduct time radiant flux of several monochromatic lights and to define its flux density at the terminus of the fiber optic. That is the fiber optic end becomes the aperture to assist in the illumination of the memory cell in the optical storage media. Discs using magnetic media are a popular form for storing information. We wall use them as a standard and adapt the discs to support our optical storage media. Again, using available technology, specifically fiber optics whose cross-section diameter equals 100 micrometers, we can save up to 100 million bits on a 10 inch diameter disc provided there are 10 color layers ill each cell. Or, if the cell structure is amorphous there is a color property off time cell such that it may pass the wave lengths of one, all, or any combination of the remaining sources. The combined radiant flux or the distinct and separate monochromatic lights pass through this memory cell and as a result of color selective attenuation a unique transmission of radiator flux is coupled to the detector disc fiber optic lead. This unique transmission is composed of the non-attenuated components of the original distinct and separate lights. This represents an encoding of the original monochromatic wave lengths by the optical properties of the optical storage media. To decode this transmission of the monochromatic wave lengths the non-attenuated components applied to time detector side fiber optic is transmitted to a system of variable dichoric filters and photo detectors. This system separates the monochromatic wave lengths into components or distinct and separate momochromatic wave lengths. Each component is measured with a photodetector to determine the optical transmissiveness of the memory cell's media. For example, a 10 layer cell, or for an amoprhous structured cell with an attribute to pass the flux of one, all or any combination of the sources while obstructing the flux of the remaining sources, a point in memory storage has been transformed from a cell having one bit of significant information to a cell having a byte of 10 bits of significant information.

In FIG. 4 there is an oblique view of the major components in our optical storage system. 890 is a disc with four media layers. Each layer is distinct from the other with respect to its specific attenuation of monochromatic light. 892 is the support arm for optical leads 894 and 896 (not in view.)

FIG. 44 is a side view of the same components as viewed in FIG. 42. This view includes a center-line to show axial alignment of optic heads 894 and 896.

FIG. 45 is an oblique fragmentary cross-sectional view detailing the layers of media 898, 900, 902 and 904 that comprise the optical storage disc 890. Also shown are apertures 906 and 908. A line drawn from the center of one, 906, aperture to the center of the other, 908, is normal to the plane described by each layer within the disc 890. The distance between each aperture is slightly larger than the thickness of the disc. This is to allow for non-contact operation but does not restrict the use of optical buffering solutions nor does this preclude operation where the optical heads are in constant contact with the storage disc.

FIG. 46 is a fragmentary cross-sectional view of the main components showing an example of the relationship between the following hardware components, 910, 912, 914 and 916. Each component is a monochromatic source of wave length whose dominant wave length is different from any of the other wave lengths. Fiber optics 918 conduct the flux from each source of 920, an optical directional coupler with four inputs. The combined flux is passed through fiber optic 922 to aperture 906 and the top layer 898 of the disc 890. The flux radiates through layers 898, 900, 902 and 904 of disc 890 to the detector assembly aperture 908. Variable dichroic filters 922, 924 and 926 and detectors 928, 930, 932 and 934 are arranged approximately as described by Pearson for the purpose of illustration. 894 and 896 are light tight enclosures except for an appropriate aperture. All flux transmissions are directed out 905 aperture normal to the plane of the disc and its layers. Flux reception is through 908 aperture and the optical alignment of the separation process is along a line through the aperture and normal to the plane of the disc.

The enclosure 896 comprises a number of walls such as a bottom wall, side walls and a top wall 907. The enclosure 896 can be a cube. The top wall 907 has an aperture 908. Light waves enter time enclosure 896 through the aperture 908. In the enclosure 896 are the detectors 928, 930, 932, and 934. Electrical lines 936 connect with these detectors. In the side wall 937 of the enclosure 896 there are seals 938. The electrical lines 936 pass through these seals. Naturally, the seals 938 prevent the flow of light waves into the enclosure 896 through the aperture in the wall 937 and which aperture is around the wire 936. The objective is to eliminate stray light entering the enclosure 896. Therefore, the aperture 908 in the wall 907 is a small aperture. The walls of the enclosure are sealed. One of the ways of sealing the walls is to have seal 938 around the apertures in the walls and through which apertures the electrical lines 936 pass.

Enclosure 894 also comprises a number of walls such as side walls, a top wall and a bottom wall. In effect, the enclosure 894 can be a hollow cube. In the side wall 939 there are a number of openings 940. Electrical wires 941 connect with the monochromatic sources of light waves 910, 912, 914 and 916. In the wall 939 there are a number of seals 942 in the apertures. The electrical lines 941 pass through the seals 942 and the apertures in the wall 939.

There is a bottom wall 943 in the enclosure 894. In the bottom wall 943 there is the aperture 906. The fiber optic 922 passes through the aperture 906 or projects through the aperture 906. A seal 944 is positioned in the aperture 906 and between the fiber optic 922 and the wall 943.

The walls of the enclosure 894 are impermeable to the passage of light waves and the seals 942 and 944 prevent the passage of light waves. The objective is to prevent stray light waves entering into the interior of the enclosure 894. This is achieved by having the walls 894 impermeable to the passage of light waves and also with the use of seals 942 and 944.

In the disc 890 there are four layers of material, see FIGS. 44 and 45. The reader is to understand that the four layers of media 898, 900, 902 and 904 are for illustrative purposes only. It is possible to have many more layers than four. For example, it is conceivable that there can be 256 layers so as to have thirty-two bytes of eight bits each. In the disc 890 there is the shaded portion 936 in the layer 898; the shaded portion 948 in the layer 900; the shaded portion 956 in the layer 902; and, the shaded portion 952 in the layer 904. The shaded portions correspond to bits shorted as filter elements in the substrate. Each filter or each shaded portion blocks one light wave of a specific bandwidth and allows the rest of the light waves to pass without attenuation. As a result successive layers of filters or shaded portions do not block all of the light. The reader readily appreciates that a shaded portion corresponds to a bit. In fact, a portion which is not shaded can correspond to a bit such as a 0 and shaded portion can correspond to a bit such as a 1 as is used in the binary code.

The current technology of optically stored digital memory allows recovery (reading) of stored digital data and one time only writing of digital data. That is, the storage media may be written only once and may not be erased or overwritten. However, the media may be read as many times as may be wished without degrading the ability to read at any time in the future. As such, the present optical storage systems find an analogue in the solid state technology of the masked read only memory. The substance of this disclosure describes a means and media that may be used to both read and write digital data with an optical storage system. Given this teaching it is possible to build an optical storage system that is eraseable and re-writable. With such a system, data is truly random accessible for both reading and writing operations (whose analogue is found in conventional manetic media storage disc systems.)

The following is a description of the components used with reference to FIGS. 47-53.
- 960 High intensity monochromatic source: May be light emitting diode, laser L.E.D. (solid state laser), in monochromatic light waves from dichroic filters.
- 962 Light collimator (shown as a prism).
- 964 Low intensity monochromatic source of light waves like source 960 in key parameters of dominate wave length.
- 965 Optical storage disc.
- 966 Storage disc medium.
- 967 One cell of medium 966 of disc 965.
- 968 One cell of medium 966 of disc 965.
- 970 One cell of medium 966 of disc 965.
- 972 One cell of medium 966 of disc 965.
- 974 Optically clear base supporting medium 966 and resembles a clear circular plate or disc.
- 976 Optical sensor that is sensitive to the emissions of high intensity monochromatic sources 960, 964, 982 and 986.
- 978 Indicator of power, voltage and current whose use indicates output 1008 from sensor 976.
- 980 One cell of medium 966 on base 974.
- 982 High intensity monochromatic source of a dominant wave length different than the wavelength of the source 960.
- 984 Light collimator such as 962.
- 986 Low intensity monochromatic source of light waves that matches 982 in key parameters of dominant wave length.
- 988 One cell of medium 966 on base 974.
- 990 One cell of medium 966 on base 974.
- 992 One cell medium 966 on base 974.
- 994 One cell of medium 966 on base 974.
- 1000 Signal/power applied to source 960.
- 1002 Monochromatic wave length emission from 960.
- 1004 Signal/power applied to source 964.
- 1006 Monochromatic wave length emission from 964.

1008 Signal/power/current/voltage from sensor 976.
1010 Signal/power applied to source 982.
1012 Monochromatic wave length emission from 982.
1014 Singal/power applied to source 986.
1016 Monochromatic wave length emission from 986.
1018 Cell chromatic density (graphic key for illustration) denotes low optical density to sources 960 and 964.
1020 Cell chromatic density (graphic key for illustration) denotes low optical density to sources 982 and 986.

FIG. 47 illustrates an example of the relation of components in an optical storage system capable of one writing operation and unlimited read operations. FIG. 48 does not illustrate how the writing and reading operations are accomplished. For the purpose of illustration and discussion the optical purposes of the optical storage disc 965 and its components 974 and cells 967, 968, 970,972, 90. Later, in the presentation 988, 990, 992 and 994 are portrayed in terms of optical transmission density. The reader should understand that the basis of utility of the optical storage disc can also be expressed in terms of optical reflectivity. The media for storing digital data can be read and written by a system employing similar components of FIG. 48 arranged to measure the reflected power emitted to the disc from monchromatic wave length sources 960, 964, 982 and 986, see FIG. 49.

FIG. 49, similar to FIG. 48, shows only the relationship of components arranged to measure optical transmission density due to the nature of the disc storage medium 966. Another arrangement of the components can be established to measure the power reflected from the optical storage disc 965. The emitted power is from the sources 960,964,982 and 986.

For the purposes of discussion and illustration some of the optical storage medium 966 optical characteristics will be based on but not restricted to the use of chlorophyll crystals derived from vegetable matter.

The princiapl requirement for an optical storage medium that can be erased, written on, or re-written on is that there be some means to both detect and cause a state change within the medium that corresponds to the digital state of one bit of digital data. There must be a binary characteristic in regard to either (or, both) the medium's optical density or optical reflectivity. chlorophyll crystals as well as some other substances, when properly illuminated display this required binary state.

The chemical must have the ability to transmit or reflect a narrow range of electromagnetic wave lengths to have a first state identified as "0" and must have the ability to block the transmission of electromagnetic wave lengths to have a second state identified as "1". A chemical having this ability has binary properties and may be capable of being used in this optical storage disc, or, conversely, if the chemical transmits a narrow range of electromagnetic wave lengths to have a first state identified as "1" and has the ability to block the transmission of electromagnetic waves to have a second state identified as "0". In regard to reflection the chemical has the ability to reflect a narrow band of electromagnetic wave lengths to have a first state identified as "0" and has the ability to block the reflection of electromagnetic wave lengths to have a second state identified as "1" or, conversely, the chemical has the ability to reflect a narrow band of electromagnetic wave lengths to have a first state identified as a "1" and has the ability to block the reflection of electromagnetic wave lengths to have a second state identified as "0". From the foregoing it is seen that the chemical should have two characteristics or binary characteristics.

To the point of this binary state, it is observable in nature that chlorophyll provides two easily recognized states of optical reflectivity. One state observed during summer is green reflectance. The second state is observed during the fall as non-green (as typified by yellow, orange, or red.) In nature, this state change is initiated by the spectral component change of sunlight as red and infra red components of sunlight change in relationship to each other over the course of time. This is then extended analogy of the optical storage medium which on a global scale is a simple one bit representation of a binary variable.

It is the mechanism that induces the state of change that is important. In nature the mechanism is the sun, atmosphere, and other vegetable matter screening the sun from the test sample that control the optical state of the test sample. Sunlight is a wide spectrum source of radiant power. However, there are only two narrow regions of that spectrum that have an effect on chlorophyll crystals, with a wavelength in the range of 650–670 nm and infra red with a wavelength in the range of 810 nm have an effect on chlorophyll. These two regions contain radiant power whose proportions to each other are seasonably dependant. In the winter, due to the tilt of the earth's axes and sunlight's increased transmission path through the atmosphere, there is a greater infra red content in relation to the red content reaching the earth than there is during the summer when the red content dominates the infra red content. The effect of the proportions of these two radiant power regions is expressed in nature as green or non-green vegetation. The abbreviation for nanometer is nm.

The mechanism of our process, as illustrated in FIGS. 49 and 50, are two high intensity monochromatic wavelength sources 960 and 982, whose radiant power are restricted (by design and technology of the components) to the narrow bands of 650–670 nm and 790–810 nm and a storage medium 966 of chlorophyll crystals.

It is the property both in nature and this application that chlorophyll crystals change their indices of refraction/reflection when illuminated by an intense radiation confined to a narrow portion of the radiation spectrum (loosely set a 300 nm to 900 nm) for the purpose of presentation. When chlorophyll crystals are strongly illuminated by a radiant power source confined to the 650–670 nm band, the crystals adjust their indices of refraction so that radiant power in the 650–670 nm band is highly attenuate in transmission through the medium 966 and radiant power in the 790–810 nm band is not highly attenuated in transmission through the medium 966. Alternately, when chlorophyll crystals are strongly illuminated by a radiant power source confined to the 790-810 nm band, the crystals adjust their indices of refraction so that radiant power in the 790–810 nm band is highly attenuated and radiant power in the 650–670 nm band is not highly attenuated in transmission through the medium 966. This property of the medium 966 composed of chlorophyll crystals therefore exhibits binary states that are both readable and write given to radiant power sources whose characteristics resemble the 650–670 nm band and the 790–810 nm band of light waves.

The requirements for an optical storage disc 965 include the ability to set or reset any bit in storage by the application of radiant power of the correct wave length and of sufficient power to cause a change in the index or refraction of the medium's structure. Chlorophyll crystals are an example of a suitable medium. Further, read operations of the storage disc 965 must not change the state of the medium 966 nor degrade its characteristics so as to either prevent further read operations or write operations. Further, the medium 966 must exhibit stable characteristics for all operations under reasonable environmental and temporal restrictions.

FIGS. 49 and 50 illustrate a simplified operation of changing the state of the optical storage medium 966 at one cell for digital binary bit, storage location). FIG. 50 is the medium 966 before writing. FIG. 49 is the medium 966 after a writing. As illustrated in FIG. 50, all cells 967, 968,970 and 972 before intense illumination 1002 or before a writing were in the same state 1018. After intense illumination 1002 from source 960 directed by collimator 962 to the optical storage medium 966 or after a writing, the cell 970 changes its state to 1020 while the state of the other cells remain at 1018.

FIG. 51 illustrates the practical consequence of the actions taken above and FIG. 52 illustrates the binary characteristic of the media and confirms the utility of the actions taken above.

As illustrated in FIG. 51, cell 970 is irradiated from source 964 with radiant power 1006 directed through collimator 962 to the disc storage media cell 970. As source 964 does not direct as much power (by design) as source 960, source 964 does not initiate a state change in the optical storage media cell 970. The source 960 is for writing the medium 966. The radiant power 1006 from the source 964 being of the same wave length as the source 960, encounters high attenuation in traversing the optical storage media cell 970 due to the index of refraction laving been previously changed by the irridiation from the more powerful source 960. The source 964 is for reading. 960 encounters little attenuation for the remainder of 1006's path through optical storage base 974, the remainder of the radiant power 1006 falls upon the detector 976. Detector 9 76 in turn supplies power 1008 to indicator 978. That is proportional to the power falling upon detector 976. In this instance as optical storage media 970 is optically dense at the dominant wave length source 964 (and source 960) the output 1008 from detector 976 is correspondly low and is indicated as such .by indicator 978. When in the course of normal operation cell 970 is replaced by cell 972. (due to rotation of the optical storage disc), the radiant power 1006 encounters less attenuation due to the index of refraction of the medium for that cell 972. As illustrated in FIG. 52 there is a great amount of power traversing optical storage media cell 972 through optical storage base 974 to the detector 976. The detector 976 having more power 1006 falling upon it outputs more power 1008 to indicator 978.

Thus FIGS. 51 and 52 illustrate a simple write once only/read many times optical storage system. The reader should understand that indicator 978 serves to illustrate this simple mechanism and in no way limits the application from other more conventional components found in digital electronics designs.

FIGS. 49 and 50 illustrate the extension of the mechanism illustrated in FIGS. 51 and 52 to include a second high intensity source 982 and a second low intensity source 986.

FIG. 50 simply illustrates the relation of all components and does not preclude the design of a similar system based not on transmission qualities but on reflective qualities of the optical disc storage medium 998.

FIG. 53 assumes the prior condition, not illustrated, where all optical storage media cells 89B, 990,992, and 992 were. In state 1020. Again, by the same mechanism illustrated in FIGS. 51 and 52, source 982 provides a high intensity radiant power 1012 for passing through collimator 984 and onto optical storage media cell 992. The application of this radiant power 1012 results in a state change from state 1020 to state 1018 in cell 992. Again, as low radiant power 1016 from source 986 passes through collimator 984 traverses cell 992 and base 974, it encounters high resistance or high attenuation in cell 992 due to the change in the index of refraction forces by the earlier irradiation of source 982 power 1012. As the radiant power 1016 is lower than that 1012 of source 982(1016 and 1012 exhibit similar dominant wave lengths) no change in the state of optical storage media cell 992 is made and the remaining power 1016 falls upon detector 976. This results in, as before, a low power output 1008 from the detector 976 to the indicator 978 (not shown). When, in the course of normal operation: cell 992 is replaced by cell 994 the transmission qualities of cell 994 will allow radiant power 1002 to pass with low resistance and less attenuation through cell 994 and base 974 to fall upon detector 976. The output power of the detector 1008 will be correspondlingly higher to the indicator.

The reader should understand that the arrangement of the components and their use in those arrangements do not limit the design nor do they suggest that all are required. That is to say that one method of measuring the presence or absence of a bit of data by testing the optical transmission quality (or characteristics) does not preclude the method of determining the presence or absence of a bit of data by testing the optical reflectance quality (or characteristic) of the optical storage media cell. The mechanism of changing states in the optical storage medium is not dependent upon the transmission qualties nor is the testing of a cell for its state. This means that the optical storage medium 998 could as easily be employed upon an opaque base in place of the clear base 974. This would in turn mean that the collimator(s) would be of another arrangement so as to allow the detector 976 to be placed on the same side of the optical storage disc 996 to allow measurement of power reflected by an optical storage media cell. Of course the detector-source physical arrangement should preclude the coupling of radiant power to the detector by any means other than that reflected from the optical storage media cell. Another consideration is the number and nature of the sources 960,964,982,986. Sources 960 and 982 are characterized as high intensity while sources 964 and 986 are characterized as low intensity. As these groupings of sources relate to function; sources 960 and 982 serve as "erase/write" components where sources 964 and 986 serve as "read" components. It should be understood that sources 960 and 982 could readily be used like "read" components. This is achieved by simply reducing the amounts of input power 1000 and 1010 to the sources 960 and 982 so that their radiant power 1002 and 1012 are of the same level as the radiant power 1006 and 1016 of the low intensity sources 964 and 986.

In the foregoing discussion there has been used chlorophyll as a chemical which has a binary state. It is to be understood that there are many other chemicals which have a binary state or show this binary property. In Chemical and Engineering News, issue of 9 June, 1986 on pages 27 adnd 28 there is a discussion of "PORPHIN-ISOMER MAY HERALD NEW SERIES OF PORPHYNOID SPECIES." Emanuel Fogel states that he made 1,6-methanol (10) annulene 1,6-methanol (10) annulene. Emanuel Fogal has given the name, porphycene to this chemical. Porphycene has a high degree of absorption of longer wave lengths between 550 and 640 nm than does porphin. This is an illustration of a chemical having binary properties. The teaching of this reference are incorporated in this patent application.

In a patent to Kiss, issuing date of 5 January, 1971 and No. 3,552,824 there is described a photochromatic material comprising strontium titanate single crystal which has been doped with 0.03% iron and 0.03% cobalt. Light from mercury arc lamp, filtered to pass a range of wave lengths from 3100 angstroms to 4600 angstroms is provided as a switching light for changing the refractive index of the photochromatic body. This is another illustration of another substance which can be used to indicate two states or has binary properties. The teachings of Kiss are incorporated in this patent application.

In the patent to Berman, issuing date of 20 September, 1960, No. 2,953,454 there is a teaching of chemicals having a binary state. These chemicals are taken from a group of compounds consisting of 1,1,3,3-trimethyl-6′-nitro-spiro (2′ H-1′-benzopyran 2,2′indoline); II, 3,3-trimethyl-8′-nitro-spiro (2′H-1′-benzopyran-2,2′-indoline); III, 1,3,3-trimethyl-6′-nitro 8′-methoxy-spiro (2′H-1′-benzopyran 2,2′-indoline); IV, 1,3,3-trimethyl-5′-nitro-8′methoxy-spiro-(2′H-1′-benzopyran 2, 2′-indoline); and V, 1,3,3-trimethyl-6′-chloro-8′-nitro-spiro (2′H-1′-benzopyran-2,2′-indoline). The teaching of Berman is incorporated by reference into this specification.

In the patent to Hamann, issuing date of 29 February, 1972 and U.S. Pat. No. 3,645,188 there is a discussion of binary property of chemicals. There is a photochromatic material and there is transparent phosphorous used. The phosphor employed in the layer 23 may be of any suitable type. A type which emits light in the range of 360 to 400 nms wave length is preferred. A P-16 phosphor emits in this region. The teaching of Hamann is incorporated by reference.

In a patent to Berman et al, issuing date of 4 April, 1961, U.S. Pat. No. 2,978,462 there is a discussion of spiropyrans. There is a list of these spiropyrans and a discussion of the binary properties of these spiropyrans. The teachings of Berman et al are incorporated by reference into this patent application.

In a patent of Berman et al, issuing date of 20 February, 1962, U.S. Pat. No. 3,022,318 there is a further listing of spiropyrans and a listing of the structure. There is a teaching of how to make these spiropyrans. These spiropyrans have binary properties and under different illumination display different properties so as to have a binary state. The teaching of Berman et al incorporated by reference into this patent application.

In a patent to Carlson, issuing date of 16 April, 1963, U.S. Pat. No. 3,085,469 there is a teaching of a number of chemicals having binary properties. The Table I of Carlson in column 15 is reproduced as well as Table III in column 16. The chemicals of Table I are spiropyrans, mainly, and have dynamic properties as they can be changed from a first state to a second state by electromagnetic waves of different wave lengths. In Table III the binary chemcials can be used and fixed patterns can be "written" on the information altering material by a short (or pluse) exposure to the proper radiation from the proper source. These chemicals are anthrones. The teachings of Carlson are incorporated by reference into this patent application. Table I and Table III of Carlson are reproduced as follows:

TABLE I 1,3,3-trimethyl-6′-nitro-8′-allyl-spiro (2′H-1′-benzopyran-2,2′-indoline)
1,3,3-trimethyl-5,6′-dinitro-spiro (2′H-1′-benzopyran-2,2′-indoline)
1,3,3-trimethyl-7′-nitro-spiro (2′H-1′-beta-naphthopyran-2,2′-indoline)
3-methyl-6-nitro-spiro-[2H-1-benzopyran-2,2′-(2′H-1′-beta-naphthopyran)]
1,3,3-trimethyl-8′-nitro-spiro (2′H-1′-benzopyran-2,2′-indoline)
1,3,3-trimethyl-6′-methoxy-8′-nitro-spiro (2′H-1′-benzopyran-2,2′-indoline)
1,3,3-trimethyl-5-methoxy-6′,8′ dibromo-spiro (2′H-1′-benzopyran-2,2′-indoline)
1,1,3-trimethyl-7-methoxy-7′ chloro-spiro (2′H-1′-benzopyran-2,2′-indoline)
1,3,3-trimethyl-5 chloro-5′ nitro-8′-methoxy-spiro (2′H-1′-benzopyran-2,2′-indoline)
1,3-dimethyl-3-isopropyl-6′ nitro-spiro (2′H-1′-benzopyran-2,2′-indoline)
1-phenyl-3,3-dimethyl-6′-nitro-8′methoxy-spiro (2′H-1′-benzopyran-2,2′-indoline)
7′-nitro-spiro-[xantho-10,2′ (2′H-1′-benzobetanaphthopyran)]
3,3′-dimethyl-6′-nitro-spiro (2′H-1′-benzopyran-2,2′-benzo-thiazole)
3,3′-dimethyl-6′-nitro-spiro (2′H-1′-benzopyran-2,2′-benzo-oxazole)
1,3,3,8′-tetramethyl-5′-hydroxymethyl-spiro-[2′H-1′-pyridino[[3,4-b]]pyran]-2,2′-indoline
1,3,3-trimethyl-6′-nitro-spiro (2′H-1′-benzopyran-2,2′-indoline)
6′-nitro-8′-methoxy-1,3,3-trimethylindolinobenzopyrylospiran
6′-nitro-1,3,3-trimethylindolinobenzopyrylospiran
8′-allyl-1,3,3-trimethylindolinobenzopyrylospiran
8′-carbomethoxy-1,3,3-trimethylindolinobenzopyrylospiran
8′-methoxy-1,3,3-trimethylindolinobenzopyrylospiran
6′,8′-dinitro-1,3,3-trimethylindolinobenzopyrylospiran
7′-nitro-1,3,3-trimethylindolinobenzopyrylospiran
8′-nitro-1,3,3-trimethylindolinobenzopyrylospiran
6′,8′-dibromo-1,3,3-trimethylindolinobenzopyrylospiran
6′-chloro-8′-nitro-1,3,3-trimethylindolinobenzopyrylospiran
5-nitro-6′-nitro-1,3,3-trimethylindolinobenzopyrylospiran

TABLE III 10-(9′-xanthylidene)-anthrone
3-chloro-10-(9′-xanthylidene)-anthrone
3-methyl-10-(9′-xanthylidene)-anthrone
4′-chloro-10-(9′-xanthylidene)-anthrone
9,9′-dixanthylene
10,10′-dianthrone In FIG. 53 there is a fragmentary side elevational view of laiminated films 1030. In thsi regard the reader can refer to FIG. 46 for another illustration of the laiminated flims. The laminated films 1030 can be in the configuration of a disc or can be in the configuration of a tape. The choice is for the user of the laminated films 1030.

The laminated flims 1030 comprise a clear film 1032. Then there is positioned on the clear film 1032 the fourth chromatic film 904, the third chromatic film 902, the second chromatic film 900 and the first chromatic film 898. The reference numerals 898–904 correspond to the reference numerals 898–904, FIG. 46. The films 898–904 and 1032 can be selected from many suitable plastics such as polyethylene, and acrylate such as methulacrylate, polypropylene, polystyrene, polyvinylchioride, nylon, polyester, cellulose acetate, cellulose nitrate and. cellulose propionate to name a few. The films 898-904 are referred to as metachromatic and also photochromatic.

In FIG. 46 there is no film 1032. It is possible to laminate the four chromatic films or four chromatic layers 898-904 together. also, in FIG. 53, it is possible to laminate the film 1032 with the chromatic film 898-904.

In FIG. 54 there is illustrated, in a fragmentary side elevational view, laminate 1034 of films such as a film 1036. There is layered on 1036 the fourth chromatic film or fourth chromatic layer 904. Then there is a clear film 1038 layered on 904. Then on clear film 1038 there is a third chromatic film 902 layered on 1038. Then a clear film 1040 is layered on the third chromatic film 902. A second chromatic film or second chromatic layer 900 can be layered on clear film 1040. Then the clear film 1042 can be layered on the second chromatic film 900. Then the first chromatic film 898 or the first chromatic layer 898 can be layered on the clear film 1042. Then clear film 1044 can be layered on the first chromatic film 898. It is seen that there are nine films including the four chromatic or metachromatic films 898-904 and the five clear films 1036-1044. With the nine flims or nine layers of laminate 1034 there is a protection for the chromatic layers 898-904.

The reader is to understand that each chromatic layer or each chromatic film 898-904 is responsive to a band width of electromagnetic wave length different than every other chromatic layer. Each chromatic layer comprises an appropriate chemical, i.e., such as previously disclosed chemicals in this patent application and specification, which is responsive to band width of electromagnetic wave lengths different than the appropriate chemical in another chromatic layer.

FIGS. 53 and 54 are illustrative of four chromatic layers. In FIGS. 53 and 54 the laminated films 1030 and 1034 provide four bits per writing and reading area. With four bits for writing and reading area there are 24 possible combinations. In Table I, EXEMPLARY BAND WIDTH, there are two columns one for Band Width in nanometers, nm, and one for Band Width Separation in nanometers. Table I illustrates one possible combination of four chromatic layers laving a band width of 20 nanometers for electromagnetic waves and a band separation of approximately 70 nanometers between the 20 nanometer band widths. The band widths in Table I are in the visible range. It is possible to have the band width outside the visible range such as in the infra red range and also in the ultra violet range. Again, the reader is to understand that Table I is exemplary of possible combinations of four chromatic layers.

TABLE I

EXEMPLARY BAND WIDTH

| BAND WIDTH nm (nanometers) | BAND SEPARATION nm (nanometers) |
|---|---|
| | 3 |
| | 400 |
| 400-420 | 420-490 |
| 490-510 | 500-580 |
| 580-600 | 600-670 |
| 670-690 | 6900 |

It is possible to have many chromatic layers such as sixteen chromatic layers and thirty-two chromatic layers or whatever is a reasonable number. With sixteen chromatic layers there are many combinations. With sixteen chromatic layers it is possible to have sixteen bits per writing and reading area. With thirty-two chromatic layers it is possible to have thirty-two bits per writing and reading area. Again, with sixteen chromatic layers of film or thirty-two chromatic layers of film it is possible to have many combinations of electromagnetic wave lengths. With the more chromatic layers in a disc or a tape the band width of the chromatic layers is of a decreased band width and the separation between time band widths of chromatic layers is a decreased separation. As contrasted with FIG. 1 the band width of the chemicals in the chromatic layers is approximately 20 nanometers and in this 20 nanometer range the chemicals change state from a first state to a second state or from a "0" to a "1" state. The separation between these band widths is approximately 70 nanometers.

In the laminated films 103 and 1034 or laminated films comprising many chromatic layers such as sixteen chromatic layers or thirty-two chromatic layers the important feature is that each chromatic layer is responsive to a band width of distinct and separate and different electromagnetic wave lengths than every other chromatic layer. In other words, a distinct electromagnetic wave length will write and read on only one chromatic layer and will have no affect on any of the other chromatic layers in the laiminated film.

For illustrative purposes assume that there are eight chromatic layers of film in the disc or on the tape or other appropriate storage media. It is possible to have eight bits per writing and reading area. In addition to having eight bits per writing and reading area it is possible to have 40,320 combinations of the eight bits of information per writing and reading area. The reader can readily understand the immense storage possibilities associated with this optical storage system. In addition to eight bits per reading and writing area it is possible with the 40,320 combinations to have a storage capacity of immense capability. Then, if there be sixteen chromatic layers it is possible to have sixteen bits per writing and reading area and to have millions of combinations of these sixteen bits of reading and writing combinations. This, again can be multiplied with respect to thirty-two chromatic layers. With thirty-two chromatic layers there are thirty-two bits per writing and reading area and there are millions of combinations of these bits or chromatic layers. The storage capacity of such an optical storage media is extremely large when the combination of different layers are considered.

In FIG. 55 there is a schematic illustration of an optical writing head 1046 similar to the optical writing head 894 of FIG. 68 and an optical read head 1048 similar to the optical read head 896 of FIG. 46. There is also illustrated the laminated film 1030 having the base film 1032 and the four chromatic layers 898, 900, 902 and 904. It is to be understood that in place of the laminated film 1030 there can be used the laminated film 1034 of FIG. 54.

In optical writing head 1046 there is a controlled source 1050 of electromagnetic waves. The source 1050 controls the intensity of the electromagnetic waves. For example, to write in the laminated film 1030 the electromagnetic waves from the source 1050 can be high intensity. To read in the laminated film 1030 the electromagnetic waves from the source 1050 can be a low intensity. An electric cable 1052 connects the source 1050 with a generator 1056. There is a seal 1054 in the head 1046 and which seal surrounds the electric cable 1052 to prevent stray light from entering into the optical reading head 1046.

The electromagnetic waves from the source 1050 are identified by reference numeral 1058. The electromagnetic waves 1058, for illustrative purposes, may have a band width of 300 nm to 900 nm. The reader is to understand that the band width may be different than this but for illustrative purposes this band width from 300 nm to 900 nm will be used. The object is to isolate from the electromagnetic waves 1058 a band width of 400 to 420 nm, a band width of 490 to 510 nm, a band width of 580 to 600 nm, and a band width of 670 to 690 nm. Then, the object is to pass these four band widths through the laminated film 1030 to either write into the laminated film 1030 or to read into the laminated film 1030. If the laminated film 1030 is read then the four band widths, either "0" through "4", are read by the detectors in the optical reading head 1048.

The first dichroic reflector 1060 transmits electromagnetic waves 1062 in the 400–420 nm range and reflects the other electromagnetic waves 1069. The waves 1062 are transmitted through a variable density filter 1064 so as to have a more uniform wave 1066 in the 400–420 nm range. The waves 1066 flow to fiberoptic 1068 which in turn directs the waves to an optional directional coupler 1070 having a fiberoptic output 1102.

The waves 1069 contact a second dichroic filter 1062 which transmits electromagnetic waves 1074 in the wave length of 490–510 nm and reflects the rest of the electromagnetic waves 1081, The waves 1074 are transmitted through a variable density filter 1076 to become more uniform electromagnetic waves 1078 in the wave length of 490–510 nm, The waves 1078 pass to a fiberoptic 1080 which directs the waves into the optional directional coupler 1070, The electromagnetic waves 1081 pass to a third dichroic filter 1082 and some of these waves are transmitted as electromagnetic waves 1084 in time wave length of 580 to 600 nm. The rest of the electromagnetic waves are reflected to form waves 1091, The waves transmitted through the third dichroic filter 1082 are electromagnetic waves 1084 in the wave length of 580 to 600 nm. Waves 1084 are transmitted through a variable density filter 1086 to form a more uniform electromagnetic wave length 1088 in the wave length of 580 to 600 nm. Waves 1088 flow to the fiberoptic 1090 which directs them to the optional directional coupler 1070, Some of the waves 1091 are reflected off of a third dichroic filter 1092 to form waves 1101, The waves 1101 are discarded as they are outside of the desired wave lengths, Waves 1091 which are transmitted through the third dichroic filter 1092 are electromagnetic waves 1094 and the wave length of 670 to 690 nm. Waves 1094 pass through a variable dichroic filter 1096 to form a more uniform electromagnetic wave 1098 in the wave length of 670–690 nm, The waves 1098 pass into a fiberoptic 1100 which in turn directs the waves to the optional directional coupler 1070, 1070 has a fiberoptic output 1102 which directs the combined electromagnetic waves 1103 through the aperture 906 in the optical reading head 1046, The reader is to understand that to combine the electromagnetic waves 1103 can vary depending upon the wave lengths from the fiberoptics 1068, 1080, 1090 and 1100. For example, it is Conceivable that the combined electromagnetic waves 1103 may contain no wave lengths and may have no information. Then, there can be various permutations of wave lengths in electromagnetic waves 1103. In all, there can be twenty-four permutations of electromagnetic waves in 1103 depending on whether there are one, two, three or four distinct and separate wave lengths.

The combined electromagnetic waves 1103 are passed through or transmitted, or can be reflected, from the laminated film 1030 or 1034 and then passed through the aperture 908 in the optical reading head 1048 to contact a fifth dichroic filter 1104. The combined electromagnetic waves 1103 are separated with electromagnetic waves 1066 in the 400–420 nm range being reflected and directed to a first detector 1106. A communication line 1108 connects with the first detector 1106 and passes through a seal 1110 in the reading 10,48 and connects with a control unit 1134.

Electromagnetic waves 1112 are transmitted through dichroic filter 1104 and directed to a sixth dichroic filter 1114. Some of these electromagnetic waves 1078 are reflected to a second detector 1116. Waves 1078 are in the wave length range of 490 to 510 nm. A communication line 1118 connects with the detector 1116 and passes through a seal 1120 in the reading head 1048 and connects with the control unit 1134.

The electromagnetic waves which are transmitted through the sixth dichroic filter 1114 are identified by reference numeral 1136. These waves 1136 are directed to a seventh dichroic filter 1038. Some of the waves are reflected as electromagnetic waves 1088 in the wave length range of 580–600 nm toward a third detector 1122. A line 1124 connects with the detector 1122 and passes through a seal 1126 in the reading head 1048 and connects with a control unit 1134.

Some of the electromagnetic waves 1136 are transmitted through the seventh dichroic filter 1038 and become waves 1098 in the wave length range of 670–690 nm. Waves 1098 are directed to a fourth detector 1128. The fourth detector 1128 connects with a line 1130 which passes through a seal 1132 in the optical reading head 1048. The line 1130 connects with the control unit 1134. The optical reading head 1048 is of such a configuration and size as to have the aperture 908 as small as possible consistant with good reading quality so as to eliminate as much stray light as possible from entering the reading head 1048.

The control unit 1134 connects with the source 1050 of electromagnetic waves by means of a cable or a line 1136. The line 1136 passes through the optical reading head 1046 by means of a seal 1138.

The control unit 1134 can be a computer. The optical reading head 1046 or, more appropriately named, optical writing-reading head 1046, the laminated film 1030 or the laminated film 1034, and the optical reading head 1048, more appropriately named an optical detector head, can be an external storage unit for the computer 1030 or 1034. The external storage unit for the computer 1034 is in addition to the computers internal Storage unit.

The source 1050 of electromagnetic waves can be a high intensity source for writing onto the laminated film 1030 or the laminated film 1034. Then, when it is time to read the laminated film the source 1050 of electromagnetic waves can be a low intensity source. The high intensity source will change the chromatic characteristic of the appropriate chromatic layer. The low intensity light waves from the source 1050 will read the information in the appropriate chromatic layer.

We consider that the storage capacity of this optical storage system to be a large scale storage capacity. Some examples are as follows. With eight chromatic layers in a laminated film it is possible to have for each writing and reading area 40,320 permutations (factorial) eight.

If there be sixteen chromatic layers then for each writing/reading area then factorial sixteen becomes $2.6 \times 10^{12}$ permutations.

With thirty-two chromatic layers in the laminated film then for each reading area there becomes thirty-two factorial permutations or $242 \times 10^{33}$. The reader can readily appreciate the storage capacity of this optical storage system.

With this optical storage system it may become necessary to form a new code for taking advantage of all the combinations for each reading area. Instead of serially reading bits to form a bit such as reading eight bits to form an eight bit byte it is possible in one writing/reading area to have eight bits to form one byte or sixteen bits to form two eight bit bytes or thirty-two bits to form four eight bit bytes. The increase in storage density and the increase in storage capacity is readily apparent. Again, it may be necessary to devise a new code to take advantage of the storage capacity of this optical storage system, especially, when the possible permutations for a large number of chromatic layers in a laminated film are considered.

Instead of having a laminated film 1030 or a laminated film 1034 it is possible to have one film 1150 having a plurality of metachromatic chemicals in the film. These metachromatic chemicals should be homogeneously dispersed in the film. In effect, the film is a carrier for these chemicals. In FIG. 56 there is illustrated a control unit 1134 which may be a computer connetcing with the optical storage system comprising the optical reading/writing head 1046, the film 1150 with four metachromatic chemicals homogeneously dispersed in the film, and an optical detector head 1048.

The optical writing/reading head 1046 is substantially the same as in FIG. 55. In the apertures 906 there is positioned a collimating lens 1152. The source of electromagnetic waves 1050 and the dichroic filters are not illustrated in 1046 in FIG. 78.

Likewise, the optical detector head 1048 is substantially the same as the optical detector 1048 in FIG. 55. In the aperture 908 there is a collimating lens 1154. The dichroic filters and detectors of 1048 are not illustrated in FIG. 56 but the reader is to understand they are the same as the optical detector 1048 of FIG. 55. In FIG. 56 it is seen that the collimating lens 1152 collimates the combined electromagnetic waves 1103 before they pass through or are transmitted through the film 1150 comprising the four photochromic chemicals or metachromatic chemicals. Then, the collimating lens 1154 accepts the combined electromagnetic waves after passing through the film 1150 so as to collimate these waves. A cable 1052 connects with a generator 1056 which in turn supplies electrical energy to the source 1050 ill 1046. ALSO, the control line 1136 connects with the control unit 1134 and 1046.

Control lines 1108, 1124, 1130 and 1132 connect with the control unit 1134 and 1048.

The size of the optical writing/reading head 1046, fiberoptic 1068, 1080, 1090 and 1100, the optical directional 1070 and fiberoptic 1102, the optical reading head 896, the detectors 1106, 1116, 1118 and 1130 are small in size but, relatively speaking, are large compared to the metachromatic chemicals dispursed in the various carriers or layers of film. The reading area as previsouly stated is a small reading area. As previously stated it is possible to use fiberoptics whose cross-sectional diameter equals 100 micrometers. However, a fiberoptic of 100 micrometers is large compared to the minuscular size of the metachromatic materials. If, instead of a plurality of layers of film with each layer contacting a metachromatic material, there is used one film containing all of the metachromatic chemicals or possibly two films with each film containing approximately one-half of the useful metachromatic chemicals it is possible to reduce the thickness of the films carrying the metachromatic chemicals. The metachromatic chemicals are homogeneously dispersed in the film carrying these chemicals. The fiberoptic 1102 can direct the electromagnetic waves to the one or two films containing the metachromatic chemicals. The electromagnetic waves can contact the metachromatic chemicals so as to write with these chemicals or else to read with these chemicals.

From the foregoing it is seen that there may be a number of laminated films with each film containing a metachromatic chemical. As contrasted with the plurality of laminated films it appears possible to have all of the metachromatic chemicals homogeneously dispersed in one film. The metachromatic chemicals need not be limited to four chemicals but can be a plurality of chemicals such as eight chemicals or sixteen chemicals or thirty-two chemicals as becomes appropriate.

With four photochromatic chemicals homogeneously dispersed in the film 1150 it is possible to have factorial four or twenty-four permutions per writing/reading area. With eight photochromic chemicals in the film 1150 it is possible to have factorial eight permutations or 40,320 permutations per writing/reading area. With sixteen photochromic chemicals in the film 1150 it is possible to have factorial sixteen permutations or $2.6 \times 10^{12}$ permutations per writing/reading area. With thirty-two photochromic chemicals in the film 1150 it is possible to have factorial thirty-two or $242 \times 10^{33}$ permutations per writing and reading area. Again, each photochromic chemical is responsive to distinct and separate and different electromagnetic wave lengths from each and every other photochromic chemical in the film 1150. This is the same with each chromatic layer in the laminated film 1030 or 1034.

The storage system has been described with reference to write once and read many times. It is conceivable that by using an appropriate high intensity light wave such as a high intensity ultraviolet light wave that all of the chemicals in the carrier layers or all of the materials in the carrier layers could be returned to a "0" state. Then, with the appropriate monochromatic light waves the chemicals or materials in the carrier layers could be changed from a "0" metachromatic state to a "1" metachromatic state or in other words the carrier layers can be written again. After beng written it is possible to read the information in the carrier layers by the appropriate monochromatic light waves.

35 U.S.C. 101 states: Invention patentable "Whoever invents or discovers any new and useful process, machine, manufacture, or composition of matter, or any new and useful improvement thereof may obtain a patent therefor, subject to the conditions and requirements of this title."

35 U.S.C. 103 states: Conditions for patentability; non-obvious subject matter "A patent may not be obtained though the invention is not identically disclosed or described as set forth in section 102 of this title, if the differences between the subject matter sought t o be patented and the prior art are such that the subject matter as a whole would have been obvious at the time the invention was made to a person having ordinary skill in the art to which subject matter pertains. Patentability shall not be negatived by the manner in which the invention was made."

We consider the invention to be new and useful and unobvious. We have worked in the area of computers and the formation of layers on a substrate and do not know of this approach for storing information. We do not know of this approach for storing digital information. The storage system with which we are familar comprise one layer such as a magnetic layer on a substrate wherein the magnetic layer can be read and written. Another storage system is the Hollerith card which is one layer wherein there are placed a number of holes. Another example of a one layer system is a laser system for reading and writing purposes. Further, we consider the invention to be useful as it is possible to store a large amount of information.

We consider the invention to be new and useful and unobvious. We have worked in the area of computers and the formation of layers on a substrate and do not know of this approach for storing information. We do not know of this approach for storing digital information. The storage system with which we are familiar comprise one layer such as a magnetic layer on a substrate wherein the magnetic layer can be read and written. Another storage system is the Hollerith card which is one layer wherein there are placed a number of holes. Another example of a one layer system is a laser system for reading and writing purposes. Further, we consider the invention to be useful as it is possible to store a large amount of information in a small volume as digital information. Further, we consider that with the combinations of different monochromatic wavelengths it is possible to comprise different instructions of memory storage instruction and address in the memory, and also for controlling the operation of the control unit and the arithematic logic unit.

The cytochromic medium described exhibits a characteristic similar to amorphous crystalline structures. The cytochrome can be stimulated to change refractive indices by utilizing selected wavelengths. This observable change can be used to accept binary information.

The process is simple enough. Excitation of the cytochrome by infrared radiation results in a specific refractive index. Conversely, excitation by ultraviolet radiation results in an opposing refractive index. This change of state is a dynamic process.

The cytochromic molecule, as all substances, has a unique absorbance index. This characteristic index is measurable by optical means. One merely excites the molecule with a selected light spectra and then measures the light absorbed or reflected. The absorbance character of the molecule will be different depending upon which spectral wavelength is chosen. A cytochromic molecule exposed to the infrared spectrum will have an absorbance value different than the value of absorbance of the same molecule when exposed to ultraviolet radiation. Associated with the absorbance character of the molecule is the reflectance character. The reflective character will be a measure of all light that is not. absorbed by the molecule and therefore will be reflected.

The refractive index of a cytochromic molecule is another measure that can be applied. Refractive changes are a measure of the change of direction of a light wave when passing from one medium to another in which the velocity of propagation is different. This relationship has been expressed in Snell's Law: sin i=sin r. Theoretical studies have revealed that the refractive index is related to the number, charge, and mass of vibrating particles in the cytochromic molecule. In the optical storage medium described the number and mass of particles is static while the charge is in a state of change depending upon the spectral radiation applied. When the charge of the cytochrome is changed coincidently the refractive index will change. The charge of the particle as discussed previously is directly related to the frequency of the light spectra applied.

When applied to practice the principles of absorbance, reflectance, and refractive index become the means by which the cytochromic molecules can be made to change state. Excitation the cytochrome by IR radiation will result in a different refractive index than excitation by UV radiation just as is observed with absorbance and reflectance characteristics. If IR radiation is used then the index or shift will be greater and conversely if UV radiation is applied the shift will be less. This phenomenon can be applied with all light spectra not just UV or IR. The relative changes are somewhat linear and therefore reliably measureable.

the optical data storage scheme the cytochromic molecule functions as a switch. The molecule has a resting state which represented as a binary 0. This binary 0 state will occur when the cytochromic molecule is subjected to an infrared source. To elicit a change in the unique refractive index of the molecule excited in the infrared spectrum to a binary 1, the molecule is subjected to an alternate spectral source that is of a shorter wavelength or multiple wavelengths, such as blue or blue and ultraviolet. This stored bit would then be a representative blue bit. The next bit to be written to the cytochromic substrate might be accomplished with a spectral source that is of a different frequency than the previous blue bit. The next bit could be in the yellow or green visible spectra thus yielding a yellow or green bit, respectively. Binary data has now been encoded or written to the substrate containing the cytochromic molecules. A very low power light source could then be used to scan the physical area and signal the existance of the encoded bits. If this low power scanning light source is of a wide spectral character then all encoded bits could be discriminated by their refractive index and absorption characteristics.

The method described accomplishes the objective of read-write binary data storage. Erasability is the final objective. To initiate a return to the original or "neutral" state the cytochromic molecule must be subjected to a spectral source of sufficient power to cause the material to return to the original refractive or refractive index representing a binary 0. In nature this change in state occurs as the spectral characteristic of the sunlight striking the cytochromic compound causes a change in the absorptative and refractive indices of the molecule. The absorptative and refractive indices of the cytochrome in the winter season are radically different than the indices of the same molecules when measured in the summer season. When winter returns and the spectral character or the sun will return the cytochromic molecule to its former state. To cause the same effect in the optical data storage. system the device will expose the selected bit to the baseline spectral source that originally established the binary 0. Upon excitation to the baseline source, whether infrared or ultraviolet, the refractive index will return to the baseline state. Erasability of the encoded binary 1 has now been accomplished. The cytochromic molecule is now ready to be encoded with new binary 1 of a selected spectral wavelength From the foregoing disclosure it is seen that we have presented a storage system for information comprising a plurality of metachromatic chemicals and comprising a carrier for said chemicals; a chemical, identified as a first chemical of said chemicals, being responsive to electromagnetic waves of a narrow wave length band width, identified as first electromagnetic waves; said first chemical being responsive to said first electromagnetic waves of a narrow wave band width distinct and separate from some other electromagnetic waves and said other chemicals being responsive to said other electromagnetic waves; and, said first chemical upon being contacted by said first electromagnetic waves of sufficient intensity being capable of being changed from a first metachromatic state to a second metachromatic state, wherein said chemicals may be in the same carrier or each of said chemicals may be in a different carrier identified as a carrier layer; and said carrier layers being in said storage system and being part of said storage system. Also, some of said chemicals may be in a carrier identified as a first carrier identified as a first carrier layer and some of said chemicals may be in a carrier identified as a second carrier identified as a second carrier layer and, said first carrier layer and said second carrier layer being adjacent to each other in said storage system and said first carrier layer and said second carrier layer being in said storage system and being part of said storage system The storage system may be in the configuration of a disc or in the configuration of a tape or in the configuration of a planar member having corners. There is a means, identified as a first means, being a source of electromagnetic waves; said first means being a plurality of sets identified as pre-carrier sets, of substantially monochromatic electromagnetic waves of a narrow wave length band width wherein each said pre-carrier set is of a narrow wave length band width and distinct from some other pre-carrier set; said pre-carrier set is one of said sets prior to contacting said carrier; a means, identified as a second means, for directing said pre-carrier sets to said carrier; a means, identified as a third means, for receiving electromagnetic waves from said carrier after said electromagnetic waves have passed through said carrier and said electromagnetic waves being identified as post-carrier sets with said first means being a wide spectrum of said electromagnetic wave lengths; a means, identified as a fourth means, for separating said wide spectrum of said electromagnetic wave lengths into said pre-carrier sets wherein said fourth means being dichroic filters for separating said wide spectrum of said electromagnetic wave lengths into said pre-carrier sets. There is a said third means being dichroic filters for receiving said electromagnetic waves after having passed through said carrier and for separating said electromagnetic waves into said post-carrier sets.

We have also disclosed the general outline of a computer comprising a control unit, an arithmetic logic unit, a memory unit, an input means and an output means, wherein said memory unit comprises a storage system for information comprising a plurality of metachromatic chemicals; a chemical, identified as a first chemical of said chemicals, being responsive to electromagnetic waves of a narrow wave length band width, identified as first electromagnetic waves; said first chemical being responsive to said first electromagnetic waves of a narrow wave length band width distinct and separate from some other electromagnetic waves and said other chemicals being responsive to said other electromagnetic waves; said first chemical upon being contacted by said first electromagnetic waves of sufficient intensity being capable of being changed from a first metachromatic state to a second metachromatic state; and, said control unit and said memory unit operatively connect with each other. The chemicals may be in the same carrier or each of said chemicals being in a different carrier identified as a carrier layer; and, said carrier layers being in said storage system and being part of said storage system. Some of said chemicals are in a carrier identified as a first carrier identified as a first carrier layer; some of said chemicals are in a carrier identified as a second carrier identified as a second carrier layer; and, said first carrier layer and said second carrier layer being part of said storage system. There is a means, identified as a first means, being a source of electromagnetic waves; said first means being a plurality of sets identified as pre-carrier sets, of substantially monochromatic electromagnetic waves of a narrow wave length band width wherein each said pre-carrier set is of a narrow wave length band width and distinct from some other pre-carrier set; said pre-carrier set is one of said sets prior to contacting said carrier; a means, identified as a second means, for directing said pre-carrier sets to said carrier; a means, identified as a third means for receiving electromagnetic waves from said carrier after said electromagnetic waves have passed through said carrier and said electromagnetic waves being identified as post-carrier sets. The first means may be a wide spectrum of said electromagnetic wave lengths; a means identified as a fourth means, for separating said wide spectrum of said electromagnetic wave lengths into said pre-carrier sets wherein said fourth means being dichroic filters for separating said wide spectrum of said electromagnetic wave lengths into said pre-carrier sets.

Further, we have provided a process for making a storage system for storing information, said process comprising selecting a plurality of metachromatic chemicals; selecting a carrier for said chemicals; incorporating said chemicals into said carrier; a chemical, identified as a first chemical of said chemicals, being responsive to electromagnetic waves of a narrow wave length band width, identified as first electromagnetic waves; said first chemical being responsive to said first electromagnetic waves of a narrow wave length band width distinct and separate from some other electromagnetic waves and said other chemicals being responsive to said other electromagnetic waves; and, said first chemical upon being contacted by said first electromagnetic waves of sufficient intensity being capable of being changed from a first metachromatic state to a second metachromatic state. The chemicals may be in the same carrier or the chemicals may be incorporated into a different carrier identified as a carrier layer; and, said carrier layers are in said storage system and being part of said storage system. The process comprises incorporating some of said chemicals in a carrier identified as a second carrier identified as a second carrier layer; and, positioning said first carrier layer and said second carrier layer in said storage system so as to be part of said storage system.

The storage system may be formed in the configuration of a disc or in the configuration of a tape or in the configuration of a planar member having corners. Further, the process comprises incorporating a means, identified as a first means, as a source of electromagnetic waves; said first means being a plurality of sets identified as pre-carrier sets, of substantially monochromatic electromagnetic waves of a narrow wave length band width wherein each said pre-carrier set is of a narrow length band width separate and distinct from some other pre-carrier set; said pre-carrier set is one of said sets prior to contacting said carrier; incorporating a means, identified as a second means, for directing said pre-carrier sets to said carrier; incorporating a means, identified as a third means, for receiving electromagnetic waves from said carrier after said electromagnetic waves have passed through said carrier and identifying said electromagnetic waves as post-carrier sets.

Also, we have provided a process for making a computer and comprising assemblying in an operative relationship a control unit, an arithmetic logic unit, a memory unit, an input means and an output means wherein; processing into said memory unit a storage system for storing information comprising a plurality of metachromatic chemicals; of said chemicals, a chemical, identified as a first chemical, being responsive to electromagnetic waves of a narrow wave length band width, identified as first electromagnetic waves; said first chemical being responsive to said first electromagnetic waves of a narrow wave length band width distinct and separate from some other electromagnetic waves and said other chemicals being responsive to said other electromagnetic waves; first electromagnetic waves of sufficient intensity upon contacting said first chemical changing said first chemical from a first metachromatic state to a second metachromatic state. The process may incorporate said chemicals into the same carrier or may incorporate each of said chemicals in a different carrier identified as a carrier layer; and, position said carrier layers in said storage system so as to be part of said storage system. Also, the process incorporates a means, identified as a first means, as a source of electromagnetic waves; said first means being a plurality of sets identified as pre-carrier sets, of substantially monochromatic electromagnetic waves of a narrow wave length band width wherein each said pre-carrier set is of a narrow length band width and distinct from some other pre-carrier set; said pre-carrier set is one of said sets prior to contacting said carrier; incorporating a means, identified as a second means, for directing said pre-carrier sets to said carrier; and, incorporating a means, identified as a third means, for receiving electromagnetic waves from said carrier after said electromagnetic waves have passed through said carrier and said electromagnetic wave being identified as post-carrier sets.

There is provided a storage system made by the process comprising selecting a plurality of metachromatic chemicals; selecting a carrier for said chemicals; incorporating said chemicals into said carrier; a chemical, identified as a first chemical of said chemicals, being responsive to electromagnetic waves of a narrow wave length band width, identified ad first electromagnetic waves; said first chemical being responsive to said first electromagnetic waves of a narrow wave length band width distinct and separate from some other electromagnetic waves and said other chemicals being responsive to said other electromagnetic waves; and, said first chemical upon being contacted by said first electromagnetic waves of sufficient intensity being capable of being changed from a first metachromatic state to a second metachromatic state. In said storage system the chemicals may be incorporated into the same carrier or the chemicals may be incorporated in a different carrier identified as a carrier layer; and, said carrier layers being in said storage system and being part of said storage system.

There is provided a computer made by the process comprising assembling in an operative relationship a control unit, an arithmetic logic unit, a memory unit, an input means and an output means wherein; processing into said memory unit a storage system for storing information comprising a plurality of metachromatic chemicals; of said chemicals, a chemical, identified as a first chemical, being responsive to electromagnetic waves of a narrow wave length band width, identified as first electromagnetic waves; said first chemical being responsive to said first electromagnetic waves of a narrow wave length band width distinct and separate from some other electromagnetic waves and said other chemicals being responsive to said other electromagnetic waves; first electromagnetic waves of sufficient intensity upon contacting said first chemical changing said first chemical from a first metachromatic state, to a second metachromatic state. The computer made by said process may incorporate said chemicals into the same carrier or may incorporate each of said chemicals in a different carrier identified as a carrier layer; and, position said carrier layers in said storage system so as to be part of said storage system. The computer made by said process comprises incorporating a means identified as first means, as a source of electromagnetic waves; said first means being a plurality of sets identified as pre-carrier sets, of substantially monochromatic electromagnetic waves of a narrow wave length band width wherein each said pre-carrier set is of a narrow wave length band width and distinct from some other pre-carrier sets; said pre-carrier set is one of said sets prior to contacting said carrier; incorporating a means, identified as a second means, for directing said pre-carrier sets to said carrier; and, incorporating a means, identified as a third means, for receiving electromagnetic waves from said carrier after said electromagnetic waves have passed through said carrier and said electromagnetic wave being identified as post-carrier sets. The first means is a wide spectrum of said electromagnetic wave length, and, incorporates a means, identified as a fourth means, for separating said wide spectrum of said electromagnetic wave lengths into said pre-carrier sets wherein said fourth means as dichroic filters for separating said wide spectrum of said electromagnetic wave lengths into said pre-carrier sets.

We claim:

1. A storage means for digital information and comprising:
    A. said storage means comprising two layers of material identified as a first layer and a second layer;
    B. said first layer and said second layer being close to each other in an integral unit;
    C. said first layer comprising a substrate and a first chemical capable of being changed from a first metachromatic binary state to a second metachromatic binary state by first electromagnetic waves;
    D. said second layer comprising a substrate and a second chemical capable of being changed from a first metachromatic binary state to a second metachromatic binary state by second electromagnetic waves;

E. said first chemical and said second chemicals being different chemicals

F. said first chemical being reponsive to said first electromagnetic waves but not responsive to said second electromagnetic waves;

G. said second chemical being responsive to said second electromagnetic waves but not responsive to said first electromagnetic waves;

H. said first electromagnetic waves being of a different wave length than said second electromagnetic waves; and I. said first metachromatic state indicating one of two binary states, 0 and 1, and the second metachromatic state indicating the other one of said binary states 0 and 1.

2. In a computer comprising in an operating relationship a control unit, an arithmetic logic unit, a memory unit, an input means and an output means, wherein:
 a. said memory unit comprises a binary storage system for storing information in one of two states and which storage system comprises a plurality of metachromatic chemicals;
 b. a chemical, identified as a first chemical of said metachromatic chemicals, being responsive to electromagentic waves of a narrow wave length band width, and being identified as first electromagnetic waves;
 c. said first chemical being responsive to said first electromagnetic waves of a first narrow wave length band width;
 d. said first narrow wave length band width being distinct and separate from the wave length band widths of some other electromagnetic waves and said other chemicals being reponsive to said other electromagnetic waves of other wave length band widths.;
 e. said first chemical upon being contacted by said first electromagnetic waves of sufficient intensity being capable of being changed from a first metachromatic binary state to a second metachromatic binary state in said binary storage system;
 f. said other chemical upon being contacted by other electromagnetic waves of sufficient intensity being capable of changing the metachromatic state from a first metachromatic state to a second binary metachromatic state in said binary storage system;
 g. said control unit and said memory unit operatively connect with each other;
 h. each of said chemicals being in a different carrier identified as a carrier layer; and,
 i. said carrier layers being positioned close to each other to form said storage system and
 j. said first metachromatic state indicating one of two binary states, 0 and 1 and the second metachromatic state indicating the other one of said binary states 0 and 1.

3. In a computer comprising in operating relationship a control unit, an arithmetic logic unit, a memory unit, an input means and an output means, wherein:
 a. said memory unit comprises a binary storage system for storing information in one of two states and comprises a plurality of metachromatic chemicals;
 b. a chemical, identified as a first chemical of said metachromatic chemicals, being responsive to electromagentic waves of a narrow wave length band width, and being identified as first electromagnetic waves;
 c. said first chemical being responsive to said first electromagnetic waves of a narrow wave length band width and which narrow wave length band width is distinct and separate from some other electromagentic waves and said other chemicals being responsive to said other electromagentic waves;
 d. said first chemical upon being contacted by said first electromagnetic waves of sufficient intensity being capable of being changed from a first metachromatic binary state to a second metachromatic binary state in said binary storage system;
 e. said control unit and said memory unit operatively connect with each other;
 f. a means, identified as a first means, being a source of electromagnetic waves;
 g. said first means being a plurality of sets identified as pre-carrier carrier sets of substantially monochromatic electromagnetic waves of a narrow wave length band width wherein each said pre-carrier set is of a narrow wave length band width and distinct from some other pre-carrier set;
 h. a carrier comprises a metachromatic chemical and is a means for carrying and positioning said metachromatic chemical;
 i. said pre-carrier set is one of said sets prior to contacting said carrier;
 j. a means, identified as a second means, for directing said pre-carrier sets to said carrier;
 k. a means, identified as a third means for receiving electromagnetic waves from said carrier after said electromagnetic waves have passed through said carrier and said electromagnetic waves, being identified as post-carrier sets;
 l. said first means being a wide spectrum of said electromagnetic wave lengths;
 m. a means identified as a fourth means, for separating said wide spectrum of said electromagnetic wave lengths into said pre-carrier sets;
 n. said fourth means being dichroic filters for separating said wide spectrum of said electromagnetic wave lengths into said pre-carrier sets;
 o. some of said chemicals being in a carrier identified as a first carrier identified as a first carrier layer;
 p. some of said chemicals being in a carrier identified as a second carrier identified as a second carrier layer;
 q. said first carrier layer and said second carrier layer being in said storage system and being part of said storage system;
 r. said carrier having an area, identified as a first area, for receiving a said pre-carrier set;
 s. said first area being in said layers in said carrier;
 t. the number of said pre-carrier sets per said first area may include zero and may vary from zero through the number of said layers;
 u. said first metachromatic state indicating one of two binary states, 0 and 1, and the second metachromatic state indicating the other one of said binary states 0 and 1.

4. In a computer comprising in an operating relationship, a control unit, an arithmetic logic unit, a memory unit, an input means and an output means, wherein:
 a. said memory unit comprises a binary storage system for information in one of two states and comprises a plurality of metachromatic chemicals;

b. a chemical, identified as a first chemical of said chemicals, being responsive to electromagentic waves of a narrow wave length band width, and being identified as first electromagnetic waves;

c. said first chemical being responsive to said first electromagentic waves of a narrow wave length band width and which narrow wave length band width is distinct and separate from some other electromagnetic waves and said other chemicals being responsive to said other electromagentic waves;

d. said first chemical upon being contacted by said first electromagnetic waves of sufficient intensity being capable of being changed from a first metachromatic binary state to a second metachromatic binary state;

e. said control unit and said memory unit operatively connect with each other;

f. a means, identified as a first means, being a source of electromagnetic waves;

g. said first means being a plurality of sets identified as pre-carrier sets, of substantially monochromatic electromagnetic waves of a narrow wave length band width wherein each said pre-carrier set is of a narrow wave length band width and distinct from some other pre-carrier set of substantially monochromatic electromagnetic waves of a narrow wave length band width;

h. carrier comprises a metachromatic chemical and is a means for carrying and positioning said metachromatic chemical;

i. said pre-carrier set is one of said sets prior to contacting said carrier;

j. a means, identified as a second means, for directing said pre-carrier sets to said carrier;

k. a means, identified as a third means for receiving electromagnetic waves from said carrier after said electromagnetic waves have passed through said carrier and said electromagnetic waves being identified as post-carrier sets;

l. said first means being a wide spectrum of said electromagnetic wave lengths;

m. a means identified as a fourth means, for separating said wide spectrum of said electromagnetic wave lengths into said pre-carrier sets; and, n. said third means being dichroic filters for receiving said electromagnetic waves after having passed through said carrier and for separating said electromagnetic waves into said post-carrier sets.

5. In a computer according to claim 4 and comprising:

a. said control means for controlling said first means for controlling the intensity of said electromagnetic waves emanating from said first means comprising a variable density filter.

6. In a computer comprising in an operating relationship a control unit, an arithmetic logic unit, a memory unit, an input means and an output means, wherein:

a. said memory unit comprises a binary storage system for storing information in one of two states and comprises a plurality of metachromatic chemicals;

b. a chemical, identified as a first chemical of said metachromatic chemicals, being responsive to electromagentic waves of a narrow wave length band width, and being identified as first electromagnetic waves;

c. said first chemical being responsive to said first electromagnetic waves of a narrow wave length band width and which narrow wave length band width is distinct and separate from some other electromagentic waves and said other chemicals being responsive to said other electromagentic waves;

d. said first chemical upon being contacted by said first electromagnetic waves of sufficient intensity being capable of being changed from a first metachromatic binary state to a second metachromatic binary state in said binary storage system;

e. said control unit and said memory unit operatively connect with each other;

f. a means identified as a first means, being a source of electromagnetic waves;

g. said first means being a plurality of sets identified as pre-carrier sets, of substantially monochromatic electromagnetic waves of a narrow wave length band width wherein each said pre-carrier set is of a narrow wave length band width and distinct from some other pre-carrier set;

h. a carrier comprises a metachromatic chemical and is a means for carrier and positioning said metachromatic chemical;

i. said pre-carrier set is one of said sets prior to contacting said carrier;

j. a means, identified as a second means, for directing said pre-carrier sets to said carrier;

k. a means, identified as a third means for receiving electromagnetic waves from said carrier after said electromagnetic waves have passed through said carrier and said electromagnetic waves, being identified as post-carrier sets;

l. said first means being a wide spectrum of said electromagnetic wave lengths;

m. a means identified as a fourth means, for separating said wide spectrum of said electromagnetic wave lengths into said pre-carrier sets;

n. said first means being solid state light emitting devices; and, o. said third means being dichroic filters for receiving said electromagnetic waves after having passed through said carrier and for separating said electromagnetic waves into said post-carriers sets.

7. In a computer according to claim 6 and comprising:

a. a detector for receiving said post-carrier sets.

8. A process for making a computer and comprising:

a. assembling in an operative relationship a control unit, an arithmetic logic unit, a memory unit, an input means and an output means wherein;

b. processing into said memory unit a digital storage system for storing information and which digital storage system comprises a plurality of metachromatic chemicals;

c. of said metachromatic chemicals, a chemical, identified as a first metachromatic chemical, being responsive to electromagnetic waves of a narrow wave length band width, identified as first electromagnetic waves;

d. said first metachromatic chemical being responsive to said first electromagnetic waves of said first narrow wave length band width and which first narrow wave length band width being distinct and separate from some other electromagentic waves and said other chemicals being responsive to said other electromagnetic waves;

e. first electromagnetic waves of sufficient intensity upon contacting said first metachromatic chemical changing said first metachromatic chemical from a first metachromatic binary state to a second metachromatic binary state;
f. incorporating said first metachromatic chemical in a carrier identified as a first carrier and further identified as a first carrier layer;
g. of said metachromatic chemicals, a chemical, identified as a second metachromatic chemical, being responsive to electromagnetic waves of a second narrow wave length band width, identified as second electromagnetic waves and of a different wave length band width than said first electromagnetic waves of a first narrow wave length band width;
h. said second metachromatic chemical being responsive to said second electromagtic waves of a second narrow wave length band width and said second narrow wave length band width being distinct and separate from some other electromagentic waves and other said chemicals being responsive to said other electromagnetic waves;
i. second electromagnetic waves of sufficient intensity upon contacting said second metachromatic chemical changing said second metachromatic chemical from a third metachromatic binary state to a fourth metachromatic binary state;
j. incorporating said second metachromatic chemical some of said chemicals in a carrier identified as a second carrier and further identified as a second carrier layer; and,
k. positioning said first carrier layer and said second carrier layer in said storage system so as to be part of said storage system and to comprise a plurality of layers.

9. In a process to making a computer according to claim 8 and comprising:
a. designating in said carrier an area, identified as a first area, for receiving a said pre-carrier set;
b. said first area being in said layers in said carrier; and,
c. allowing the number of said pre-carrier sets per said first area to include zero and to vary from zero through the number of said layers.

10. In a process for making a computer and comprising:
a. assembling in an operative relationship a control unit, an arithmetic logic unit, a memory unit, an input means and an output means wherein;
b. processing into said memory unit a digital storage system for storing information comprising a plurality of metachromatic chemicals;
c. of said metachromatic chemicals, selecting a chemical, identified as a first metachromatic chemical, being responsive to electromagnetic waves of a first narrow wave length band width, identified as first electromagnetic waves;
d. said first chemical being responsive to said first electromagnetic waves of said first narrow wave length band width and which first narrow wave length band width being distinct and separate from some other electromagentic waves and said other chemicals being responsive to said other electromagnetic waves;
e. selecting first electromagnetic waves of sufficient intensity upon contacting said first metachromatic chemical changing said first metachromatic chemical from a first metachromatic binary state to a second metachromatic binary state;
f. incorporating a means, identified as first means, as a source of electromagnetic waves;
g. selecting said first means to be a plurality of sets identified as pre-carrier sets, of substantially monochromatic electromagnetic waves of a narrow wave length band width, wherein each said pre-carrier set is of a narrow wave length band width and distinct from some other pre-carrier set;
h. said pre-carrier set is one of said sets prior to contacting said carrier;
i. incorporating a means, identified as a second means, for directing said pre-carrier sets of said electromagnetic waves to said carrier; and,
j. incorporating a means, identified as a third means, for receiving electromagnetic waves from said carrier after said electro-magnetic waves have passed through said carrier and said electromagnetic wave being identified as a post-carrier set.

11. In a process for making a computer according to claim 10 and comprising:
a. identifying said first means as a wide spectrum of said electromagnetic wave lengths; and,
b. incorporating a means, identified as a fourth menas, for separating said wide spectrum of said electromagnetic wave lengths into said pre-carrier sets.

12. In a process for making a computer according to claim 11 and comprising:
a. identifying said fourth means as dichroic filters for separating said wide spectrum of said electromagnetic wave lengths into said pre-carrier sets.

13. In a process for making a computer according to claim 12 and comprising:
a. incorporating a fiberoptic for accepting said pre-carrier sets and for directing said pre-carrier sets to said carrier.

14. In a process for making a computer according to claim 10 and comprising:
a. identifying said third means as dichroic filters for receiving said electromagnetic waves after having passed through said carrier and for separating said electromagnetic waves into said post-carrier sets.

15. In a process for making a computer according to claim and comprising:
a. positioning a first collimating means between the source said electromagnetic waves and said carrier and for directing said pre-carrier sets to said carrier; and,
b. positioning a second collimating means between said carrier and said third means for directing said post-carrier sets to said third means.

16. In a process for making a computer according to claim 10 and comprising:
a. positioning said first means in a container; and, positioning said second means in a container.

17. In a process for making a computer according to claim and comprising:
a. designating in said carrier an area, identified as a first area, for receiving a said pre-carrier set;
b. said first area being in said layers in said carrier; and,
c. restricting said pre-carrier sets to only one said pre-carrier set per said first area irrespective of the number of said layers.

18. In a process for making a computer according to claim 10 and comprising:
a. incorporating some of said chemicals in a carrier identified as a first carrier identified as a first carrier layer;

b. incorpoating some of said chemicals in a carrier identified as a second carrier identified as a second carrier layer;
c. positioning said first carrier layer and said second carrier layer in said storage system so as to be part of said storage system;
d. designating in said carrier an area, identified as a first area, for receiving a said pre-carrier set;
e. said first area being in said layers in said carrier; and,
f. restriciting said pre-carriers sets to only one said pre-carrier set per said first area irrespective of the number of said layers.

19. In a process for making a computer according to claim 10 and comprising:
   a. incorporating some of said chemicals in a carrier identified as a first carrier identified as a first carrier layer;
   b. incorporating some of said chemicals in a carrier identified as a second carrier identified as a second carrier layer;
   c. positioning said first carrier layer and said second carrier layer in said storage system so as to be part of said storage system;
   d. designating in said carrier an area, identified as a first area, for receiving a said pre-carrier set;
   e. said first area being in said layers in said carrier; and,
   f. designating the number of said pre-carrier sets per said first area to include zero and to vary from zero through the number of said layers.

20. In a process for making a computer according to claim 10 and comprising:
   a. incorporating a control means for controlling said first means for controlling the intensity of said electromagnetic waves emanating from said first means;
   b. operatively connecting said control means with said first means for said first means to produce a high intensity said electromagnetic wave for contacting said first metachromatic chemical for changing the state of said first chemical from said first metachromatic binary state to said second metachromatic binary state; and,
   c. operatively connecting said control means with said first means for said control means to control said first means for said first means to produce a low intensity said electromagnetic wave for contacting said first metachromatic chemical without changing the binary state of said first metachromatic chemical.

21. In a process for making a computer according to claim 11 and comprising:
   a. identifying said third means as dichroic filters for receiving said electromagnetic waves after having passed through said carrier and for separating said electromagnetic waves into said post-carrier sets.

22. In a process for making a computer according to claim 11 and comprising:
   a. identifying said third means as dichroic filters for receiving said electromagnetic waves after having passed through said carrier and for separating said electromagnetic waves into said post-carrier sets.

23. In a process for making a computer according to claim 22 and comprising:
   a. identifying said first means as solid state light emitting devices.

24. In a process for making a computer according to claim 23 and comprising:
   a. identifying said third means as dichroic filters for receiving said electromagnetic waves after having passed through said carrier and for separating said electromagnetic waves into said post-carrier sets.

25. In a process for making a computer and comprising:
   a. assembling in an operative relationship a control unit, an arithmetic logic unit, a memory unit, an input means and an output means wherein;
   b. processing into said memory unit a digital storage system for storing information comprising a plurality of metachromatic chemicals;
   c. of said metachromatic chemicals, a chemical, identified as a first metachromatic chemical, being responsive to electromagnetic waves of a first narrow wave length band width, identified as first electromagnetic waves;
   d. said first metachromatic chemical being responsive to said first electromagnetic waves of a first narrow wave length band width and which first narrow wave length band width being distinct and separate from some other electromagentic waves and said other chemicals being responsive to said other electromagnetic waves;
   e. selecting first electromagnetic waves of sufficient intensity that upon contacting said first metachromatic chemical changing said first chemical from a first metachromatic binary state to a second metachromatic binary state;
   f. incorporating each of said metachromatic chemicals in a different carrier and each said different carrier being identified as a carrier layer;
   g. positioning said carrier layers in said digital storage system so as to be part of said digital storage system;
   h. incorporating a means, identified as a fourth menas, for separating said wide spectrum of said electromagnetic wave lengths into pre-carrier sets of narrow band widths;
   i. said first area being in said layers in said carrier; and,
   j. restricting said pre-carrier sets to only one said pre-carrier set per said first area irrespective of the number of said layers.

26. In a computer made by the process comprising:
   a. assembling in an operative relationship a control unit, an arithmetic logic unit, a memory unit, an input means and an output means wherein;
   b. processing into said memory unit a digital storage system for storing information and which digital storage system comprises a plurality of metachromatic chemicals;
   c. of said metachromatic chemicals, selecting a chemical, identified as a first metachromatic chemical, being responsive to electromagnetic waves of a narrow wave length band width, identified as first electromagnetic waves;
   d. said first metachromatic chemical being responsive to said first electromagnetic waves of a narrow wave length band width being distinct and separate from some other electromagentic waves and said other chemicals being responsive to said other electromagnetic waves;
   e. first electromagnetic waves of sufficient intensity upon contacting said first metachromatic chemical changing said first chemical from a first metachromatic binary state to a second metachromatic binary state;

f. incorporating each of said chemicals in a different carrier identified as a carrier layer; and, g. positioning said carrier layers close to each other in said storage system.

27. In a computer made by the process comprising:

a. assembling in an operative relationship a control unit, an arithmetic logic unit, a memory unit, an input means and an output means wherein;

b. processing into said memory unit a digital storage system for storing information comprising a plurality of metachromatic chemicals;

c. of said metachromatic chemicals, a metachromatic chemical identified as a first metachromatic chemical, being responsive to electromagnetic waves of a narrow wave length band width, identified as first electromagnetic waves;

d. said first metachromatic chemical being responsive to said first electromagnetic waves of a narrow wave length band width and which narrow wave length band width being distinct and separate from some other electromagentic waves and said other metachromatic chemicals being responsive to said other electromagnetic waves;

e. first electromagnetic waves of sufficient intensity upon contacting said first metachromatic chemical changing said first metachromatic chemical from a first metachromatic binary state to a second metachromatic binary state;

f. incorporating said first metachromatic chemical in a carrier identified as a first carrier and further identified as a first carrier layer;

g. of said metachromatic chemicals, a chemical, identified as a second metachromatic chemical, being responsive to electromagnetic waves of a narrow wave length band width, identified as second electromagnetic waves;

h. said second metachromatic chemical being responsive to said second electromagnetic waves of a narrow wave length band width and which narrow wave length band width being distinct and separate from some other electromagentic waves and said other metachromatic chemicals being responsive to said other electromagnetic waves;

i. second electromagnetic waves of sufficient intensity upon contacting said second metachromatic chemical changing said second metachromatic chemical from a third metachromatic binary state to a fourth metachromatic binary state;

j. incorporating said second metachromatic chemical in a carrier identified as a second carrier and further identified as a second carrier layer; and, k. positioning said first carrier layer and said second carrier layer in said storage system so as to be part of said storage system and to comprise a plurality of layers.

28. In a computer made by the process according to claim 27 and comprising:

a. designating in said carrier an area, identified as a first area, for receiving a said pre-carrier set;

b. said first area being in said layers in said carrier; and, c. allowing the number of said pre-carrier sets per said first area to include zero and to vary from zero through the number of said layers.

29. In a computer made by the process comprising:

a. assembling in an operative relationship a control unit, an arithmetic logic unit, a memory unit, an input means and an output means wherein;

b. processing into said memory unit a digital storage system for storing information comprising a plurality of metachromatic chemicals;

c. of said chemicals, selecting a metachromatic chemical, identified as a first metachromatic chemical, being responsive to electromagnetic waves of a narrow wave length band width, identified as first electromagnetic waves;

d. said first metachromatic chemical being responsive to said first electromagnetic waves of a narrow wave length band width and which narrow wave narrow wave length band width being distinct and separate from some other electromagentic waves and said other chemicals being responsive to said other electromagnetic waves;

e. selecting first electromagnetic waves of sufficient intensity upon contacting said first metachromatic chemical changing said first metachromatic chemical from a first metachromatic binary state to a second metachromatic binary state;

f. incorporating a means, identified as first means, as a source of electromagnetic waves;

g. selecting said first means to be a plurality of sets identified as pre-carrier sets, of substantially monochromatic electromagnetic waves of a narrow wave length band width wherein each said pre-carrier set is of a narrow wave length band width and distinct from some other pre-carrier set;

h. said pre-carrier set is one of said sets prior to contacting said carrier;

i. incorporating a means, identified as a second means, for directing said pre-carrier sets to said carrier;

j. incorporating a means, identified as a third means, for receiving electromagnetic waves from said carrier after said electromagnetic waves have passed through said carrier and said electromagnetic wave being identified as a post-carrier set;

k. identifying said first means as a wide spectrum of said electromagnetic wave lengths; and, l. incorporating a means, identified as a fourth means for separating said wide spectrum of said electromagnetic wave lengths into said pre-carrier sets.

30. In a computer made by the process according to claim 29 and comprising:

a. identifying said fourth means as dichroic filters for separating said wide spectrum of said electromagnetic wave lengths into said pre-carrier sets.

31. In a computer made by the process according to claim 29 and comprising:

a. identifying said third means as dichroic filters for receiving said electromagnetic waves after having passed through said carrier and for separating said electromagnetic waves into said post-carrier sets.

32. In a computer made by the process according to claim 29 and comprising:

a. identifying said first means as solid state light emitting devices.

33. In a computer made by the process according to claim 32 and comprising:

a. identifying said third means as dichroic filters for receiving said electromagnetic waves after having passed through said carrier and for separating said electromagnetic waves to said post-carrier sets.

34. In a process for making a computer according to claim 33 and comprising:

a. incorporating a detector for receiving said post-carrier sets.

35. In a computer made by the process according to claim 30 and comprising:
   a. incorporating a fiberoptic for accepting said pre-carrier sets and for directing said pre-carrier sets to said carrier.

36. In a computer made by the process comprising:
   a. assembling in an operative relationship a control unit, an arithmetic logic unit, a memory unit, an input means and an output means wherein;
   b. processing into said memory unit a digital storage system for storing information comprising a plurality of metachromatic chemicals;
   c. of said metachromatic chemicals, a chemical, identified as a first metachromatic chemical, being responsive to electromagnetic waves of a narrow wave length band width, identified as first electromagnetic waves;
   d. said first chemical being responsive to said first electromagnetic waves of a narrow wave length band width and which narrow wave length band width being distinct and separate from some other electromagentic waves and said other chemicals being responsive to said other electromagnetic waves;
   e. first electromagnetic waves of sufficient intensity upon contacting said first metachromatic chemical changing said first metachromatic chemical from a first metachromatic binary state to a second metachromatic binary state;
   f. incorporating a means, identified as first means, as a source of electromagnetic waves;
   g. said first means being a plurality of sets identified as pre-carrier sets, of substantially monochromatic electromagnetic waves of a narrow wave length band width wherein each said pre-carrier set is of a narrow wave length band width binary separate and distinct from some other pre-carrier set;
   h. said pre-carrier set is one of said sets prior to contacting said carrier;
   i. incorporating a means, identified as a second means, for directing said pre-carrier sets to said carrier;
   j. incorporating a means, identified as a third means, for receiving electromagnetic waves from said carrier after said electromagnetic waves have passed through said carrier and said electromagnetic wave being identified as post-carrier sets; and,
   k. identifying said third means as dichroic filters for receiving said electromagnetic waves after having passed through said carrier and for separating said electromagnetic waves into said post-carrier sets.

37. In a computer made by the process comprising:
   a. assembling in an operative relationship a control unit, an arithmetic logic unit, a memory unit, an input means and an output means wherein;
   b. processing into said memory unit a digital storage system for storing information comprising a plurality of metachromatic chemicals;
   c. of said chemicals, a chemical, identified as a first chemical, being responsive to electromagnetic waves of a narrow wave length band width, identified as first electromagnetic waves;
   d. said first chemical being responsive to said first electromagnetic waves of said narrow wave length band width and which narrow wave length band width being distinct and separate from some other electromagnetic waves and said other chemicals being responsive to said other electromagnetic waves and which are of a wave length band width other than said narrow wave length band width;
   e. said first electromagnetic waves of sufficient intensity upon contacting said first chemical changing said first chemical from a first metachromatic state to a second metachromatic state;
   f. incorporating each of said chemicals in a different carrier identified as a carrier layer;
   g. positioning said carrier layers in said storage system so as to be part of said storage system;
   h. incorporating a buffer layer; and,
   i. positioning said buffer layer between two carrier layers.

38. In a computer made by the process comprising:
   a. assembling in an operative relationship a control unit, an arithmetic logic unit, a memory unit, an input means and an output means wherein;
   b. processing into said memory unit a storage system for storing information comprising a plurality of metachromatic chemicals;
   c. of said chemicals, a chemical, identified as a first chemical, being responsive to electromagnetic waves of a narrow wave length band width, identified as first electromagnetic waves;
   d. said first chemical being responsive to said first electromagnetic waves of a narrow wave length band width and which narrow wave length band width being distinct and separate from some other electromagentic waves and said other chemicals being responsive to said other electromagnetic waves and which are of a wave length band width other than said narrow wave length band width;
   e. said first electromagnetic waves of sufficient intensity upon contacting said first chemical changing said first chemical from a first metachromatic binary state to a second metachromatic binary state;
   f. incorporating a means, identified as first means, as a source of electromagnetic waves;
   g. said first means being a plurality of sets identified as pre-carrier sets, of substantially monochromatic electromagnetic waves of said narrow wave length band width wherein each said pre-carrier set is of a narrow wave length band width and distinct from some other pre-carrier set:
   h. said pre-carrier set is one of said sets prior to contacting said carrier;
   i. incorporating a means, identified as a second means, for directing said pre-carrier sets to said carrier;
   j. incorporating a means, identified as a third means, for receiving electromagnetic waves from said carrier after said electromagnetic waves have passed through said carrier and said electromagnetic wave being identified as post-carrier sets;
   k. positioning a first collimating means between the source of said electromagnetic waves and said carrier and for directing said pre-carrier sets to said carrier; and,
   l. positioning a second collimating means between said carrier and said third means for directing said post-carrier sets to said third means.

39. In a computer made by the process comprising:
   a. assembling in an operative relationship a control unit, an arithmetic logic unit, a memory unit, an input means and an output means wherein;
   b. processing into said memory unit a storage system for storing information comprising a plurality of metachromatic chemicals;

c. of said chemicals, a chemical, identified as a first chemical, being responsive to electromagnetic waves of a narrow wave length band width, identified as first electromagnetic waves;

d. said first chemical being responsive to said first electromagnetic waves of said narrow wave length band width and which narrow wave length band width being distinct and separate from some other electromagentic waves and said other chemicals being responsive to said other electromagnetic waves and which are of a wave length band width other than said narrow length band width;

e. said first electromagnetic waves of sufficient intensity upon contacting said first chemical changing said first chemical from a first metachromatic binary state to a second metachromatic binary, state;

f. incorporating a means, identified as first means, as a source of electromagnetic waves;

g. said first means being a plurality of sets identified as pre-carrier sets, of substantially monochromatic electromagnetic waves of a narrow wave length band width wherein each said pre-carrier set is of a narrow wave length band width and distinct from some other pre-carrier set:

h. said pre-carrier set is one of said sets prior to contacting said carrier;

i. incorporating a means, identified as a second means, directing said pre-carrier sets to said carrier;

j. incorporating a means, identified as a third means, for receiving electromagnetic waves from said carrier after said electromagnetic waves have passed through said carrier and said electromagnetic wave being identified as post-carrier sets;

k. positioning said first means in a container; and, l. positioning said second means in a container.

40. In a computer made by the process comprising:

a. assembling in an operative relationship a control unit, an arithmetic logic unit, a memory unit, an input means and an output means wherein;

b. processing into said memory unit a storage system for storing information comprising a plurality of metachromatic chemicals;

c. of said chemicals, a chemical, identified as a first chemical, being responsive to electromagnetic waves of a narrow wave length band width, identified as first electromagnetic waves;

d. said first chemical being responsive to said first electromagnetic waves of said narrow wave length band width and which narrow wave length band width being distinct and separate from some other electromagentic waves and said other chemicals being responsive to said other electromagnetic waves; and which are of a wave length band width other than said narrow wave length band width;

e. said first electromagnetic waves of sufficient intensity upon contacting said first chemical changing said first chemical from a first metachromatic binary state to a second metachromatic binary state;

f. incorporating a means, identified as first means, as a source of electromagnetic waves;

g. said first means being a plurality of sets identified as pre-carrier sets, of substantially monochromatic electromagnetic waves of a narrow wave length band width wherein each said pre-carrier set is of a narrow wave length band width and distinct from some other pre-carrier set:

h. said pre-carrier set is one of said sets prior to contacting said carrier;

i. incorporating a means, identified as a second means, for directing said pre-carrier sets to said carrier;

i. incorporating a means, identified as a third means, for receiving electromagnetic waves from said carrier after said electromagnetic waves have passed through said carrier and said electromagnetic wave being identified as post-carrier sets;

k. designating in said carrier an area, identified as a first area, for receiving a said pre-carrier set;

l. said first area being in said layers in said carrier; and, m. restricting said pre-carrier sets to only one said pre-carrier set per said first area irrespective of the number of said layers.

41. In a computer made by the process comprising:

a. assembling in an operative relationship a control unit, an arithmetic logic unit, a memory unit, an input means and an output means wherein;

b. processing into said memory unit a storage system for storing information comprising a plurality of metachromatic chemicals;

c. of said chemicals, a chemical, identified as a first chemical, being responsive to electromagnetic waves of a narrow wave length band width, identified as first electromagnetic waves;

d. said first chemical being responsive to said first electromagnetic waves of said narrow wave length band width and which narrow wave length band width being distinct and separate from some other electromagentic waves and said other chemicals being responsive to said other electromagnetic waves and which are of a wave length band width other than said narrow wave length band width;

e. said first electromagnetic waves of sufficient intensity upon contacting said first chemical changing said first chemical from a first metachromatic binary state to a second metachromatic binary state;

f. incorporating a means, identified as first means, as a source of electromagnetic waves;

g. said first means being a plurality of sets identified as pre-carrier sets, of substantially monochromatic electromagnetic waves of a narrow wave length band width wherein each said pre-carrier set is of a narrow wave length band width and distinct from some other pre-carrier set;

h. said pre-carrier set is one of said sets prior to contacting said carrier;

i. incorporating a means, identified as a second means, for directing said pre-carrier sets to said carrier;

j. incorporating a means, identified as a third means, for receiving electromagnetic waves from said carrier after said electromagnetic waves have passed through said carrier and said electromagnetic waves being identified as post-carrier sets;

k. incorporating some of said chemicals in a carrier identified as a first carrier identified as a first carrier layer;

l. incorporating some of said chemicals in a carrier identified as a second carrier identified as a second carrier layer;

m. positioning said first carrier layer and said second carrier layer in said storage system so as to be part of said storage system;

n. designating in said carrier an area, identified as a first area, for receiving a said pre-carrier set;

o. said first area being in said layers in said carrier; and, p. restricting said pre-carriers sets to only one said pre-carrier set per said first area irrespective of the number of said layers.

42. In a computer made by the process comprising:
a. assembling in an operative relationship a control unit, an arithmetic logic unit, a memory unit, an input means and an output means wherein;
b. processing into said memory unit a storage system for storing information comprising a plurality of metachromatic chemicals;
c. of said chemicals, a chemical, identified as a first chemical, being responsive to electromagnetic waves of a narrow wave length band width, identified as first electromagnetic waves;
d. said first chemical being responsive to said first electromagnetic waves of said narrow wave length band width and which narrow wave length band width being distinct and separate from some other electromagentic waves and said other chemicals being responsive to said other electromagnetic waves and which are of a wave length band width other than said narrow length band width;
e. said first electromagnetic waves of sufficient intensity upon contacting said first chemical changing said first chemical from a first metachromatic binary state to a second metachromatic binary state;
f. incorporating a means, identified as first means, as a source of electromagnetic waves;
g. said first means being a plurality of sets identified as pre-carrier sets, of substantially monochromatic electromagnetic waves of a narrow wave length band width wherein each said pre-carrier set is of a narrow wave length band width and distinct from some other pre-carrier set:
h. said pre-carrier set is one of said sets prior to contacting said carrier;
i. incorporating a means, identified as a second means, for directing said pre-carrier sets to said carrier;
j. incorporating a means, identified as a third means, for receiving electromagnetic waves from said carrier after said electromagnetic waves have passed through said carrier and said electromagnetic wave being identified as post-carrier sets;
k. incorporating some of said chemicals in a carrier identified as a first carrier identified as a first carrier layer;
l. incorporating some of said chemicals in a carrier identified as a second carrier identified as a second carrier layer;
m. positioning said first carrier layer and said second carrier layer in said storage system so as to be part of said storage system;
n. designating in said carrier an area, identified as a first area, for receiving a said pre-carrier set;
o. said first area being in said layers in said carrier; and,
p. designating the number of said pre-carrier sets per said first area to include zero and to vary from zero through the number of said layers.

43. In a computer made by the process comprising:
a. assembling in an operative relationship a control unit, an arithmetic logic unit, a memory unit, an input means and an output means wherein;
b. processing into said memory unit a storage system for storing information comprising a plurality of metachromatic chemicals;
c. of said chemicals, a chemical, identified as a first chemical, being responsive to electromagnetic waves of a narrow wave length band width, identified as first electromagnetic waves;
d. said first chemical being responsive to said first electromagnetic waves of said narrow wave length band width and which narrow wave length band width being distinct and separate from some other electromagentic waves and said other chemicals being responsive to said other electromagnetic waves and which are of a wave length band width other than said narrow length band width;
e. said first electromagnetic waves of sufficient intensity upon contacting said first chemical changing said first chemical from a first metachromatic binary state to a second metachromatic binary state;
f. incorporating a means, identified as first means, as a source of electromagnetic waves;
g. said first means being a plurality of sets identified as pre-carrier sets, of substantially monochromatic electromagnetic waves of a narrow wave length band width wherein each said pre-carrier set is of a narrow wave length band width and distinct from some other pre-carrier set;
h. said pre-carrier set is one of said sets prior to contacting said carrier;
i. incorporating a means, identified as a second means, for directing said pre-carrier sets to said carrier;
j. incorporating a means, identified as a third means, for receiving electromagnetic waves from said carrier after said electromagnetic waves have passed through said carrier and said electromagnetic wave being identified as post-carrier sets;
k. incorporating a control means for controlling said first means for controlling the intensity of said electromagnetic waves emanating from said first means;
l. operatively connecting said control means with said first means for said first means to produce a high intensity said electromagnetic wave for contacting said first chemical for changing the state of said first chemical from said first metachromatic binary state to said second metachromatic binary state; and,
m. operatively connecting said control means with said first means for said control means to control said first means for said first means to produce a low intensity said electromagnetic wave for contacting said first chemical without changing the binary state of said first chemical.

44. A computer made by the process according to claim 43 and comprising:
a. identifying said control means for controlling said first means as a variable density filter.

* * * * *